(12) United States Patent
Song et al.

(10) Patent No.: US 12,708,014 B2
(45) Date of Patent: Aug. 11, 2026

(54) SINGULATION OF INTEGRATED CIRCUIT PACKAGE SUBSTRATES WITH GLASS CORES

(71) Applicant: Intel Corporation, Santa Clara, CA (US)

(72) Inventors: Hanyu Song, Chandler, AZ (US); Vinith Bejugam, Chandler, AZ (US); Yonggang Li, Chandler, AZ (US); Gang Duan, Chandler, AZ (US); Aaron Garelick, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 96 days.

(21) Appl. No.: 17/957,355

(22) Filed: Sep. 30, 2022

(65) Prior Publication Data

US 2024/0112970 A1 Apr. 4, 2024

(51) Int. Cl.

| | |
|---|---|
| ***H10W 70/692*** | (2026.01) |
| ***H10W 70/05*** | (2026.01) |
| ***H10W 70/68*** | (2026.01) |
| ***H10W 70/685*** | (2026.01) |
| ***H10W 99/00*** | (2026.01) |
| *H10W 74/15* | (2026.01) |

(52) U.S. Cl.

CPC ......... *H10W 70/692* (2026.01); *H10W 70/05* (2026.01); *H10W 70/68* (2026.01); *H10W 70/685* (2026.01); *H10W 99/00* (2026.01); *H10W 74/15* (2026.01)

(58) Field of Classification Search

CPC ... H10L 23/15; H01L 21/481; H01L 21/4857; H01L 23/13; H01L 23/49822; H10W 70/692; H10W 70/685; H10W 99/00; H10W 70/05; H10W 70/68

See application file for complete search history.

(56) References Cited

U.S. PATENT DOCUMENTS 5,199,163 A * 4/1993 Ehrenberg ........... H05K 3/4632 216/33
6,159,757 A 12/2000 Kamimura et al.
7,129,114 B2 10/2006 Akram (Continued)

OTHER PUBLICATIONS

Ben-Yakar, A., et al., "Femtosecond laser ablation properties of borosilicate glass", Journal of Applied Physics, vol. 96, No. 9, Nov. 1, 2004.

(Continued)

*Primary Examiner* — Michael Jung

(74) *Attorney, Agent, or Firm* — Essential Patents Group, LLP

(57) ABSTRACT

An integrated circuit (IC) device comprises a substrate comprising a glass core. The glass core includes a first surface, a second surface opposite the first surface, a sidewall between the first surface and the second surface, and a corner region where the first sidewall meets the first surface. A first build-up layer is on at least the first surface. In some embodiments, the corner region comprises a recess and a dielectric material within the recess. In other embodiments, the corner region comprises a first compressive stress and the glass core comprises a second region. The second region comprises a second compressive stress. The first compressive stress is greater than the second compressive stress.

16 Claims, 29 Drawing Sheets

(56) References Cited

U.S. PATENT DOCUMENTS

| | | | | |
|---|---|---|---|---|
| 7,517,423 | B2 | 4/2009 | Furui et al. | |
| 7,927,916 | B2 | 4/2011 | Lake | |
| 8,925,192 | B2 | 1/2015 | Noda et al. | |
| 10,531,577 | B1 | 1/2020 | Grober | |
| 10,672,718 | B2 | 6/2020 | Sundaram et al. | |
| 11,037,904 | B2 | 6/2021 | Yu et al. | |
| 11,264,279 | B2 | 3/2022 | Xiao et al. | |
| 11,380,814 | B2 | 7/2022 | Sommer et al. | |
| 11,452,212 | B2 | 9/2022 | Tuominen et al. | |
| 12,160,955 | B2 | 12/2024 | Kim et al. | |
| 2014/0238952 | A1 | 8/2014 | Makino et al. | |
| 2015/0334823 | A1* | 11/2015 | Hu | H01L 23/13 361/783 |
| 2017/0023841 | A1 | 1/2017 | N'Gom et al. | |
| 2019/0019692 | A1 | 1/2019 | Obata et al. | |
| 2020/0364600 | A1* | 11/2020 | Elsherbini | H01L 25/18 |
| 2023/0282546 | A1* | 9/2023 | Waidhas | H01L 23/3672 257/678 |

OTHER PUBLICATIONS

Bischof, D., et al., "Laser-assisted etching of borosilicate glass in potassium hydroxide", Optical Materials Express, vol. 11, No. 4, Apr. 1, 2021.

Gray, S., et al., "Laser finished glass edges with compressive stress", Optical Materials Express, vol. 10, No. 2, Feb. 1, 2020.

Hooper, A., et al. , "Review of Wafer Dicing Techniques for Via-Middle Process 3DI/TSV Ultrathin Silicon Device Wafers", Electronic Components & Technology Conference, 2015, 12 pages.

Liao, K., et al., "High quality full ablation cutting and stealth dicing of silica glass using picosecond laser Bessel beam with burst mode", Ceramics International 48 (2022) 9805-9816.

Teng, A., "Comparison of Singulation Techniquest", IEEE Electronic Packaging Society, Silicon Valley Chapter, Sep. 28, 2017.

Iwatsuki, Soshi et al., "Examination of internal stress of photoelasticity in laser cleaving of glass," Jul. 2020, Precision Engineering, vol. 63, pp. 122-128.

Kashyap, Raman et al., "Femtosecond-Induced Refractive Index Changes in Glass," Nov. 30, 2009, Academic Press, Fiber Bragg Gratings Second Edition, pp. 503-525.

* cited by examiner

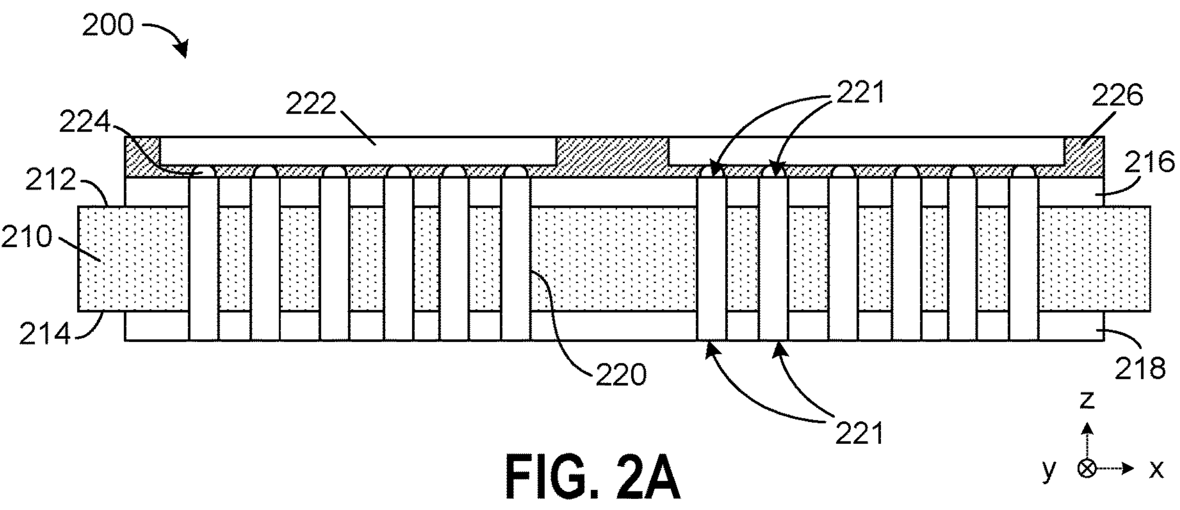
FIG. 2A
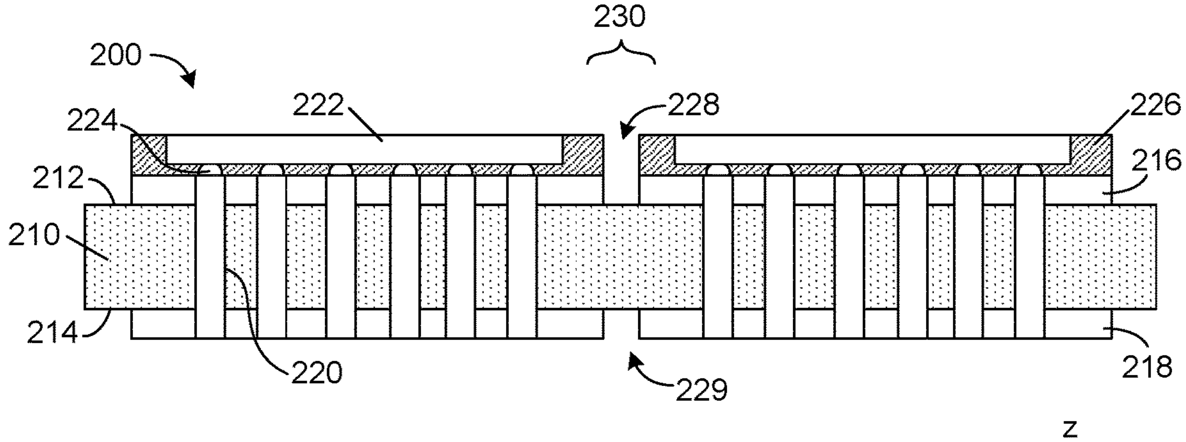
FIG. 2B
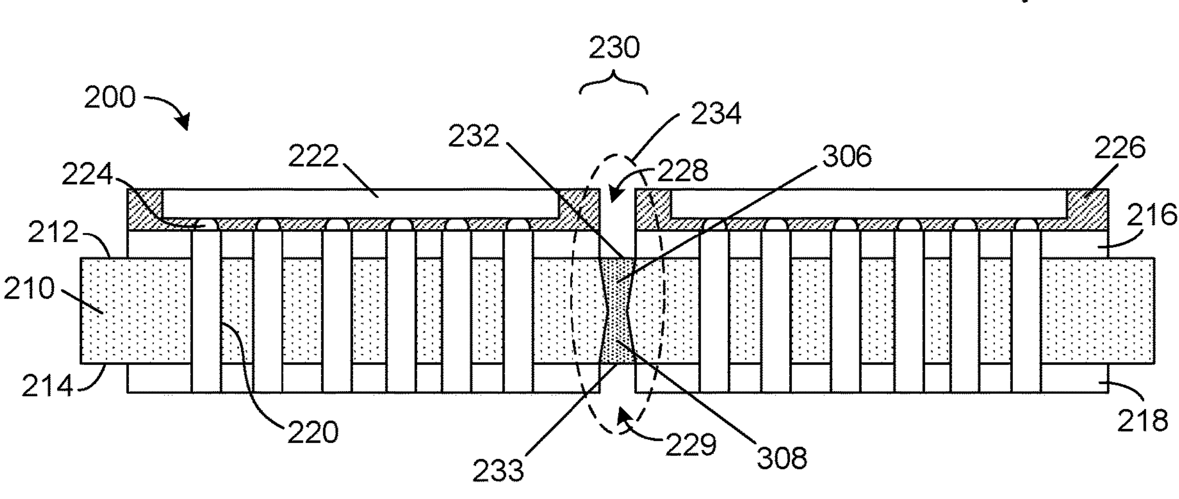
FIG. 2C
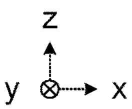

1536
1510
1502
1522
1524
1504
1512
1514
1516
1518
1018
1008
1006
1526
1506
1002
1001B/
1003B'
1004
1508

1540
1544
1542
1009
1538 z
x
y 1556
1510
1502
1522
1524
1504
1512
1514
1516
1518
1412
1410
1008
1006
1526
1506
1002
1005A
1004
1508

1560
1564
1563
1009
1562
1802
1804
1806
1558

1566
1510
1502
1522
1524
1504
1512
1514
1516
1518
1418
1008
1006
1526
1506
1002
1005B
1004
1508

1570
1574
1573
1418B
1572
1009
1418A
1808
1810
1812
1568

1576
1510
1502
1522
1524
1504
1512
1514
1516
1518
1420
1008
1006
1526
1506
1002
1005C
1004
1508
z
y
x 1580
1584
1583
1420B
1582
1420A
1009
1814
1818
1816
1578

SINGULATION OF INTEGRATED CIRCUIT PACKAGE SUBSTRATES WITH GLASS CORES

BACKGROUND

1. Technical Field

Embodiments generally relate to integrated circuit (IC) packages and more particularly, but not exclusively, to singulating IC package substrates.

2. Background Art

IC dies may include logic, memory, or other types of circuitry. One or more IC dies may be assembled by a flip-chip assembly on to a surface of a package substrate of an IC package. A package substrate may include a core on which alternating layers of metallic conductive patterns and dielectric layers are built. The core material may be a polymer-based laminate, ceramic, silicon, or glass.

Substrates with glass cores provide several advantages as compared to other core materials, including good electrical properties and a coefficient of thermal expansion (CTE) similar to that of silicon IC dies. While glass has significant advantages when used as a core for an IC package substrate, it presents various challenges due to its brittleness.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. Certain figures may be shown in an idealized fashion in order to aid understanding, such as when structures are shown having straight lines, sharp angles, and/or parallel planes or the like that under real-world conditions would likely be significantly less symmetric and orderly. In the figures:

FIGS. 2A through 2D are simplified cross-sectional side view diagrams, each illustrating respective stages of a process to form an IC package assembly comprising a substrate having a glass core according to various embodiments;

DETAILED DESCRIPTION

Figure 1:
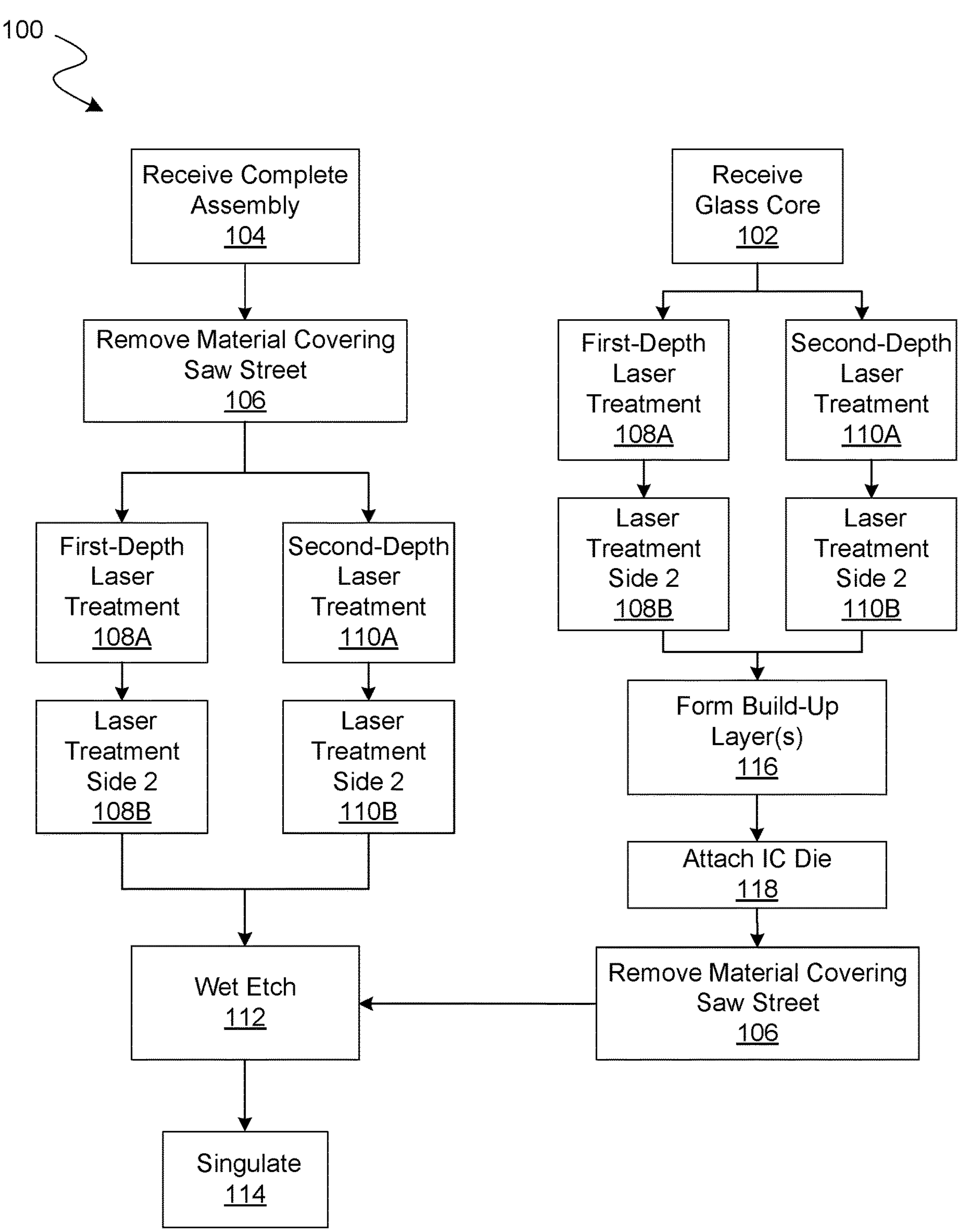
FIG. 1 illustrates a flow diagram of methods for singulating an IC package assembly having a glass substrate according to some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dies, providing a specific function. The package is usually mounted on a printed circuit board for interconnection with other packaged integrated circuits and discrete components, forming a larger circuit.

The term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

The term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and carries the same meaning. In addition, the term "conductive contact" may be used for "bond pad" and carries the same meaning.

The term "solder bump" generally refers to a solder layer formed on a bond pad. The solder layer typically has a round shape, hence the term "solder bump".

In this description and the claims, the terms "conductive contact" and "metal feature" have the same meaning. In this description and the claims, the term "interconnect structure" may refer to a "conductive pillar" or other interconnect structure.

The term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

The vertical orientation is in the z-direction and it is understood that recitations of "top," "bottom," "above," and "below" refer to relative positions in the z-dimension with the usual meaning. However, it is understood that embodiments are not necessarily limited to the orientations or configurations illustrated in the figure.

Views labeled "cross-sectional," "profile," and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

The IC package examples described herein may be manufactured, in part, with bonding techniques in which metal features embedded within an insulator of a top-side IC die are directly fused to metal features embedded within an insulator of a bottom-side die. Where both the metal features and the insulators are fused, the resultant composite structure comprises a hybrid bonded interface of both metallurgically interdiffused metals and chemically bonded insulators. These bonding techniques may be referred to as direct or hybrid bonding. Prior to bonding, each top-side IC die may be fabricated in a monolithic process separate from that of each bottom-side die. As such, each top-side IC die may utilize the same or different semiconductor device fabrication technologies as the bottom-side die bonded to the top-side die. Likewise, prior to assembly, the bottom-side die may be fabricated according a monolithic process separate from that of the top-side IC die.

As used herein, the term "hardware interface" refers to one or more physical components of a given device, where said one or more physical components accommodate coupling to interact with one or more physical components of another device. For example, a hardware interface may comprise metal contacts, pads, metallization features, or other interconnect structures on a surface of or within a circuit board, integrated circuit (IC) die, or package substrate. As another example, a hardware interface may comprise an interconnect between contacts of respective components, such as solder or an interposer.

Various embodiments are directed to singulating IC packages substrates comprising glass cores. In this regard, the term "glass" refers to an amorphous solid. The glass core may be a regular or ion-exchanged glass. Examples of glass materials that may be used with the described embodiments include pure silica (e.g., approximately 100% $SiO_2$), soda-lime glass, borosilicate glass, and alumino borosilicate glass. In some embodiments, any combination of other materials and additives may be combined with silica (or other base material) to form a glass having desired physical properties. Examples of these additives include not only calcium carbonate (e.g., lime) and sodium carbonate (e.g., soda), but also magnesium, calcium, manganese, aluminum, lead, boron, iron, chromium, potassium, sulfur, and antimony, as well as carbonates and/or oxides of these and other elements. In addition, a glass core may include surface treatments and/or coatings to improve strength and/or durability. Further, a glass core may also be annealed to lower internal stresses. In various embodiments, a glass core is substantially transparent at the wavelength of a laser used in embodiments described herein.

Generally, as used herein, the term "glass" does not refer to organic polymer materials, which may be amorphous in solid form. However, it should be understood that a glass according to some embodiments may include carbon as one of the material's constituents. For example, soda-lime glass, as well as numerous variations of this glass type, comprise carbon.

The IC packages substrates with glass cores that may be singulated as described herein comprise one or more build-up layers on the core. Typically, there is at least one build-up layer on each of the die side and land side of a core, but in some embodiments, a build-up layer is provided on only one of the surfaces. Generally, as used herein, the term "build-up" layer refers to one or more layers. While the term "build-up" layer may refer to a single dielectric layer or a single metallization layer, a build-up layer may comprise one or more dielectric layers and one or more metallization layers. A dielectric layer may comprise any suitable dielectric material (e.g., polymer materials, silicon dioxide ($SiO_2$), silicon nitride ($Si_3N_4$), etc.) and may be formed by any suitable technique (e.g., by deposition, lamination, plasma-enhanced chemical vapor deposition (PECVD), etc.). A metallization layer may comprise any suitable electrically conductive metal (e.g., copper, aluminum, silver, etc.), and may be deposited by any suitable technique (e.g., plating processes, such as electroplating and electroless plating). Further, a metal layer may be patterned to form any suitable number and configuration of traces, power planes, ground planes, and other conductors to facilitate the routing of power and I/O signals. In embodiments, a build-up layer may be coupled with a power supply, e.g., a power plane or other power conductor in a metallization layer of a build-up layer may be coupled with a power supply. In some embodiments, a build-up layer may include a redistribution layer.

The IC packages substrates with glass cores that may be singulated as described herein comprise one or more hardware interfaces. In various embodiments, a hardware interface comprises metal contacts, pads, metallization features, or other interconnect structures on a surface of a build-up layer formed on a glass core.

The IC packages substrates with glass cores that may be singulated as described herein may comprise one or more IC dies. In various embodiments, an IC die may comprise any type of semiconductor device. In one embodiment, the IC die comprises a processing system or device. For example, IC die may comprise a microprocessor or a graphics processor. The IC die can perform instructions from any number of processor architectures having any number of instruction formats. In one embodiment, the IC die may employ an "x86" instruction set architecture, as used by Intel Corporation. However, in other embodiments, the processor may perform instructions from other architectures or from other processor designers. For example, in some embodiments, the IC die may employ a reduced instruction set computer (RISC) architecture. In another embodiment, the IC die comprises a memory device. According to a further embodiment, the IC die comprises a system-on-chip (SoC). In yet another embodiment, the IC die may include digital circuitry, analog circuitry, or a combination of both analog and digital circuitry.

As mentioned, various embodiments are directed to singulating IC packages substrates comprising glass cores. The glass cores of the IC packages substrates may comprise one or more conductors and corresponding holes, or through-glass vias, that extend through the glass core from the die side to the land side. The holes may be formed in a glass core during a casting process or may be formed after casting, e.g., by imprinting, sand blasting, laser drilling, or etching. Each conductor may be disposed in a respective hole or through-glass via. Each conductor comprises an electrically conductive material, such as metals, composite materials, and electrically conductive polymers. Suitable metals include copper, tin, silver, gold, nickel, aluminum, and tungsten, as well as alloys of these and/or other metals. Electrically conductive material may be deposited in the holes by any suitable process, such as, for example, screen printing techniques, plating techniques (electroplating or electroless plating), chemical vapor deposition (CVD), and physical vapor deposition (PVD). In an embodiment, a conductor comprises a metal wire embedded in the glass core.

FIG. 1 illustrates a flow diagram of methods for singulating an IC package assembly having a substrate having a glass core according to some embodiments. Methods 100 may begin at 102 or 104. At operation 102, a glass core is received. At operation 104, an IC package assembly comprising a substrate having a glass core is received. In either case, the glass core comprises a first surface and a second surface opposite the first surface. Methods 100 starting at operation 104 are described first.

At operation 104, an IC package assembly comprising substrate having a glass core is received. The IC package assembly may be substantially complete, but it is not essential that all manufacturing steps be complete. In various embodiments, a glass core may be between 200 μm and 1.5 mm.

The glass core of the IC package assembly received at 104 comprises one or more build-up layers on the core. As mentioned, a build-up layer is typically on both the die side and land side of the core, but may be on only one of the surfaces in some embodiments. Each build-up layer may comprise one or more dielectric layers and one or more metallization layers as described herein. In addition, a hardware interface may be provided on a surface of a build-up layer. For example, bond pads and, in some embodiments, surface metallization on the bond pads may be provided on a build-up layer. Further, a passivation layer on an outer surface may be provided to prevent solder joints from bridging to adjacent joints.

At operation 106, one or more build-up layers are removed from singulation streets or zones on the glass core. The singulation streets or zones demark a plurality of portions of the glass core. In some embodiments, operation 106 includes removing mold, underfill, or other material covering singulation streets or zones. In various embodiments, saw streets may be 3 mm to 9 mm wide. Any suitable technique or techniques may be used to remove a build-up layer. Some example techniques for removing a build-up layer include laser ablation, a plasma process, a wet or dry etch process, or mechanical sawing.

After operation 106, operation 108A and optional operation 108B may be performed. Alternatively, operation 110A and optional operation 110B may be performed. In operations 108A and 108B, regions of a glass core are treated with a laser to a first depth. In operations 110A and 110B, regions of a glass core are treated with a laser to a second depth different from the first depth.

In various embodiments, operations 108A, 108B, 110A, and 110B comprise employing a laser to modify a glass core, for example, by altering a microstructure of the glass. The structural alteration caused by the laser treatment allows selected portions of a glass core to be more readily removed with a wet etch. Parameters such as laser power, pulse duration, pulse repetition rate, depth of focus, exposure path/area, wavelength, and beam type may be set or adjusted in different embodiments. Laser pulses with durations in the picosecond or femtosecond range may be used. In some embodiments, the laser is an ultrashort (e.g., picosecond) pulsed laser and laser exposures with pulse durations in the range of 1 to 10 ps are used. In some embodiments, laser exposures have pulse energies of 500 to 2000 nJ. Pulse repetition rates of less than 250 kHz may be used. In some embodiments, laser exposures with pulse repetition rates of 105 kHz are used. In some embodiments, laser exposures with pulse repetition rates of 52 kHz are used. The term "laser," an acronym for "light amplification by stimulated emission of radiation," as used here includes electromagnetic radiation with wavelengths (and frequencies) beyond both ends of the visible spectrum of light: up to at least around 1 mm (or down to around 300 GHz) and down to at least around 10 nm (or up to around 30 PHz). For example, laser exposure includes exposure to infrared (IR) electromagnetic radiation. In some exemplary embodiments, laser exposure includes exposure to electromagnetic radiation with a wavelength in the near-IR range. In some embodiments, laser exposure includes exposure to electromagnetic radiation with a wavelength of around 1030 nm. In various embodiments, laser energy may be distributed along a helical path to select an approximately conical region for glass removal. A point of focus may range from about 10% of a thickness of a glass core to approximately 100% of the core thickness depending on the desired width and depth of the desired laser-modified region.

At operations 108A and 108B, a plurality of regions within singulation streets on the first surface are treated with a laser. The plurality of regions may be arranged in a line or row on one or both surfaces. The plurality of regions may extend vertically to a relatively shallow depth up to depth that extends through the glass core. The plurality of regions may take a variety of geometric shapes and be spaced apart by a variety of distances.

Figure 3A:
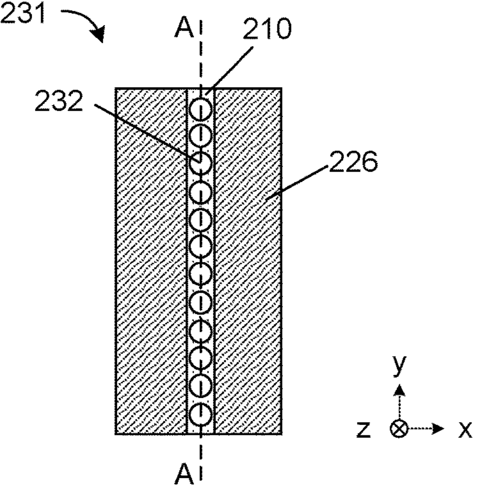
FIGS. 3A through 3F are views of a portion of a glass core of the IC package assembly of FIG. 2C according to various embodiments.
Figure 3D:
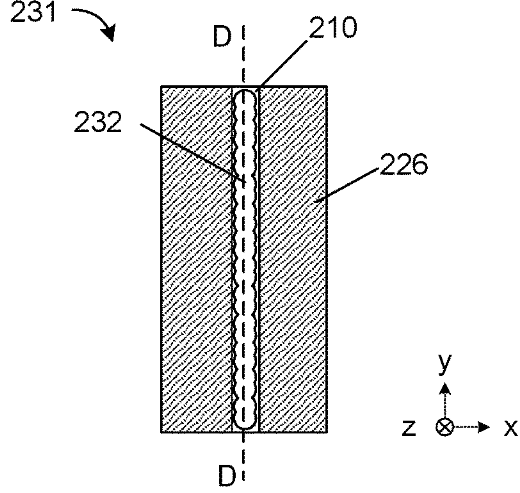

Operation 108A comprises laser treating the first surface, while operation 108B comprises laser treating the second surface. In some embodiments, operation 108B may be omitted. Operations 108A and 108B treat the glass core to a particular depth, which may be referred to for ease of reference as a "first" depth. Examples in which a laser is used to treat the glass core to the first depth are shown in FIGS. 3B to 3F, and FIGS. 4A to 4C. When both operations 108A and 108B are performed, the first depth may be a depth such that a laser-treated region (formed by combining the laser-treated regions on both sides) approximately extends from the first surface to the second surface, e.g., as shown in FIG. 3C. For example, the first depth may be approximately one half the distance between the first surface and the second surface. When only operation 108A is performed the first depth may be approximately the distance between the first surface and the second surface, e.g., as shown in FIG. 4C.

In alternative embodiments, operations 110A and 110B may be performed in lieu of operations 108A and 108B. Operation 110A comprises treating the first surface, while operation 110B comprises treating the second surface. In some embodiments, operation 110B may be omitted. Operations 110A and 110B treat the glass core to a particular depth, which may be referred to for ease of reference as a "second" depth. Examples in which a laser is used to treat the glass core to the second depth are shown in FIGS. 6B-6E. When both operations 110A and 110B are performed, the second depth may be a depth such that a first laser-treated region extends from the first surface and another laser-treated region, opposite the first laser-treated region, extends from the second surface, but the second depth is such that the two regions do not meet. For example, the second depth may be one fourth or one third the distance between the first surface and the second surface. As another example, the second depth may be less than one half the distance between the first and second surfaces. When only operation 110A is performed the second depth may be less than one half the distance between the first and second surfaces, e.g., one fourth or one third the distance between the first surface and the second surface. While some examples of laser treating portions of glass core to a first depth are presented herein, and other examples of laser treating portions of glass core to a second depth are presented herein, it should be appreciated that, in some embodiments, a glass core may be include some portions laser treated to a first depth and other portions laser treated to a second depth.

Figure 6A:
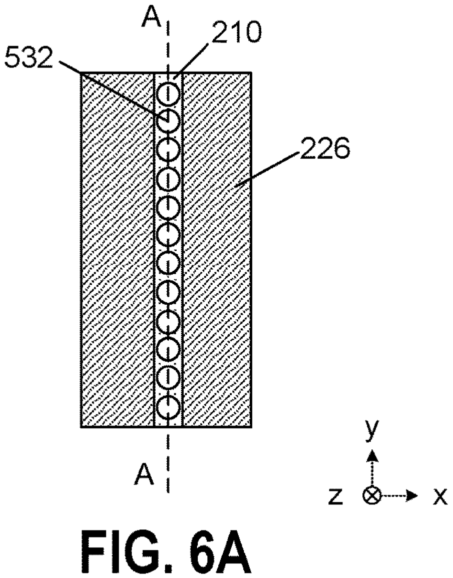
FIGS. 6A through 6F are views of a portion of a glass core of the IC package assembly of FIG. 5A according to various embodiments.
Figure 6D:
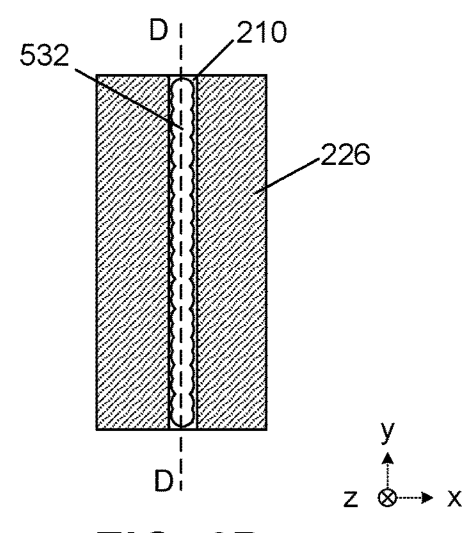

For all of operations 108A, 108B, 110A, and 110B, the plurality of regions in the singulation street may overlap one another or may be spaced apart (non-overlapping). Examples in which the laser-treated regions are spaced apart is shown in FIG. 3A and FIG. 6A. Examples in which the laser-treated regions overlap is shown in FIG. 3D and FIG. 6D. In some embodiments, some of the laser-treated regions may overlap with an adjacent region, while others of the laser-treated regions may be spaced apart from an adjacent region.

The laser treatment in operations 108A, 108B, 110A, and 110B may include multiple short duration pulses. Within each region, the laser or the glass core may be moved such that the focal points of a series of laser pulses traces a conical helix shape. The duration of laser pulses may be in the pico- or femto-second ranges. In some embodiments, a laser-treated region at the first or second surface is circular or elliptical, with diameter may be between 50 μm and 3 mm. Portions of the laser-treated region at various distances below the first surface (or above the second surface) may have a smaller diameter than the portion at the first surface. In some embodiments, the laser-treated region may be approximately conical. Some examples of laser-treated regions are shown in FIGS. 3B-3C and 3E-3F. While laser-treated regions may be circular or elliptical at a surface and conical away from the surface, in some embodiments, the laser-treated regions may be formed in other geometric shapes, such as square at a surface and rectangular away from the surface. In operations 108A, 108B, 110A, and 110B, because the saw streets in operations 108A, 108B, 110A, and 110B) may be up to 9 mm wide and the diameter of the laser-treated regions at the surface is typically 3 mm or less, there may be an area on each side of a row of laser-treated regions that is relatively wide, e.g., 1-3 mm.

At operation 112, one or more first perforations may be formed in each of the plurality of regions using a wet etch process on laser-treated regions on the first surface. If operations 108B or 110B are performed, operation 112 includes using the wet etch process on the second surface. In some examples, a wet etch process may use hydrogen fluoride (HF), sodium hydroxide (NaOH), or potassium hydroxide (KOH). However, other suitable compounds may be used in alternative embodiments. In various embodiments, operation 112 may include masking areas other than the laser-treated areas to protect those areas from the wet etch chemical composition.

At operation 114, the substrate is separated into the plurality of portions, e.g., individual IC packages. In some embodiments, separation is performed using a mechanical sawing operation along a line coinciding with the plurality of regions. There are several advantages of the laser treating and chemical etch process. In areas treated with the laser and chemical etch, the mechanical saw may be moved with less pressure as compared to the pressure required for an untreated glass core. Any untreated areas are smaller than the total area prior to treatment, which also allows the mechanical saw to be moved with less pressure as compared to the pressure required for an untreated glass core. As a result, the sawing process may be faster as compared to the time for cutting an untreated glass core. In some embodiments, the perforations are of sufficient depth and number that separation can be performed without mechanical sawing. For example, overlapping perforations forming deep or through holes may result in a glass core that snaps or breaks when little pressure is applied. In some embodiments, other methods for separating the substrate may be employed, such as the use of a dicing tape technique.

As mentioned, methods 100 may begin at 102 or 104. Having described the methods starting at operation 104, methods starting at operation 102 are next described. At operation 102, a glass core comprising a first surface and a second surface opposite the first surface is received.

After operation 102, regions of a glass core are treated with a laser. Laser treatment may be performed in operation 108A and optional operation 108B as described above. Alternatively, laser treatment may be performed in operation 110A and optional operation 110B as described above. After laser treatment of the glass core, one or more build-up layers may be formed.

Operation 116 comprises forming a build-up layer on the first surface. In some embodiments, operation 116 includes forming a build-up layer on the second surface. As mentioned, a build-up layer may include one or more metallization layers and one or more dielectric material layers.

Operation 118 comprises attaching one or more IC dies to a build-up layer. Operation 118 may include all steps needed to electrically (and mechanically) couple an IC die to a build-up layer via a hardware interface. Terminals lands, pins, solder bumps, etc. on the IC die and/or on the build-up layer may be used to form electrical connections between the IC die and build-up layer. Operation 118 may include application of a mold, underfill, or other material between the IC die and the build-up layer, the material being adjacent to the interconnects. Further, the mold, underfill, or other material may be adjacent to and abut sides of the IC die. The IC die may comprise any type of semiconductor device described herein or known in the art. In an embodiment, operation 118 comprises attaching multiple IC dies or interposers to a build-up layer Operation 118 may include steps to couple terminals on the build-up layer with terminals on the IC die by, for example, a solder reflow process. It should be understood that a solder reflow process is but one example of the type of interconnects that can be formed between a build-up layer and an IC die, and that any other suitable type of interconnect may be utilized. In addition, a layer of underfill material may be disposed around the interconnects and between the IC die and the build-up layer.

Upon completion of operation 118, methods 100 may advance to operations 106, 112, and 114 which are described above.

FIG. 2A is a simplified cross-sectional illustration of an IC package assembly 200 comprising a substrate having a glass core according to various embodiments. The glass core 210 may comprise any of the types of glass materials described herein. The glass core 210 comprises a first surface 212 and a second surface 214 opposite the first surface 212. A first build-up layer 216 is disposed on the first surface 212. A second build-up layer 218 is disposed on the second surface 214.

The glass core 210 may include a number of conductors which extend through the substrate within a hole or through-glass via 220, and each conductor may extend from the first surface 212 to the second surface 214, or only partially through the thickness of the substrate 110. In some embodiments, the conductors and vias 220 extend through the respective thicknesses of first build-up layer 216 and second build-up layer 218.

A hardware interface comprising a first set of electrically conductive terminals 221 may be disposed on a surface of first build-up layer 216 opposite to the first surface 212. In some embodiments, the first set of terminals 221 is arranged in a pattern to mate with a corresponding array of terminals disposed on an integrated circuit (IC) die 122. Further, in some embodiments, the first set of terminals 221 is arranged in a pattern to mate with respective ends of conductors within the though-glass-via 220. The terminals 221 may each comprise any suitable type of structure capable of forming an electrical connection with a terminal of the IC die. For example, a terminal 221 may comprise a pad, pillar, or stud bump formed from any suitable metal or combination of metals (e.g., aluminum, copper, nickel, etc.), and a solder bump 224 may be disposed on each terminal 221 (and/or on the terminals of the IC die).

In one embodiment, the IC die 222 may be disposed on the first build-up layer 216 in a flip-chip manner with the terminals on the IC die coupled with the terminals 221 on the first build-up layer 216 by a solder reflow process. According to another embodiment, an IC die 222 may be coupled to the first build-up layer 216 by a layer of adhesive with terminals on the IC die 222 electrically coupled to corresponding terminals on the substrate by a wirebond process (in this embodiment, the terminals 221 would lie outside a footprint of the IC die 222). In yet another embodiment, the terminals on the IC die are coupled with the terminals 221 on the first build-up layer 216 by a direct bonding process. IC die 222 may be any of the types of IC die discussed above in connection with operation 118 of methods 100. In various embodiments, one or more IC die 222 may be disposed on the first build-up layer 216.

A mold material 226 may be disposed on first build-up layer 216 between IC die 222 and the build-up layer. The mold material 226 may be adjacent to the interconnects, such as solder bumps 224, and may be adjacent to and abut sides of IC die 222. A heat spreader or lid (not shown) may be over the IC die 222 and thermally coupled with the back surface of the IC die. In some embodiments, a layer of underfill material may be disposed around the interconnects and between the IC die 222 and the first build-up layer 216.

FIG. 2B is a cross-sectional illustration of the IC package assembly 200 showing a first opening 228 having been formed in first build-up layer 216 and mold material 226 and a second opening 229 formed in second build-up layer 218. Openings 228 and 229 are formed in a singulation street 230. Singulation streets demarks a plurality of portions of a sheet of glass core material, e.g., a portion may correspond to an IC package. Openings 228 and 229 expose portions of first surface 212 and second surface 214 in the singulation street 230. The openings 228 and 229 may be formed with any of the techniques described with reference to operation 106 of methods 100.

FIG. 2C is a cross-sectional illustration of the IC package assembly 200 after treatment of a plurality of regions by a laser. Laser-treated regions may be formed with any of the techniques described with reference to operation 108A, 108B, 110A, and 110B of methods 100. Laser treatment may be applied to the first surface 212, the second surface 214, or both the first and second surfaces. Each laser-treated region is within singulation street 230. Reference numbers 232 and 233 designate respective portions of laser-treated regions at first surface 212 and second surface 214 respectively. Reference numbers 306 and 308 designate respective portions of laser-treated regions between first surface 212 and second surface 214. A portion of IC package assembly 200 is identified generally by reference numeral 234. Alternative views of the portion labeled with reference numeral 234 are depicted in FIGS. 3A-3E.

While the example singulation street 230, and openings 228 and 229, depicted in FIG. 2C have widths that are approximately the same as the width of laser-treated region 232, it should be appreciated that either or both the singulation street 230 and openings 228 and 229 may be wider than the laser-treated region 232.

Figure 3B:
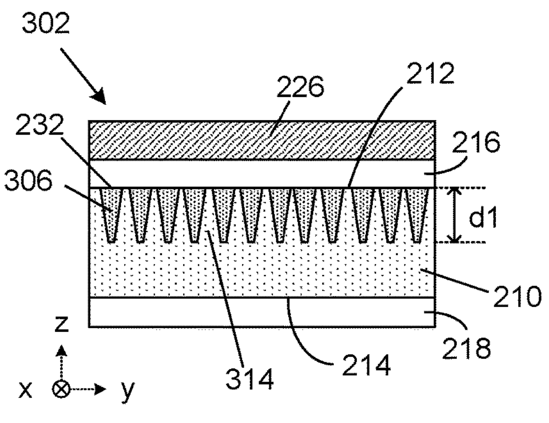
Figure 3E:
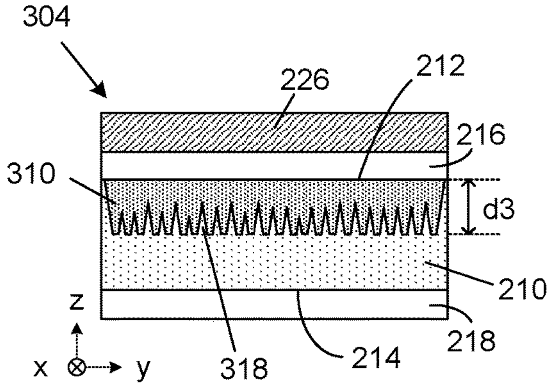
Figure 3C:
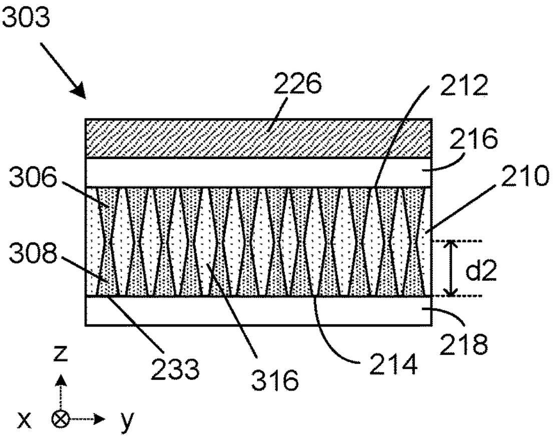

FIGS. 3A through 3F shows different views of portion 234, according to alternative embodiments. An embodiment in which the laser-treated regions are spaced apart is shown in FIGS. 3A-3C. FIG. 3A shows a top-down view of portion 234 according to some embodiments. FIGS. 3B and 3C are cross-sectional side views 302 and 303 of the embodiment of FIG. 3A. The cross sections 302 and 303 are taken along line A-A. FIG. 3A illustrates laser-treated regions 232 aligned with line A-A at a surface of glass core 210. As can be seen in the figure, the laser-treated regions 232 are spaced apart along line A-A at a surface. In the shown embodiment, the regions 232 are circular, and as such, have a particular diameter. It should be appreciated that the regions 232 may be spaced by apart by various distances. For example, the regions may be spaced apart by 0.1, 0.2, 0.3, 0.4, 0.5, 0.6, 0.7, 0.8, 0.9, 1.0, or 1.25 of the particular diameter.

Figure 3F:
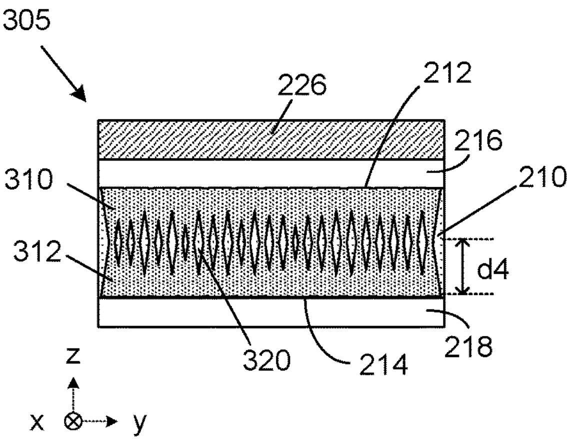

An embodiment in which the laser-treated regions generally overlap with one another is shown in FIGS. 3D-3F. FIG. 3D shows a top-down view of portion 234 according to some embodiments. FIGS. 3E and 3F are cross-sectional side views 304 and 305 of the substrate comprising glass core 210, according to the embodiment of FIG. 3D. The cross sections 302 and 303 are taken along line D-D. FIG. 3D illustrates laser-treated regions 272 aligned with line D-D at a surface of glass core 210. Regions 272 generally overlap with one another. Regions 272 may be the same as regions 232, differing only in their position relative to a neighbor region. In various embodiments, regions 272 may overlap to varying degrees, e.g., 10%, 20%, 30%, 40%, 50%, or 60%.

In an embodiment, a surface of glass core 210 may include both spaced apart regions 232 and overlapping regions 272. For example, two overlapping regions 272 could be adjacent to and spaced apart from a region 232.

FIG. 3B illustrates a cross-sectional view of laser-treated regions 306 that result when a laser is focused on first surface 212. FIG. 3C illustrates a cross-sectional view of laser-treated regions 308 in addition to the laser-treated regions 306. Regions 308 are caused by focusing the laser on second surface 214. Each of the regions 306 and 308 correspond with a region 232 at a first surface or a region 233 at a second surface.

FIG. 3E illustrates a cross-sectional view of laser-treated region 310 that result when a laser is focused on first surface 212. FIG. 3F illustrates a cross-sectional of laser-treated regions 312 in addition to view laser-treated regions 310. Regions 312 are caused by focusing the laser on second surface 214. Each of the regions 310 and 312 correspond with a region 272 at a first or second surface. Laser-treated regions 310 and 312 may be the same or similar to regions 306 and 308, but differ in that they are more numerous for a given portion 234 and overlap with one another.

Each of the laser-treated regions in FIGS. 3A-3E may be formed by multiple short-duration laser pulses. Each pulse produces concentrated energy at a point of focus. Either the glass substrate or the focal point of the laser may be moved between pulses. The shape of the laser treated region depends on how the laser is moved laterally, in the x-y plane, and vertically, in the z plane.

Referring again to FIGS. 3B and 3C, laser-treated region 306 spans a first distance d1 in a first direction from the first surface 212 toward the second surface 214. In addition, laser-treated region 306 has a width (in the y direction) at first surface 212 that becomes progressively narrower as the region approaches second surface 214. Laser-treated regions 308 are similar to laser-treated regions 306. Each laser-treated region 308 spans a second distance d2 in a second direction from the second surface 214 toward the first surface 212. It can be seen that laser-treated region 308 has a width (in the y direction) at second surface 214 that becomes progressively narrower as the region approaches first surface 212. (It may also be seen in FIG. 2C that the laser-treated region 306 has a width (in the x direction) at first surface 212 that becomes progressively narrower as the region approaches second surface 214.) In various embodiments, laser-treated regions 306 and 308 each have a conical shape.

In an embodiment, laser-treated regions 306 and 308 meet at a central location of glass substrate 110. In various embodiments, laser-treated regions 306 and 308 together comprises a shape corresponding with an hour glass. It should be appreciated that laser-treated regions 306 and 308 are not limited to conical or hour-glass shapes. For example, the laser-treated regions 306 and 308 may be cylindrical or cuboidal.

Still referring to FIGS. 3B and 3C, when the laser-treated regions are spaced apart, untreated areas 314 and 316 are present between regions 306 and 308. When IC package assembly 200 is singulated using a mechanical saw, untreated areas 314 and 316 may show an artifact of mechanical sawing. In various embodiments, a glass core comprises at least on region on a sidewall, e.g., untreated areas 314 and 316, that includes a chipped portion or a portion containing a crack, which may be an artifact of a mechanical sawing process.

Referring again to FIGS. 3E and 3F, laser-treated region 310 spans a third distance d3 in the first direction from the first surface 212 toward the second surface 214. In addition, laser-treated region 310 has a width (in the y direction) at first surface 212 that becomes progressively narrower as the region approaches second surface 214. Laser-treated regions 312 are similar to laser-treated regions 310. Each laser-treated region 312 spans a fourth distance d4 in the second direction from the second surface 214 toward the first surface 212. Each laser-treated region 312 has a width (in the y direction) at second surface 214 that becomes progressively narrower as the region approaches first surface 212. In various embodiments, laser-treated regions 310 and 312 each have a conical shape. It should be appreciated that laser-treated regions 310 and 312 are not limited to conical or hour-glass shapes. For example, the laser-treated regions 310 and 312 may be cylindrical or cuboidal.

It may be seen that when the laser-treated regions 310 and 312 overlap with one another, untreated areas 318 and 320 may still be present between regions 310 and 312. Untreated areas 318 and 320 may be smaller than untreated areas 314 and 316. In some embodiments, the overlap is large enough so that there are no untreated areas 318 and 320. When IC package assembly 200 is singulated using a mechanical saw, untreated areas 318 and 320 may show an artifact of mechanical sawing.

Figure 2D:
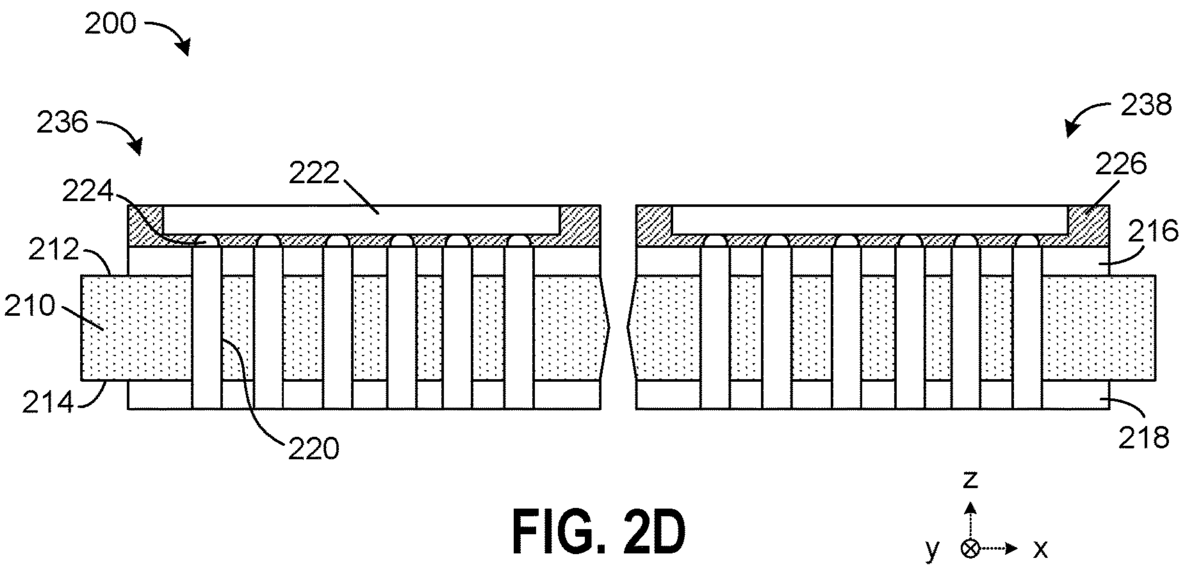

FIG. 2D is a cross-sectional illustration of the IC package assembly 200 after the substrate comprising glass core 210 is separated into a plurality of portions. One portion may correspond to IC package 236 and a second portion may correspond to an IC package 238. Portions may be separated from one another using any of the techniques described with reference to operation 114 of methods 100. In some embodiments, separation is performed using a mechanical sawing operation. In some embodiments, the laser treatment and wet etching of regions of the glass core 210 result in perforations are of sufficient depth and number that separation can be performed without mechanical sawing. For example, overlapping perforations forming deep or through holes may result in a glass core 210 that snaps or breaks when little pressure is applied. In some embodiments, other methods for separating the substrate may be employed, such as the use of a dicing tape technique. In some embodiments, glass core 210 may be held in place by a mechanism such as a backing tape adhered to one surface, and the core separates into a plurality of portions as result of the laser treatment and wet etching process without the need for any further steps or techniques.

In various embodiments, laser-treated regions may extend vertically to a variety of depths within a glass core. In the example presented in FIGS. 3A-3C, laser-treated regions 306 extend to a first depth corresponding with first distance d1 and laser-treated region 308 extend to a second depth corresponding with second distance d2. The example presented in FIGS. 3D-3F is similar, wherein laser treatments penetrate third distance d3 and fourth distance d4. In some embodiments, a sum of the first and second distances d1 and d2 (or a sum of d3 and d4) may be approximately equal to a distance between the first surface 212 and second surface 214. In embodiments where a glass substrate is laser-treated on a first and an opposite second side of a glass core, the treatment on the first and second sides may be approximately equal, or may be different. As one example, the first and second distances d1 and d2 may be approximately equal, or the first and second distances d1 and d2 may be different.

In some embodiments, only one surface of a glass core is treated with a laser. In addition, in some embodiments, laser-treated regions extend vertically a first distance that is substantially equal to a distance between a first surface and a second surface. An example of these embodiments is presented in FIGS. 4A-4C.

Figure 4A:
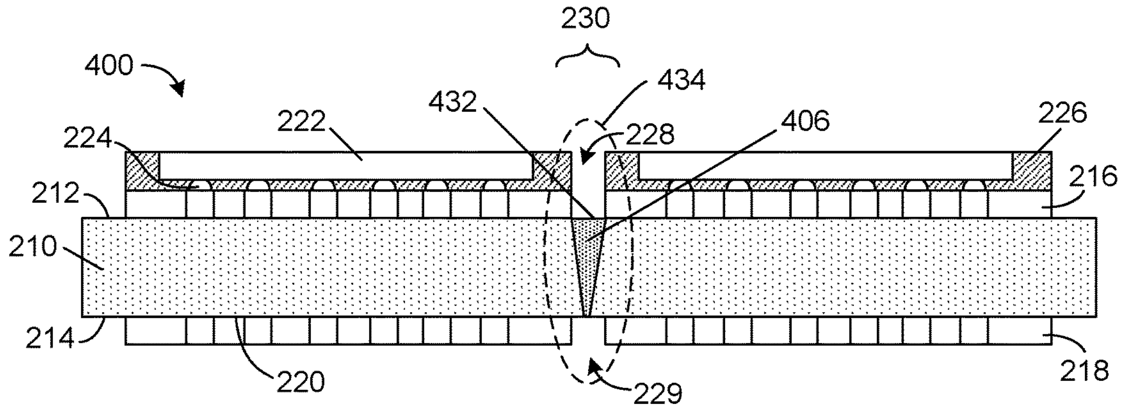
FIG. 4A is a simplified cross-sectional side view of an IC package assembly at a stage of a process to form an IC package assembly comprising a substrate having a glass core according to various embodiments.

FIG. 4A is a cross-sectional illustration of an IC package assembly 400 after treatment of a plurality of regions by a laser. In some embodiments, IC package assembly 400 may be IC package assembly 200 after a first opening 228 has been formed in first build-up layer 216 and mold material 226, a second opening 229 has been formed in second build-up layer 218, and treatment of a plurality of regions by a laser. Laser-treated regions may be formed with any of the techniques described with reference to operation 108A, 108B, 110A, and 110B of methods 100. In some embodiments, laser treatment is applied only to one surface of the glass core 210, e.g., either surface 212 or 214. In the example of FIG. 4A, laser treatment is applied to first surface 212. Each laser-treated region is within singulation street 230. Reference numbers 432 designates portions of a laser-treated region at first surface 212. Reference numbers 406 designates portions of a laser-treated region between first surface 212 and second surface 214. A portion of IC package assembly 400 is identified generally by reference numeral 434. Alternative views of the portion labeled with reference numeral 434 are depicted in FIGS. 4B-4C.

Figure 4B:
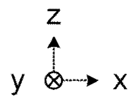
FIGS. 4B and 4C are simplified cross-sectional side views of a portion of a glass core of the IC package assembly of FIG. 4A according to various embodiments.
Figure 4B:
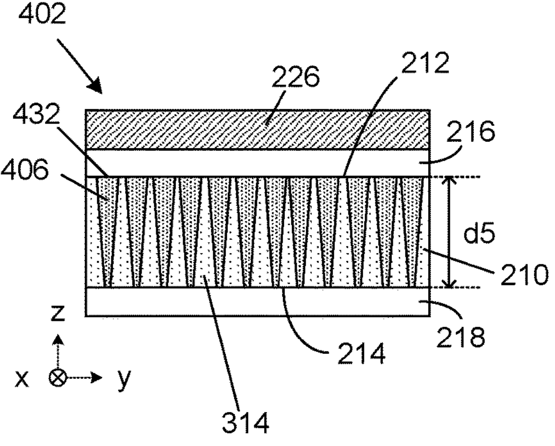
Figure 4C:
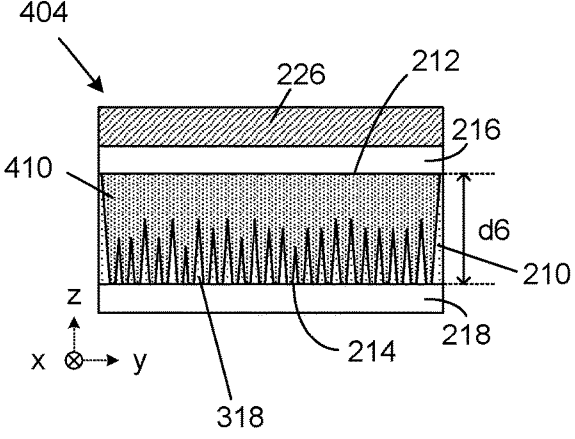

FIG. 4B is a cross-sectional side view 402 of the embodiment of FIG. 4A. Cross sections 402 is similar to cross section 302 of FIG. 3B, except laser-treated regions 406 spans a fifth distance d5 in a first direction from the first surface 212 toward the second surface 214. In embodiments, fifth distance d5 may be approximately equal to a distance between the first surface 212 and second surface 214. In other embodiments, fifth distance d5 may be greater than one half of a distance between the first surface 212 and the second surface 214, but less than that distance, e.g., d5 equals 0.75 of the distance between surfaces 212 and 214.

FIG. 4C is a cross-sectional side view 404 of the embodiment of FIG. 4A. Cross section 404 is similar to cross section 304 of FIG. 3E, except laser-treated regions 410 spans a sixth distance d6 in a first direction from the first surface 212 toward the second surface 214. In embodiments, sixth distance d6 may be approximately equal to a distance between the first surface 212 and second surface 214. In other embodiments, sixth distance d6 may be greater than one half of a distance between the first surface 212 and the second surface 214, but less than that distance, e.g., d6 equals 0.90 of the distance between surfaces 212 and 214.

In some embodiments, laser-treated regions extend vertically to depths of a glass core that are shallower than laser-treated regions 306 and 308 depicted in FIGS. 3B and 3E respectively. Examples of these embodiments are presented in FIGS. 5A-5C and FIGS. 6A-6F.

Figures 5A, 5B, 5C:
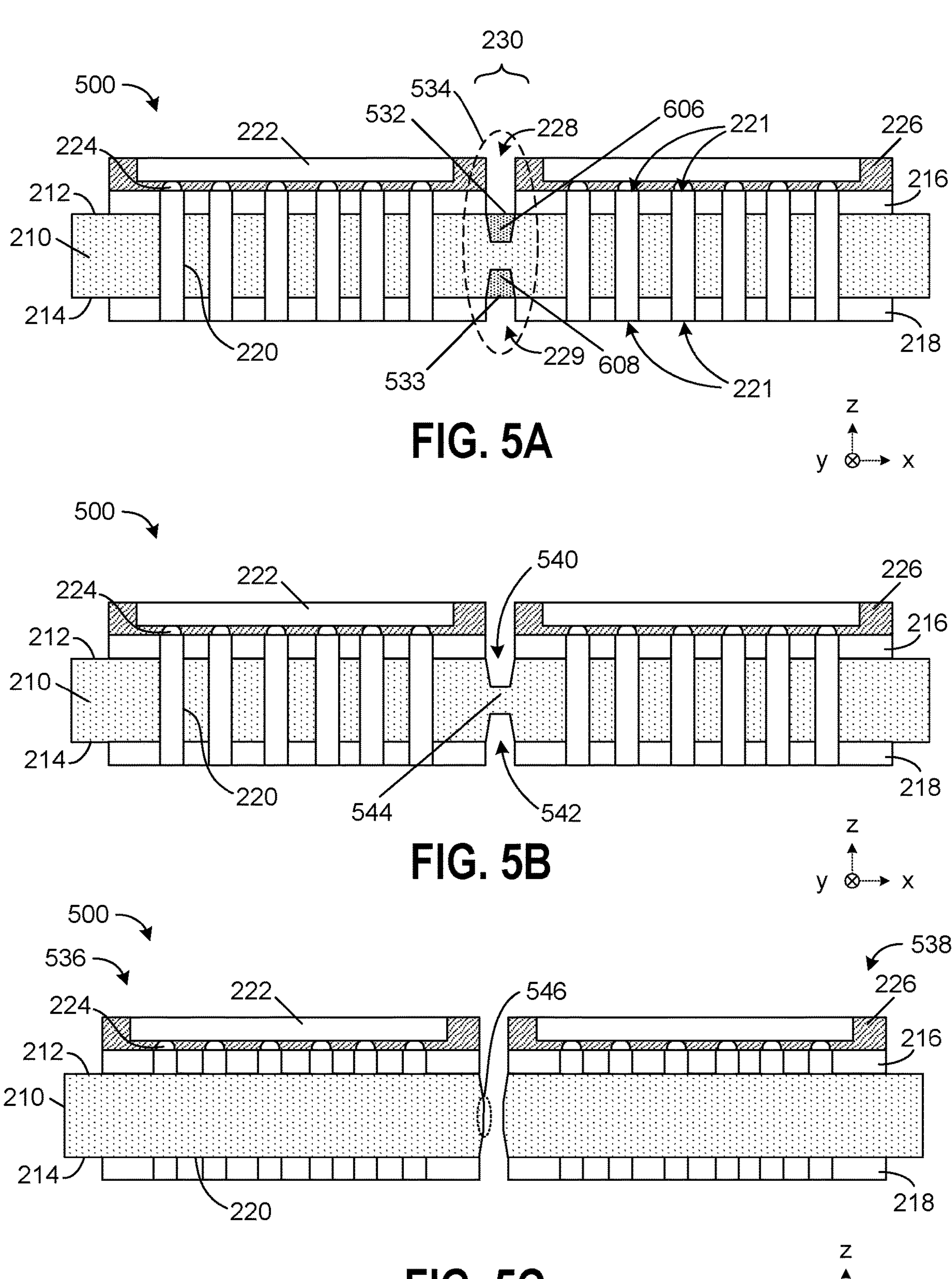
FIGS. 5A through 5C are simplified cross-sectional side view diagrams, each illustrating respective stages of a process to form an IC package assembly comprising a substrate having a glass core according to various embodiments.

FIG. 5A is a cross-sectional illustration of an IC package assembly 500 comprising a substrate having a glass core according to various embodiments. In some embodiments, IC package assembly 500 may be IC package assembly 200 after a first opening 228 has been formed in first build-up layer 216 and mold material 226, a second opening 229 has been formed in second build-up layer 218, and treatment of a plurality of regions by a laser. Laser-treated regions may be formed with any of the techniques described with reference to operation 108A, 108B, 110A, and 110B of methods 100. Laser treatment may be applied to the first surface 212, the second surface 214, or both the first and second surfaces. Each laser-treated region is within singulation street 230. Reference numbers 532 and 533 designate respective portions of laser-treated regions at first surface 212 and second surface 214. Reference numbers 606 and 608 designate respective portions of laser-treated regions between first surface 212 and second surface 214. A portion of IC package assembly 500 is identified generally by reference numeral 534. Alternative views of the portion labeled with reference numeral 534 are depicted in FIGS. 6A-6E.

Figure 6B:
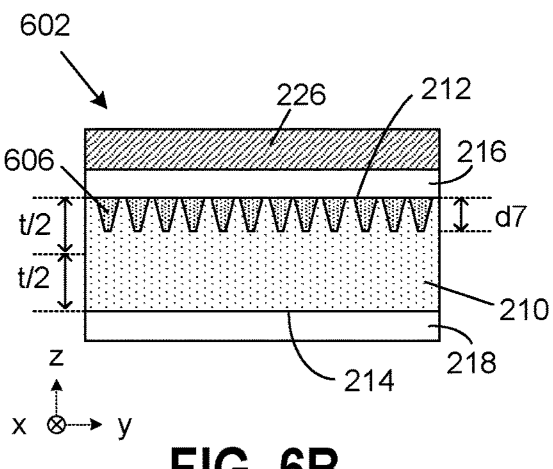
Figure 6E:
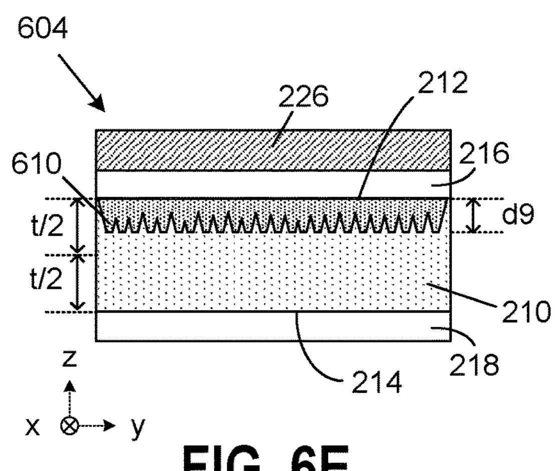
Figure 6C:
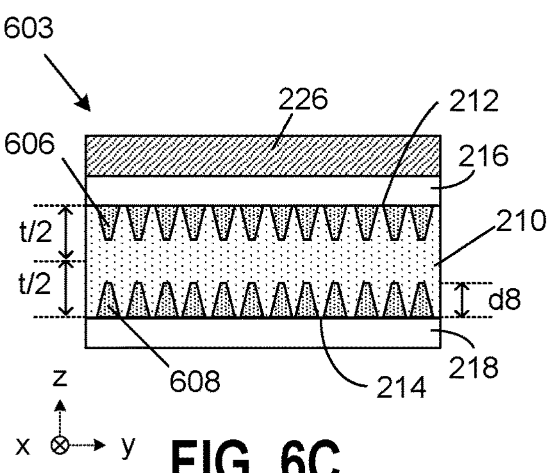

FIG. 6A shows a top-down view of portion 534 according to some embodiments. FIGS. 6B and 6C are cross-sectional side views 602 and 603 of the embodiment of FIG. 6A. The cross sections 602 and 603 are taken along line A-A. FIG. 6A illustrates laser-treated regions 532 aligned with line A-A at a surface of glass core 210. In FIGS. 6A-6C, laser-treated regions are spaced apart along line A-A.

FIG. 6B is a cross-sectional side view 602 of the embodiment of FIG. 6A. Cross sections 602 is similar to cross section 302 of FIG. 3B, except each laser-treated region 606 spans a seventh distance d7 in the first direction from the first surface 212 toward the second surface 214. Glass core 210 may have a thickness "t" such that a distance midway between the first surface 212 and second surface 214 equals "t/2." In embodiments, seventh distance d7 may be less than half of the distance t/2 between the first surface and the second surface.

FIG. 6C is a cross-sectional side view 603 of another embodiment of FIG. 6A. Cross section 603 is similar to cross section 303 of FIG. 3C, except each laser-treated region 608 spans an eighth distance d8 in the second direction from the second surface 214 toward the first surface 212. Glass core 210 may have a thickness "t" such that a distance midway between the first surface 212 and second surface 214 equals "t/2." In embodiments, eighth distance d8 may be less than half of the distance t/2 between the first surface and the second surface.

Figure 6F:
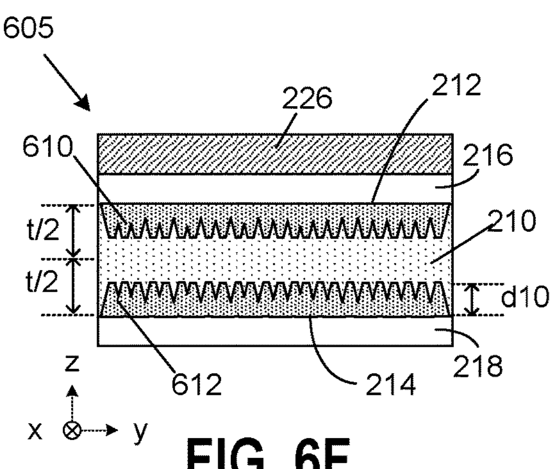

FIG. 6D shows a top-down view of portion 534 according to some embodiments. FIGS. 6E and 6F are cross-sectional side views 604 and 605 of the embodiment of FIG. 3D. The cross sections 604 and 605 are taken along line D-D. FIG. 6D illustrates laser-treated regions 532 aligned with line D-D at a surface of glass core 210. In FIGS. 6D-6F, laser-treated regions generally overlap with one another along line D-D.

FIG. 6E is a cross-sectional side view 604 of the embodiment of FIG. 6D. Cross section 604 is similar to cross section 304 of FIG. 3E, except laser-treated region 610 spans a ninth distance d9 in the first direction from the first surface 212 toward the second surface 214. Glass core 210 may have a thickness "t" such that a distance midway between the first surface 212 and second surface 214 equals "t/2." In embodiments, ninth distance d9 may be less than half of the distance t/2 between the first surface and the second surface.

FIG. 6F is a cross-sectional side view 605 of another embodiment of FIG. 6D. Cross section 605 is similar to cross section 305 of FIG. 3F, except laser-treated region 612 spans a tenth distance d10 in the second direction from the second surface 214 toward the first surface 212. Glass core 210 may have a thickness "t" such that a distance midway between the first surface 212 and second surface 214 equals "t/2." In embodiments, tenth distance d10 may be less than half of the distance t/2 between the first surface and the second surface.

Referring to FIG. 5B, a cross-sectional illustration of the IC package assembly 500 after material is removed from each of the plurality of laser-treated regions. The material removal results in creation of cavities 540 and 542. Any of the wet etch techniques described with reference to operation 112 of methods 100 may be used to remove material. In various embodiments, the wet etch process may be performed on first surface 212, second surface 214, or on both of first surface 212 and second surface 214. Because laser-treated regions have a depth that is less than half of the distance between the first surface 212 and the second surface 214, area 544 of glass substrate 210 remains intact. In some embodiments, cavity 540 may be approximately aligned vertically with cavity 542, and area 544 may be between cavity 540 may be between cavity 542, although alignment is not required.

FIG. 5C is a cross-sectional illustration of the IC package assembly 500 after the assembly is separated into a plurality of portions. One portion may correspond to IC package 536 and a second portion may correspond to an IC package 538. Portions may be separated from one another using any of the techniques described with reference to operation 114 of methods 100. In some embodiments, separation is performed using a mechanical sawing operation which cuts through area 544. Reference number 546 designates an area where a mechanical sawing operation may have been performed. Area 546 on a sidewall may show an artifact of mechanical sawing. An artifact of mechanical sawing may be coarser surface than a laser-treated and wet-etched surface. In various embodiments, a glass core comprises at least one region on a sidewall, e.g., area 546, that includes a chipped portion or a portion containing a crack, which may be an artifact of mechanical sawing. In addition, as may be seen in FIG. 5C in a cross section of a sidewall, the area 546 may protrude from the sidewall due to the tapers of cavities 540 and 542. In some embodiments, separation is performed using a laser ablation operation which cuts through area 544.

Figure 7A:
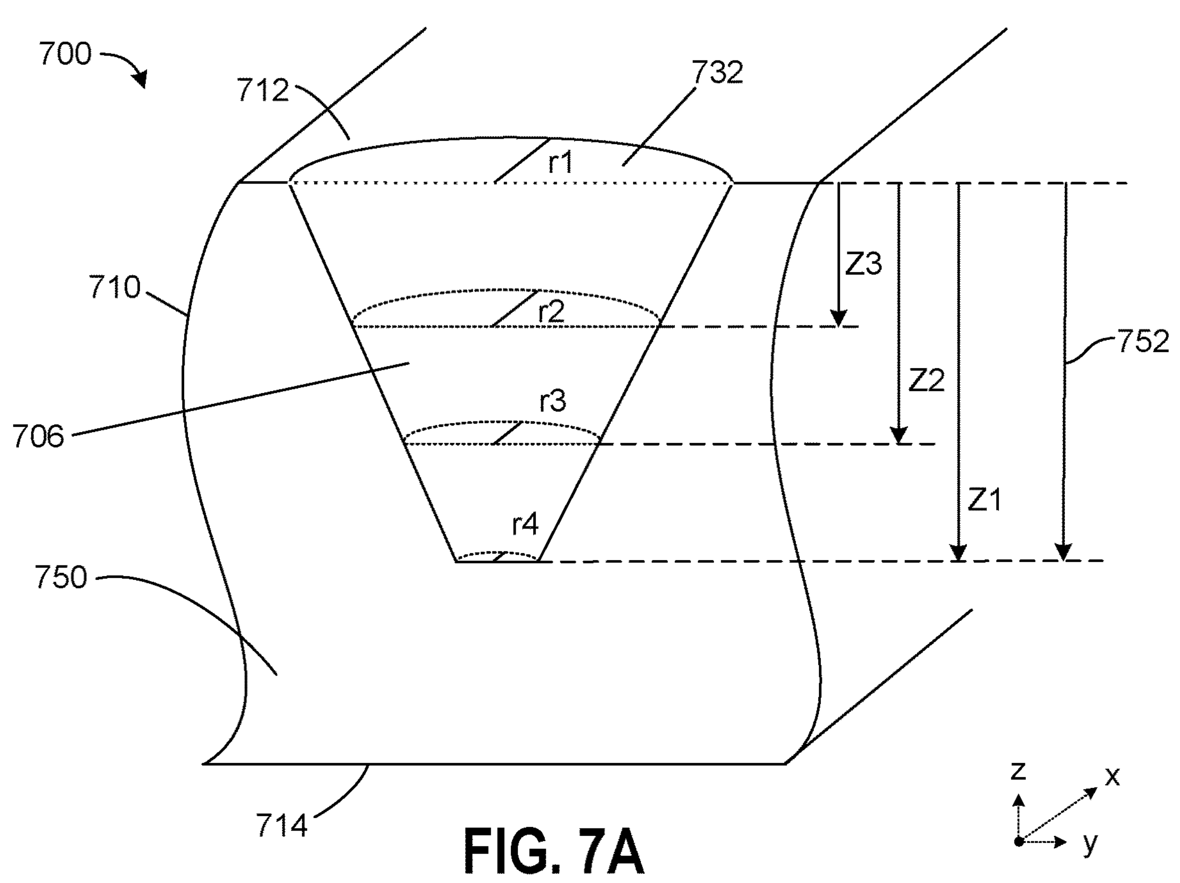
FIG. 7A is an isometric view of a cavity in a sidewall of a glass core according to an embodiment.

FIG. 7A is an isometric view of a cavity in a sidewall of a glass core according to an embodiment. In the example of FIG. 7A, cavity 706 may be in a sidewall 750 of glass core 710 between a first surface 712 and a second surface 714. Cavity 706 may have a concave surface. Cavity 706 may be formed by laser-treatment and wet etch processes as described herein. Reference number 732 designates a portion of the cavity at first surface 712. The cavity 706 spans a first distance z1 in a first direction 752 from the first surface 712 toward the second surface 714. At the first surface 712, cavity 706 has a first radius or lateral depth in the x-y plane of r1. The radius or lateral depth of cavity 710 decreases in the first direction 752. For example, cavity 706 may have a second radius of r2 at a third distance z3 below surface 712, a third radius of r3 at a second distance z2 below surface 712, and fourth radius r4 at first distance z1 below surface 712. In this example, the third distance z3 is less than the second distance z2, and the second distance z2 is less than the first distance z1, i.e., $z3<z2<z1$, while first radius r1 is greater than the second radius r2, the second radius r2 is greater than the third radius r3, and the third radius r3 is greater than fourth radius r4, i.e., $r1>r2>r3>r4$. In various embodiments, a glass core 710 comprises a sidewall 750 having at least one region. The region comprises a cavity 706 that spans a first distance z1 in a first direction 752 from the first surface 712 toward the second surface 714. In addition, the cavity 706 comprises a concave surface having a first depth r1 at the first surface 712 and a second depth r4 at the first distance z1. The second depth r4 is less than the first depth r1. While a cavity in a region of a sidewall may be conical as shown in FIG. 7A, in some embodiments, the cavity may be cylindrical, e.g., the cavity may have concave surface having a first depth r1 at the first surface 712 and a second depth r4 at the first distance z1, wherein second depth r4 is approximately equal to the first depth r1. While a cavity in a region of a sidewall may be conical as shown in FIG. 7A, in some embodiments, the cavity may be cuboidal, e.g., the cavity may have an approximately planar surface or wall at a first depth r1 from sidewall 750 at the first surface 712 and which is at a second depth r4 from sidewall 750 at the first distance z1; in these embodiments, the second depth r4 may be less than the first depth r1, or the second depth r4 may be approximately equal to the first depth r1. In addition, the cavity includes side and bottom surfaces that may be perpendicular to sidewall 750 in cuboidal embodiments.

Figure 7B:
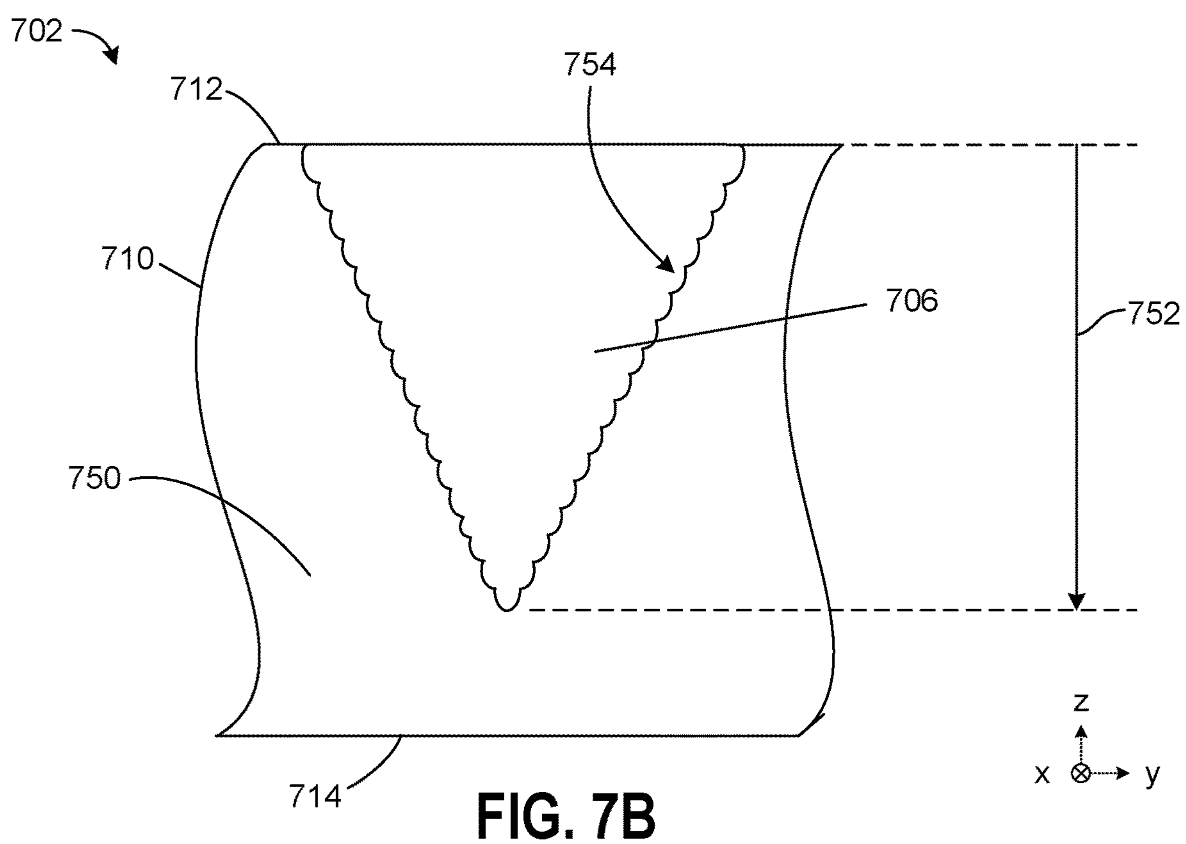
FIG. 7B is view of a cavity in a sidewall of a glass core according to an embodiment.

FIG. 7B is a side view of a cavity in a sidewall of a glass core according to an embodiment. In the example of FIG. 7B, cavity 706 may be in sidewall 750 of glass core 710 between a first surface 712 and a second surface 714. The cavity 706 may have a scalloped surface profile 754 oriented in first direction 752. During a laser treatment process, a glass substrate is exposed to multiple lasers pulses at multiple closely spaced locations. Locations where the multiple lasers pulses are focused vary in both the x-y plane and in the z-axis direction. Each pulse may correspond with a small concave surface or dimple on the concave surface of the cavity 706 (after a wet etch process). The relatively small, concave local surfaces or dimples from the multiple laser pulses may overlap in such a way that they aggregate to form scalloped profile 754 on the surface of the cavity. In various embodiments, scalloping is a result of the laser treatment and wet etch processes.

It should be appreciated that elements in FIGS. 7A and 7B are not necessarily drawn to scale and are shown in an idealized fashion in order to aid understanding. For example, under real-world conditions it is unlikely that a cavity resulting from laser treatment and wet etch processes would have an ideal conical shape with straight lines, sharp angles, and smooth curves. As another example, under real-world conditions it is unlikely that a cavity resulting from laser treatment and wet etch processes would have a surface profile with substantially scalloped features of symmetrical shape and placement.

As mentioned, methods 100 may begin at operation 102 with receiving a glass core. When methods 100 begin at 102, the glass core is treated in one or more of operations 108A, 108B, 110A, and 110B. After laser treatment of the glass core, build-up layers are formed in operation 116, an IC die may be attached in operation 118, and material covering a saw may be removed in operation 106. Wet etch and singulation operations follow in operations 112 and 114 respectively. FIGS. 8A-8E present one example of various stages of manufacturing when methods 100 begin at 102.

Figure 8A:
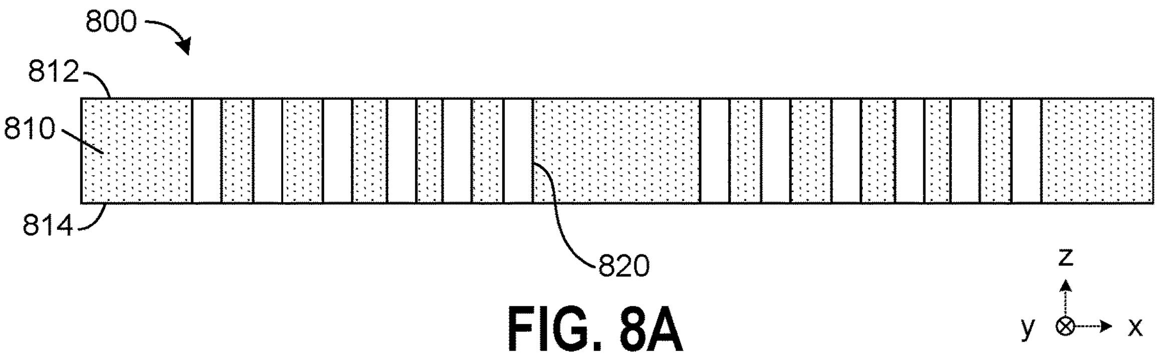
FIGS. 8A through 8E are simplified cross-sectional side view diagrams, each illustrating respective stages of a process to form an IC package assembly comprising a substrate having a glass core according to various embodiments.

FIG. 8A is a cross-sectional illustration of a glass core of an IC package assembly 800 according to various embodiments. The glass core 810 may comprise any of the types of materials described with reference to operation 104 of methods 100. The glass core 810 comprises a first surface 812 and a second surface 814 opposite the first surface 812. In some embodiments, glass core 810 may include a number of conductors that extend through the glass core 810. Each conductor is disposed in a hole or through-glass via 820, and each conductor may extend from the first surface 812 to the second surface 814, or only partially through the thickness of the glass core 810.

Figure 8B:
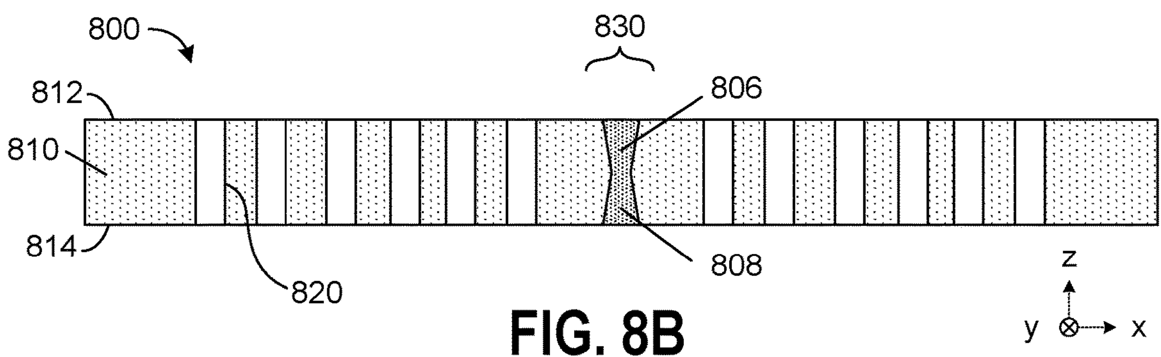

FIG. 8B is a cross-sectional illustration glass core 810 of IC package assembly 800 after a plurality of regions within singulation streets 830 on the first surface are treated with a laser according to various embodiments. Laser-treated regions within the glass core 810 are designated with reference numbers 806 and 808 in FIG. 8B. In an embodiment, laser-treated regions 806 and 808 may be the same as or similar to laser-treated regions 306 and 308, respectively of FIG. 2C. Laser treatments may use any of the techniques described with reference to operations 108A, 108B, 110A, or 110B of methods 100. Laser treatments may be performed on both surfaces 812 and 814, or on only one of the surfaces. Laser treatments may be performed to any depth or distance within the glass substrate 810, e.g., any of the distances d1, d2, d3, d4, d5, d6, d7, d8, d9, and d10 described elsewhere herein.

Figure 8C:
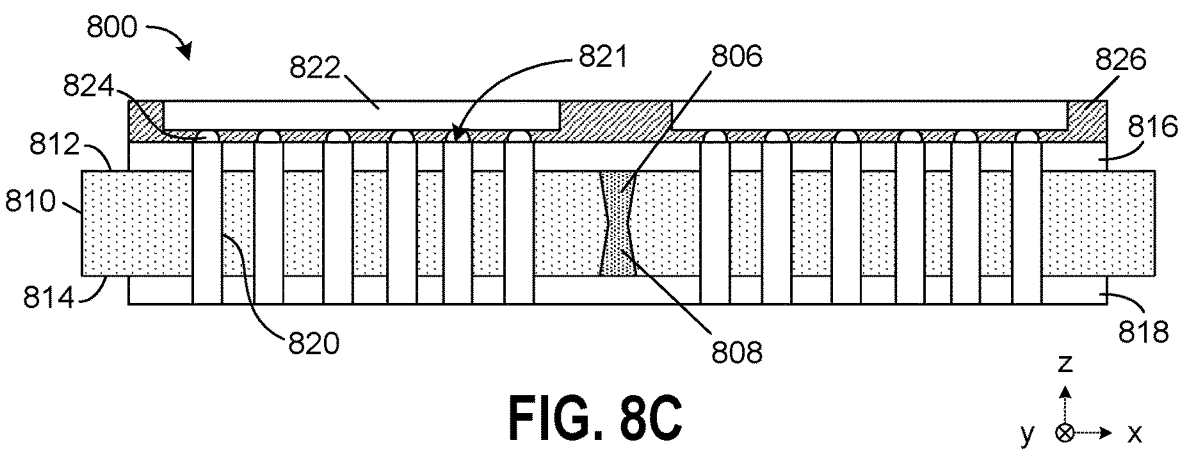

FIG. 8C is a cross-sectional illustration of IC package assembly 800 after build-up layers have been formed and an IC die has been attached. In FIG. 8C, a first build-up layer 816 has been formed on first surface 812 and a second build-up layer 818 has been formed on second surface 814. In some embodiments, conductors within vias 820 may be formed, which extend through the respective thicknesses of first build-up layer 816 and second build-up layer 818. Build-up layers may include a plurality of terminals 821. In addition, at least one IC die 822 is attached to the first build-up layer 816. Solder bumps 824 may be disposed on terminals 821. Further, a mold material 826 may be disposed on first build-up layer 816 between IC die 822 and the build-up layer. The mold material 826 may be adjacent to the interconnects, such as solder bumps 824, and may be adjacent to and abut sides of IC die 822.

Figure 8D:
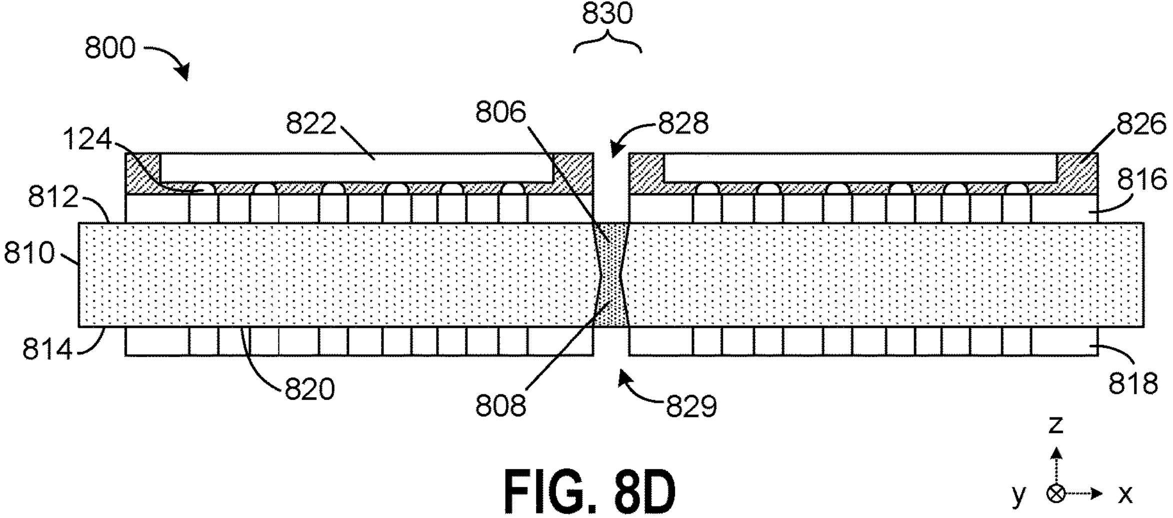

FIG. 8D is a cross-sectional illustration of the IC package assembly 800 after first opening 828 has been formed in first build-up layer 816 and mold material 826. In addition, a second opening 829 has been formed in second build-up layer 818. Openings 828 and 829 are formed in singulation street 830. Openings 828 and 829 expose portions of first surface 812 and second surface 814 in the singulation street 830. The openings 828 and 829 may be formed with any of the techniques described with reference to operation 106 of methods 100.

Figure 8E:
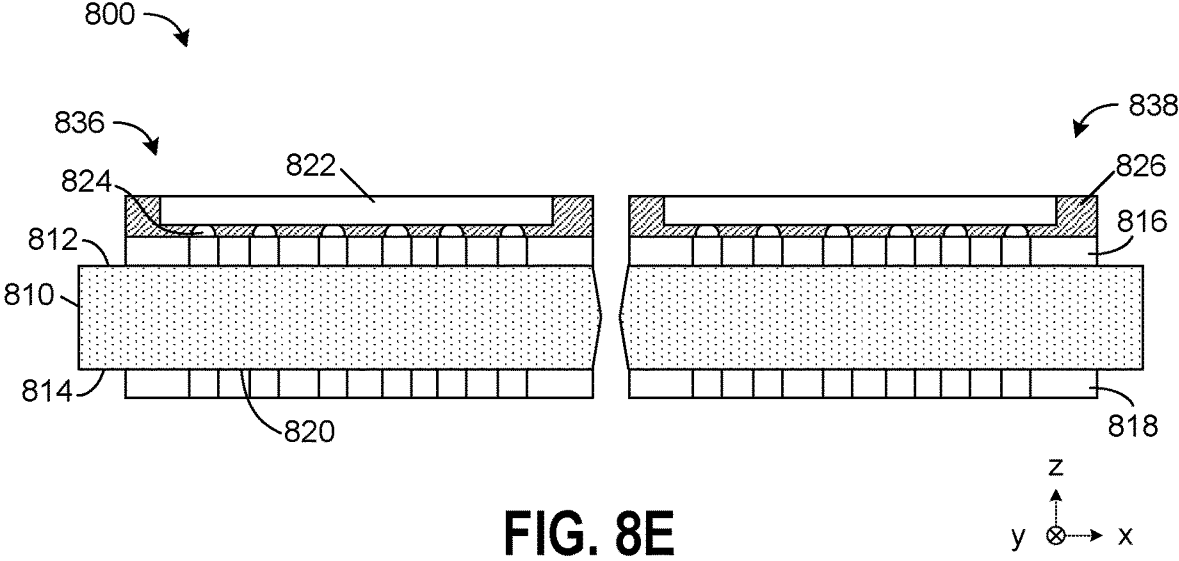

FIG. 8E is a cross-sectional illustration of the IC package assembly 800 after it is separated into a plurality of portions. One portion may correspond to IC package 836 and a second portion may correspond to an IC package 838. Portions may be separated from one another using any of the techniques described with reference to operation 114 of methods 100. In some embodiments, separation is performed using a mechanical sawing operation. In some embodiments, the laser treatment and wet etching of regions of the glass core 810 result in perforations are of sufficient depth and number that separation can be performed without mechanical sawing. For example, overlapping perforations forming deep or through holes may result in a glass core 810 that snaps or breaks when little pressure is applied. In some embodiments, other methods for separating the substrate may be employed, such as the use of a dicing tape technique.

Figure 9:
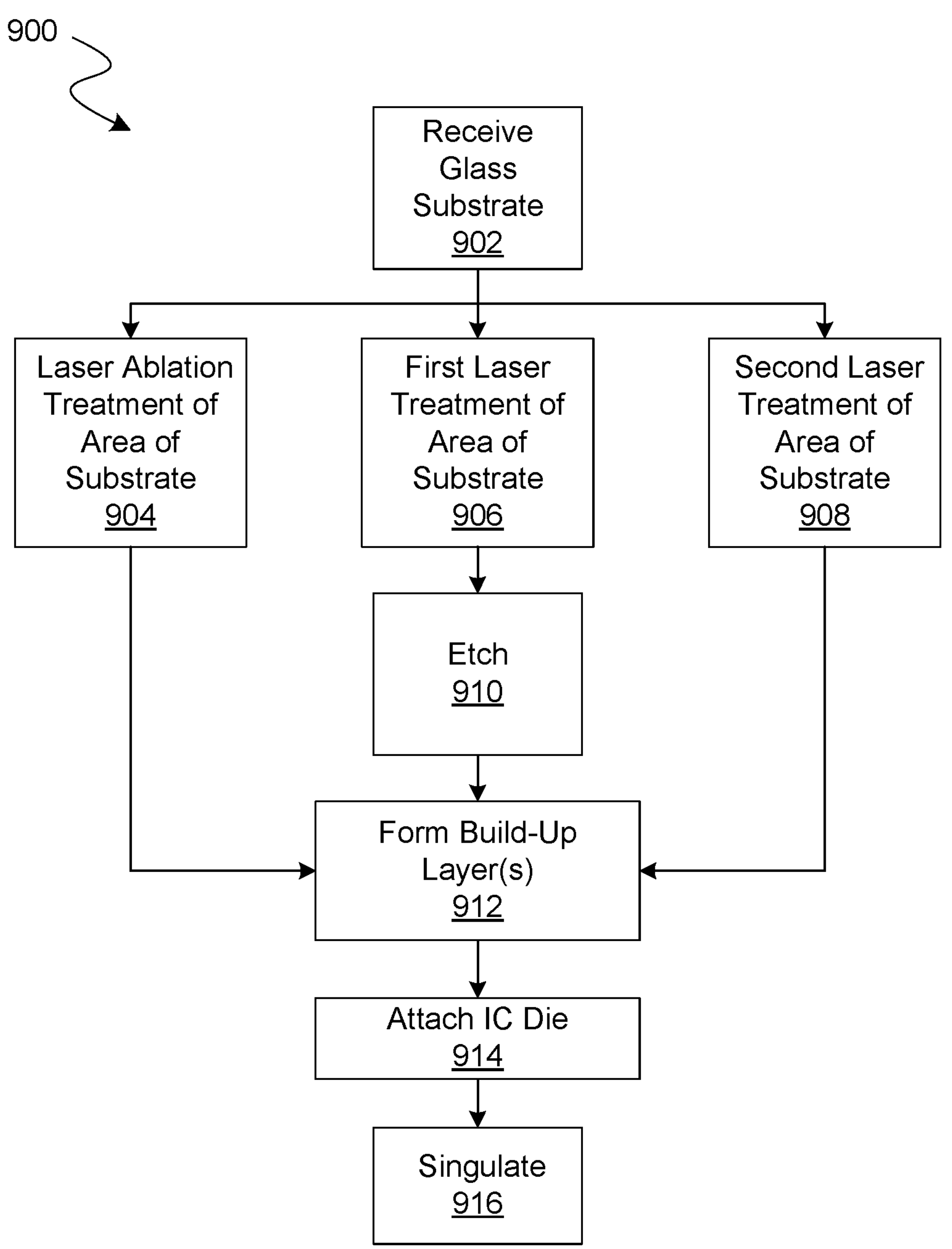
FIG. 9 illustrates a flow diagram of methods for singulating an IC package assembly having a substrate comprising a glass core according to some embodiments.

FIG. 9 illustrates a flow diagram of methods for singulating an IC package assembly having a substrate comprising a glass core according to some embodiments. Methods 900 may begin at 902, where a glass panel is received. The glass may comprise any of the types of glass materials described herein. The glass panel may be of a size sufficient to form at least two glass cores.

Mechanical cutting of a substrate with a glass core can result in defects in the core, e.g., micro-cracks, chips, and coarse sidewalls. These defects may impair the structural integrity and reliability of a final IC package. Methods 900 are directed to a hybrid singulation strategy which combines laser treatment with mechanical cutting. An advantage of methods 900 is that defects such as microcracks and chipping may be reduced and an edge finish of a sidewall may be improved.

Methods 900 provide for a guard frame in a corner region along a mechanical singulation street. In various embodiments, the guard frame is formed via laser treatment comprising: laser ablation or scribing, laser-assisted etching, or laser modification of the molecular structure of the glass. As a result of the laser treatment, the guard frame may confine growth of micro-cracks that can occur during mechanical cutting. Micro-cracks can form in the x-, y-, or z-direction during mechanical cutting. An advantage of methods 900 is that a guard frame may confine micro-cracking such that cracks may only propagate vertically in the z-direction, i.e., in the dicing direction, while cracks in longitudinal x- and y-directions may be inhibited.

Figures 10, 11A, 11B, 11C:
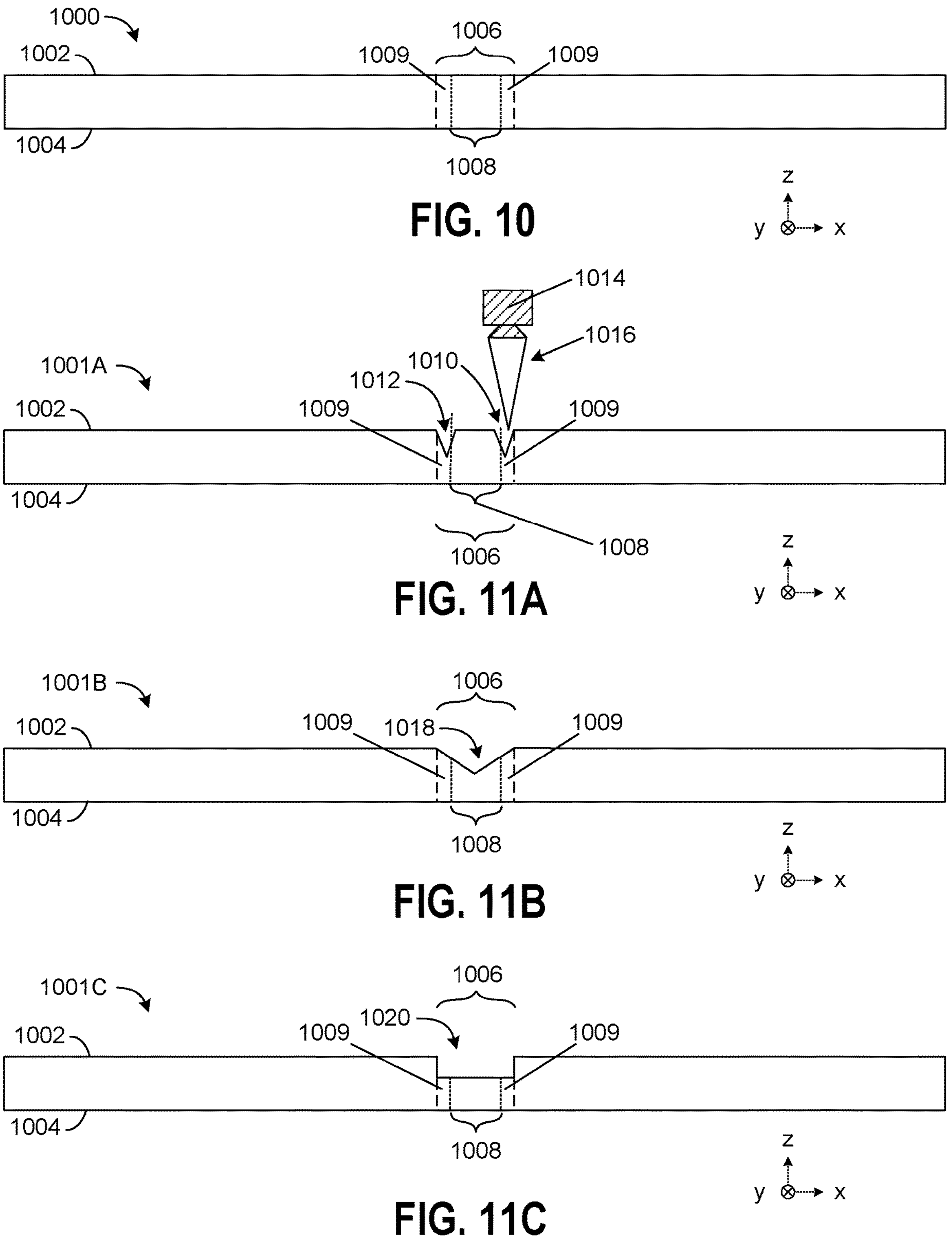
FIG. 10 is a simplified cross-sectional illustration of a portion of a glass panel from which multiple IC package assemblies comprising a substrate having a glass core can be formed according to various embodiments.
FIGS. 11A, 11B, and 11C are simplified cross-sectional illustrations the portion of the glass panel of FIG. 10 after a laser ablation treatment according to various embodiments.

FIG. 10 is a simplified cross-sectional illustration of a portion of a glass panel 1000 from which multiple IC package assemblies comprising a substrate having a glass core can be formed according to various embodiments. The glass panel 1000 comprises a first surface 1002 and a second surface 1004 opposite the first surface. A distance between the first and second surfaces 1002, 1004 defines a thickness (in z-direction) of the glass panel 1000. In various embodiments, the glass panel 1000 may comprise a glass panel of a size sufficient to form multiple IC packages. A plurality of singulation streets 1006 on the glass panel demark a plurality of portions, wherein a particular portion may be used to form a substrate of an individual IC package. The plurality of singulation streets 1006 comprise locations rather than scribes or other markings, although, in some embodiments, scribes or other markings may be placed on the substrate to identify singulation streets. Kerf regions 1008 within singulation streets 1006 represent where some material may be removed during a cutting or sawing operation. In one example, kerf regions 1008 are removed as a result of a mechanical sawing operation. A mechanical saw may be centered on a singulation street during a cutting operation, however, the kerf of the saw, e.g., kerf regions 1008, may be narrower than singulation streets 1006. The area remaining after cutting or sawing may be within a singulation street 1006 but outside of a kerf region 1008. The area remaining after cutting or sawing may be referred to as a “guarding frame.” After the glass panel is separated into multiple IC package assemblies comprising a substrate having a glass core, the area remaining after cutting or guarding frame may be a in a “corner region” of the glass core. In the example of FIG. 10, and in other embodiments, there may be guarding frames 1009 within singulation street 1006 on each side of kerf region 1008. A cutting operation may induce micro-cracks in glass panel 1000. In various embodiments, a guarding frame advantageously comprises a feature that may inhibit, reduce, or stop propagation of micro-cracks in a direction perpendicular to kerf region 1008, e.g., in an x-axis direction.

While a guard frame may be provided only on a surface of glass panel that receives a mechanical saw, e.g., the first surface 1002, in some embodiments, a guard frame may be provided on both first surface 1002 and second surface 1004, which is opposite the first surface. In some embodiments, a guard frame is only provided on the second surface 1004.

In some embodiments, a glass panel may have sides (if rectangular) or a diameter (if round) of about 25 cm or more.

In some embodiments, glass panel 1000 may have a thickness of about 200 μm up to about 1.6 mm. In some embodiments, singulation streets 1006 may have a width of between about 200 μm up to about 500 μm. In an embodiment, singulation streets 1006 may have a width of about 300 μm, kerf regions 1008 may have a width of about 200 μm, and a guarding frame in a corner region may have a width of between about 25 and 75 μm. In an embodiment, glass panel 1000 may have a thickness of about 200 μm up to about 1.6 mm, the guarding frame in the corner region has a thickness, i.e., spans a distance from the first surface in a direction parallel to the first sidewall, and the thickness or distance is between about 15 and 25 percent of the thickness of the glass core. For example, the thickness of the guarding frame in the corner region may be between 75 μm and 125 μm for a 500 μm thick glass panel.

Referring to FIG. 9, alternative laser treatments may be performed on a glass panel in operations 904, 906, and 908. At operation 904, a laser ablation treatment is performed on an area within a singulation street 1006 on first surface 1002 according to an embodiment. Laser parameters, such as power, pulse duration, number of pulses, wavelength, spot size, beam shape, scan speed, etc., are set such that the laser treatment ablates a particular area to form a trench in the glass panel. In various embodiments, a glass panel is irradiated with a pulsed, ultrashort, near-infrared laser (NIR), e.g., with pulse durations in the femto- or pico-second range at a wavelength of 1064 nm. For laser ablation treatment, picosecond lasers (for example, 15 ps pulse duration) with different wavelengths ranging from ultraviolet (UV) to NIR, e.g., 355 nm, 532 mn, and 1064 nm, can be used. Beam size may be around 10-30 um with a Gaussian beam. Depending on the lasers and types of glass, the laser fluence is normally around 10 J/cm$^2$. Multiple pulses are generally required to achieve certain ablation depth.

One or more areas within singulation street 1006 may be treated with a laser at 904. As a result of operation 904, one or more trenches are formed on first surface 1002. In some embodiments, trenches may be formed on both first surface 1002 and second surface 1004, or on only one of the surfaces. In an embodiment, the depth of the one or more trenches is about 33 to about 50 percent of the thickness of glass panel 1000. However, in other embodiments, the trenches formed in operation 904 may have any desired depth, e.g., 15, 25, 60, 75, 90, or 100 percent of the glass thickness, i.e., the distance between first surface 1002 and second surface 1004. Trenches may be formed anywhere within singulation street 1006. In some embodiments, a trench may be centered on the singulation street 1006. In some embodiments, a trench may be offset from a centerline of the singulation street 1006. In various embodiments, a trench may have any desired cross-sectional profile, e.g., v-shaped or rectangular. In some embodiments, a trench may have a rounded bottom.

FIGS. 11A, 11B, and 11C are simplified cross-sectional illustrations of a portion of a glass panel after a laser ablation treatment in operation 904 according to various embodiments. FIG. 11A shows a first trench 1010 and a second trench 1012 that have been created by laser tool 1014 using a laser beam 1016 focused at first surface 1002 of glass panel 1001A. Laser tool 1014 may be moved laterally or vertically to various positions, or the glass panel may be moved relative to laser tool 1014, in order to achieve a desired trench depth and cross-sectional profile. In the example of FIG. 11A, first trench 1010 and second trench 1012 may be formed at outside edges of singulation street 1006. In an embodiment, trenches 1010, 1012 have a v-shaped cross-sectional profile. In an embodiment, trenches 1010, 1012 are substantially within a guarding frame 1009 on either side of the kerf area 1008, but may extend into kerf area 1008.

FIG. 11B shows a third trench 1018 on first surface 1002 that has been created by laser tool 1014 first surface 1002 of glass panel 1001B. In the example of FIG. 11B, third trench 1018 may be centered singulation street 1006. In an embodiment, third trench 1018 has a v-shaped cross-sectional profile and extends into guarding frames 1009 on either side of the kerf area 1008.

FIG. 11C shows a fourth trench 1020 on first surface 1002 that has been created by laser tool 1014 on first surface 1002 of glass panel 1001C. In the example of FIG. 11C, fourth trench 1020 may be centered singulation street 1006. In an embodiment, fourth trench 1020 has a rectangular cross-sectional profile and extends into guarding frames 1009 on either side of the kerf area 1008.

Referring again to FIG. 9, at operation 906, a first laser treatment for laser-assisted etching is performed on an area within a singulation street 1006 on first surface 1002 according to an embodiment. Laser parameters, such as power, pulse duration, number of pulses, wavelength, spot size, beam shape, scan speed, etc., are set such that the laser treatment prepares a particular area in the glass panel so that it is susceptible to a wet etch process. In various embodiments of laser-etching methods, pico- or femtosecond lasers, e.g., visible wavelength or NIR, such as 532 nm or 1064 nm, can be used. The laser beam may have a Bessel shape, and beam sizes vary with the feature sizes, i.e., size of area desired to confine growth of micro-cracks that can occur during mechanical cutting. The laser fluence is typically much lower than with laser ablation treatment, e.g., laser fluence could be less than 10% of the laser ablation treatment, e.g., in the range of approximately 0.1 to 1 J/cm$^2$. In some embodiments, single pulse treatment is used. In other embodiments 2 to 5 pulses may be used.

Figure 12A:
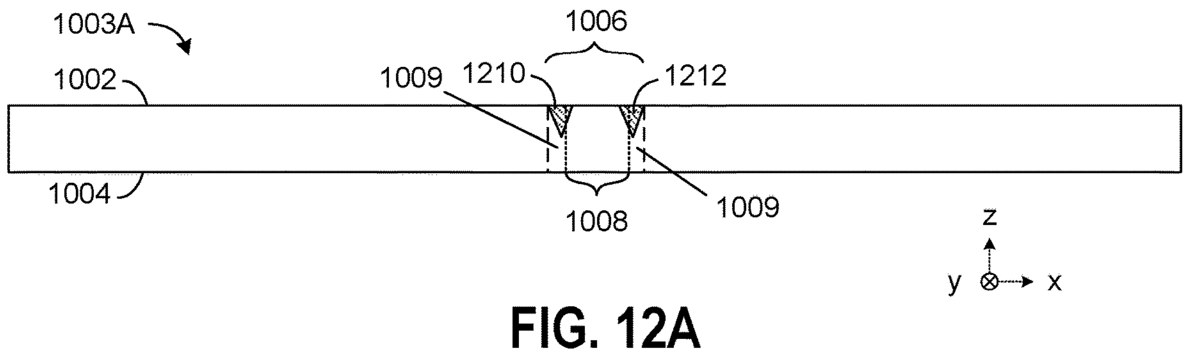
FIGS. 12A, 12B, and 12C are simplified cross-sectional illustrations of the portion of the glass panel of FIG. 10 after a first laser treatment according to various embodiments.
Figure 12B:
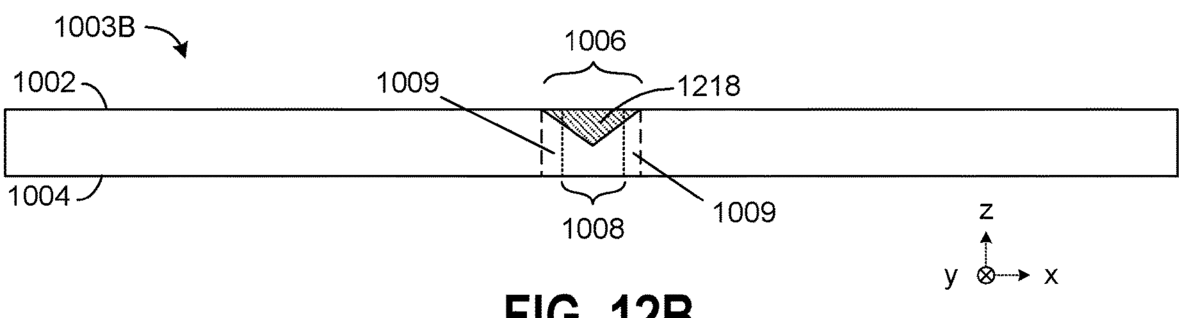
Figure 12C:
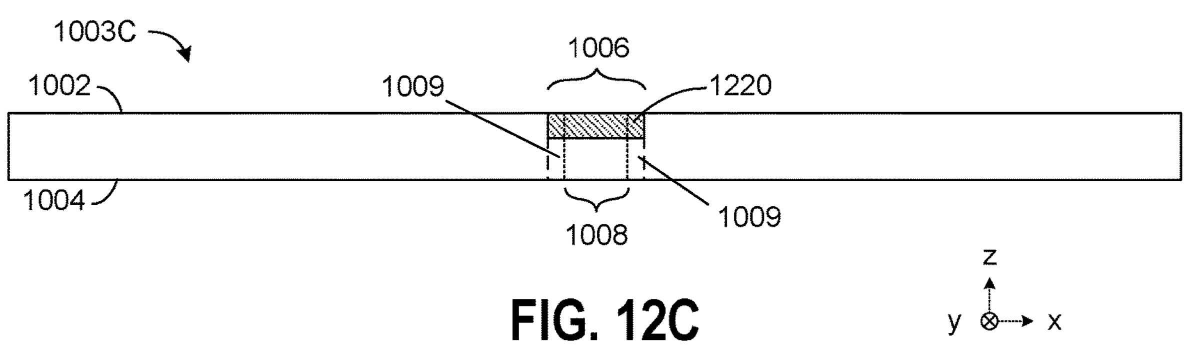

FIGS. 12A, 12B, and 12C are simplified cross-sectional illustrations of a portion of a glass panel after laser treatment in operation 906 according to various embodiments. FIG. 12A shows a first treated area 1210 and a second treated area 1212 that have been created by laser tool 1014 on first surface 1002 of glass panel 1003A. In the example of FIG. 12A, first treated area 1210 and second treated area 1212 may be formed at outside edges of singulation street 1006. In an embodiment, treated areas 1210, 1212 have a v-shaped cross-sectional profile and are substantially within a guarding frame 1009 on either side of the kerf area 1008. In an embodiment, treated areas 1210, 1212 are substantially within a guarding frame 1009 on either side of the kerf area 1008, but may extend into kerf area 1008.

FIG. 12B shows a third treated area 1218 on first surface 1002 that has been created by laser tool 1014 on first surface 1002 of glass panel 1003B. In the example of FIG. 12B, third treated area 1218 may be centered singulation street 1006. In an embodiment, third treated area 1218 has a v-shaped cross-sectional profile and is extends into guarding frames on either side of the kerf area 1008. In an embodiment, third trench 1018 has a v-shaped cross-sectional profile and extends into guarding frames 1009 on either side of the kerf area 1008.

FIG. 12C shows a fourth treated area 1220 on first surface 1002 that has been created by laser tool 1014 on first surface 1002 of glass panel 1003C. In the example of FIG. 12C, fourth treated area 1220 may be centered singulation street 1006. In an embodiment, fourth treated area 1220 has a rectangular cross-sectional profile and is extends into guarding frames 1009 on either side of the kerf area 1008.

Referring again to FIG. 9, at operation 910, one or more trenches are formed using an etch process on an area treated by a laser in a laser-assisted etching process (first laser treatment 906) according to an embodiment. At 910, an etch process is performed on first surface 1002, second surface 1004, or on both surfaces. The etch process is performed on a glass panel laser 1000 treated in operation 906. In some examples, the etch process at 910 is a wet etch process, which may use hydrogen fluoride (HF), sodium hydroxide (NaOH), or potassium hydroxide (KOH). However, other suitable compounds may be used in alternative embodiments. In various embodiments, operation 910 may include masking areas other than the laser-treated areas to protect those areas from the wet etch chemical composition. As a result of operation 910, one or more trenches are formed.

Figure 13A:
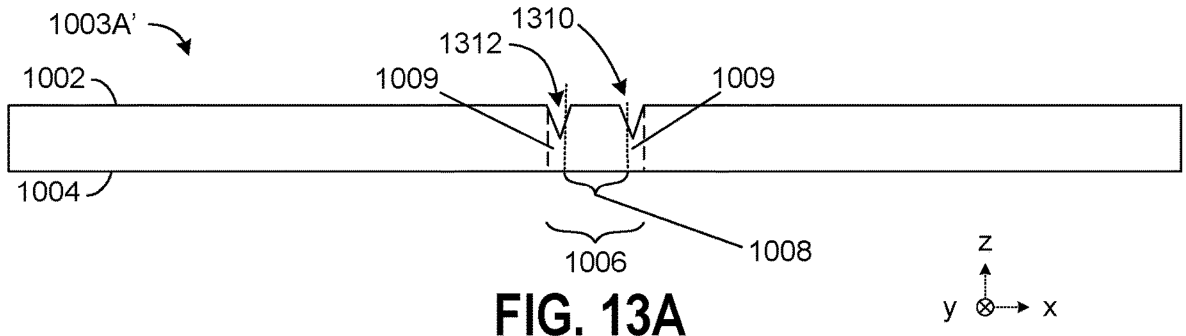
FIGS. 13A, 13B, and 13C are simplified cross-sectional illustration of respective portions of glass panels of FIGS. 12A, 12B, and 12C after a wet etch treatment according to various embodiments.
Figure 13B:
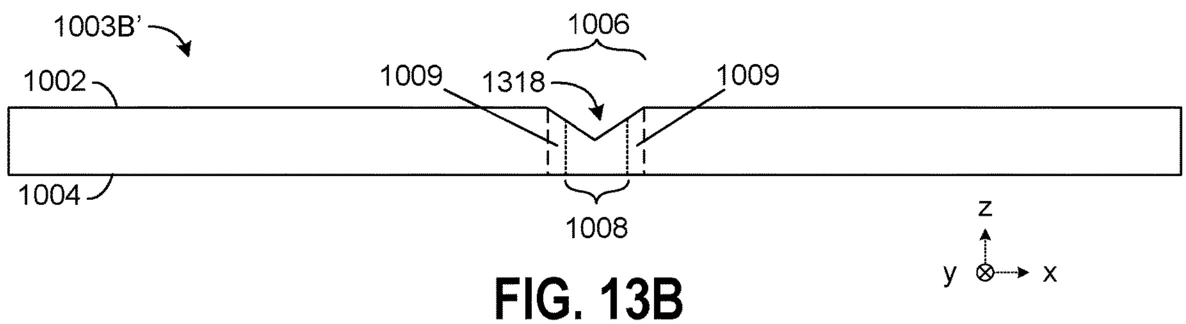
Figure 13C:
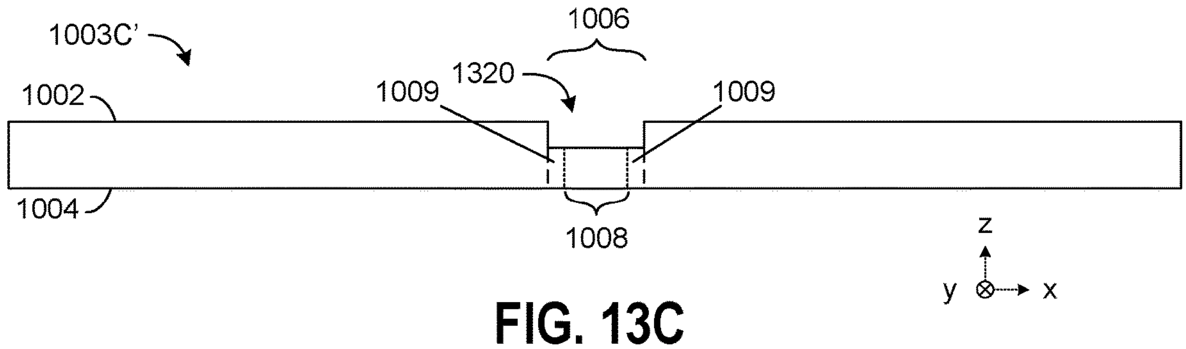

FIGS. 13A, 13B, and 13C are simplified cross-sectional illustration of a portion of a glass panel after laser treatment in operation 906 and wet etch treatment in operation 910 according to various embodiments. FIG. 13A shows a first trench 1310 and a second trench 1312 that have been created on first surface 1002 of glass panel 1003A' as a result of an etch process 910. In the example of FIG. 13A, first trench 1310 and second trench 1312 may be formed at outside edges of singulation street 1006. In an embodiment, trenches 1310, 1312 have a v-shaped cross-sectional profile. In an embodiment, trenches 1310, 1312 are substantially within a guarding frame 1009 on either side of the kerf area 1008, but may extend into kerf area 1008.

FIG. 13B shows a third trench 1318 on first surface 1002 that has been created on first surface 1002 of glass panel 1003B' by etch process 910. In the example of FIG. 13B, third trench 1318 may be centered singulation street 1006. In an embodiment, third trench 1318 has a v-shaped cross-sectional profile and extends into guarding frames 1009 on either side of the kerf area 1008.

FIG. 13C shows a fourth trench 1320 on first surface 1002 that has been created on first surface 1002 of glass panel 1003C' by etch process 910. In the example of FIG. 13C, fourth trench 1320 may be centered singulation street 1006. In an embodiment, fourth trench 1320 has a rectangular cross-sectional profile and extends into guarding frames 1009 on either side of the kerf area 1008.

Referring again to FIG. 9, at operation 908, a second laser treatment is for glass internal structure modification is performed on an area within a singulation street 1006 on first surface 1002 according to an embodiment. Laser parameters, such as power, pulse duration, number of pulses, wavelength, spot size, beam shape, scan speed, etc., are set such that the laser treatment modifies the internal structure or arrangement of molecules within the glass in a particular area. In various embodiments, laser modification at 908 can use ultrashort duration lasers, e.g., femtosecond lasers. In some embodiments, UV, visible, or NIR lasers may be used at 908. Laser fluence may be in the range of approximately 0.01 to 1 J/cm$^2$. At 908, the beam shape may be Gaussian. In various embodiments, multiple pulses focusing on different levels or depths may be employed to form a modification zone having certain depth or width.

In various embodiments, an area treated with a laser at 908 results in the glass having a first compressive stress parameter value. Another area of the glass panel not treated at 908 may have a second compressive stress parameter value. In embodiments, the first compressive stress parameter value is higher than the second compressive stress parameter value. Because of the difference in compressive stress values for the two areas, the laser-treated area may have a first refractive index, e.g., color, and an untreated area may have a second refractive index. Particular first and second refractive index values will depend on at least glass composition and laser parameters used during treatment. In addition, an area treated with a laser at 908 may have a first photoelasticity parameter value and another area of the glass panel not treated at 908 may have a second photoelasticity parameter value. Again, particular first and second photoelasticity values will depend on at least glass composition and laser parameters used during treatment.

Figure 14A:
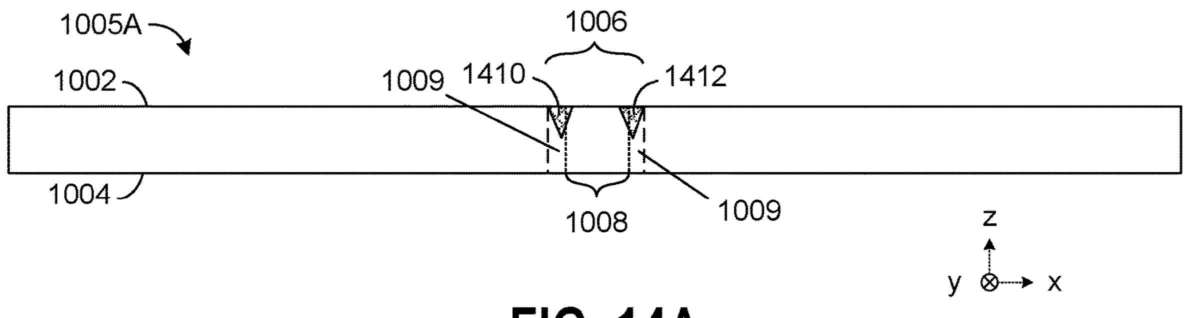
FIGS. 14A, 14B, and 14C are simplified cross-sectional illustrations of the portion of the glass panel of FIG. 10 after a second laser treatment according to various embodiments.
Figure 14B:
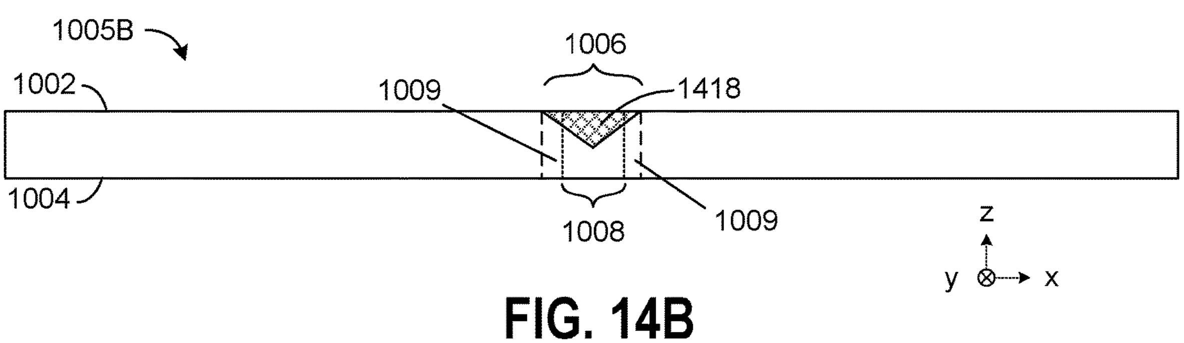
Figure 14C:
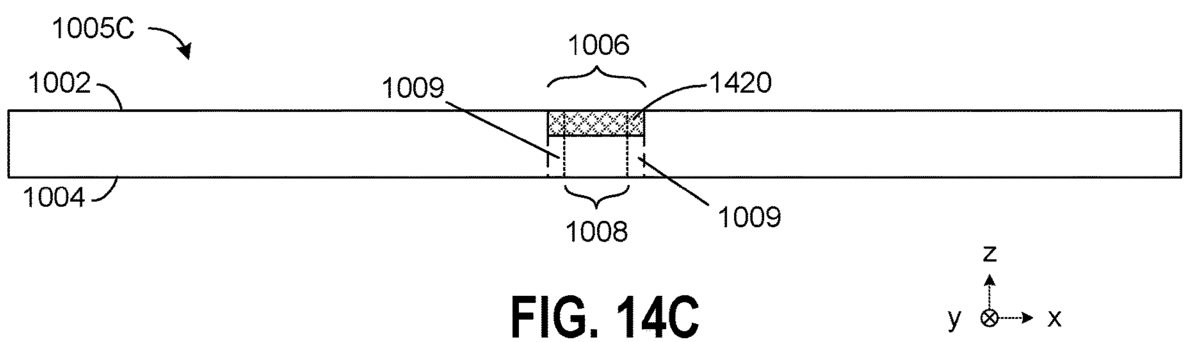

FIGS. 14A, 14B, and 14C are simplified cross-sectional illustrations of a portion of a glass panel after the second laser treatment for glass internal structure modification in operation 908 according to various embodiments. FIG. 14A shows a fifth treated area 1410 and a sixth treated area 1412 that have been created by laser tool 1014. In the example of FIG. 14A, fifth treated area 1410 and sixth treated area 1412 may be formed at outside edges of singulation street 1006. In an embodiment, laser-treated areas 1410, 1412 have a v-shaped cross-sectional profile and are substantially within a guarding frame 1009 on either side of the kerf area 1008. In an embodiment, treated areas 1410, 1412 are substantially within a guarding frame 1009 on either side of the kerf area 1008, but may extend into kerf area 1008 at widest points.

FIG. 14B shows a seventh treated area 1418 on first surface 1002 that has been created by laser tool 1014. In the example of FIG. 14B, seventh treated area 1418 may be centered singulation street 1006. In an embodiment, seventh treated area 1418 has a v-shaped cross-sectional profile and is extends into guarding frames 1009 on either side of the kerf area 1008. In an embodiment, seventh treated area 1418 has a v-shaped cross-sectional profile and extends into guarding frames 1009 on either side of the kerf area 1008.

FIG. 14C shows an eighth treated area 1420 on first surface 1002 that has been created by laser tool 1014. In the example of FIG. 14C, eighth treated area 1420 may be centered singulation street 1006. In an embodiment, eighth treated area 1420 has a rectangular cross-sectional profile and is extends into guarding frames 1009 on either side of the kerf area 1008 at widest points of the treated area.

Referring again to FIG. 9, at operation 912, at least one build-up layer is formed on a glass panel. As described above, the term "build-up" layer refers to one or more dielectric layers, one or more metallization layers, or one or more of both types of layers. In addition, operation 912 may include forming a hardware interface on a build-up layer. In an embodiment, a build-up layer is formed on first surface 1002. In another embodiment, a build-up layer is formed on second surface 1004. In various embodiments, a build-up layer may be formed over a laser-treated area.

At operation 914, one or more IC dies may be attached to a glass panel from which substrates comprising a glass core may be formed. The IC die may comprise any type of semiconductor device described herein or known in the art. Attaching an IC die (operation 914) may be performed prior to panel singulation (operation 916) or, in some embodiments, subsequent to panel singulation.

Operation 916 is a singulation operation performed on a glass panel. The glass panel may comprise a glass core having at least one build-up layer on a surface. In various embodiments, the glass panel may be singulated into two or more IC package substrates. In some embodiments of operation 916, a glass panel comprising a build-up layer may be singulated using a mechanical saw. In an embodiment, a mechanical sawing makes a cut along a line centered on or coinciding with a singulation street. In an embodiment, a singulation street comprises a first width and a singulation operation results in a kerf comprising a second width, wherein the second width is less than the first width. In other embodiments, a build-up layer over a saw street may be removed be removed prior to sawing. For example, a saw street may be masked off and a wet etch applied before using a mechanical saw to singulate the glass panel.

It may be seen from comparisons of FIGS. 11A, 11B, 11C with respective FIGS. 13A, 13B, and 13C, that trenches resulting from laser treatment and wet etching in operations 906 and 910 may be similar to trenches formed using laser ablation in operation 904. To simplify the following description of operations 912, 914, and 916, glass panels 1003A', 1003B', and 1003C' that result from operations 106 and 110 will be treated as equivalent to respective glass panels 1001A, 1001B, and 1001C that result from operation 904.

Figures 15A, 16A:
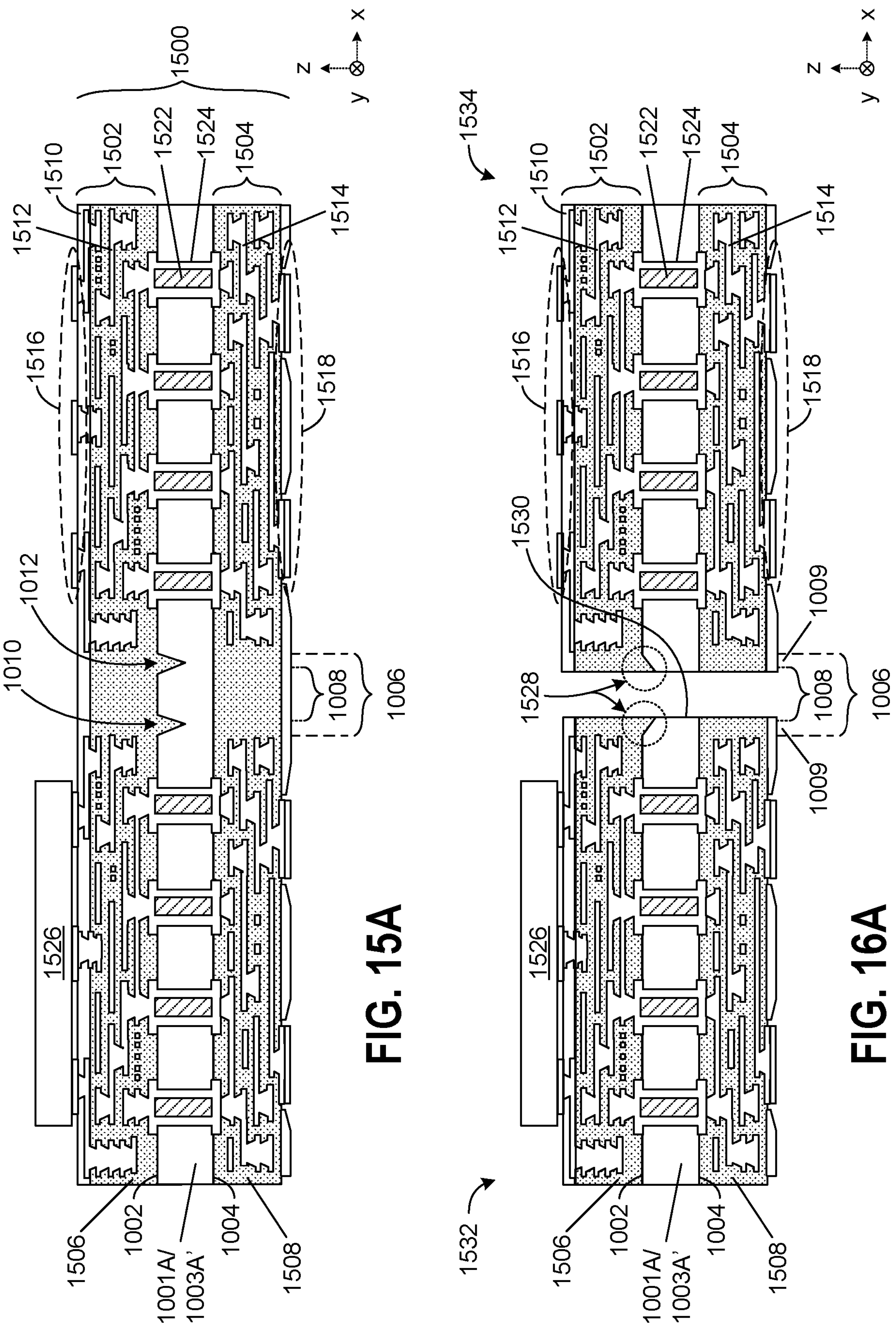
FIGS. 15A, 15B, and 15C are simplified cross-sectional illustrations of respective portions of a glass panels after formation of build-up layers and hardware interfaces according to various embodiments.
FIGS. 16A, 16B, and 16C are simplified cross-sectional illustrations of substrates after singulation according to various embodiments.
Figures 15B, 16B:
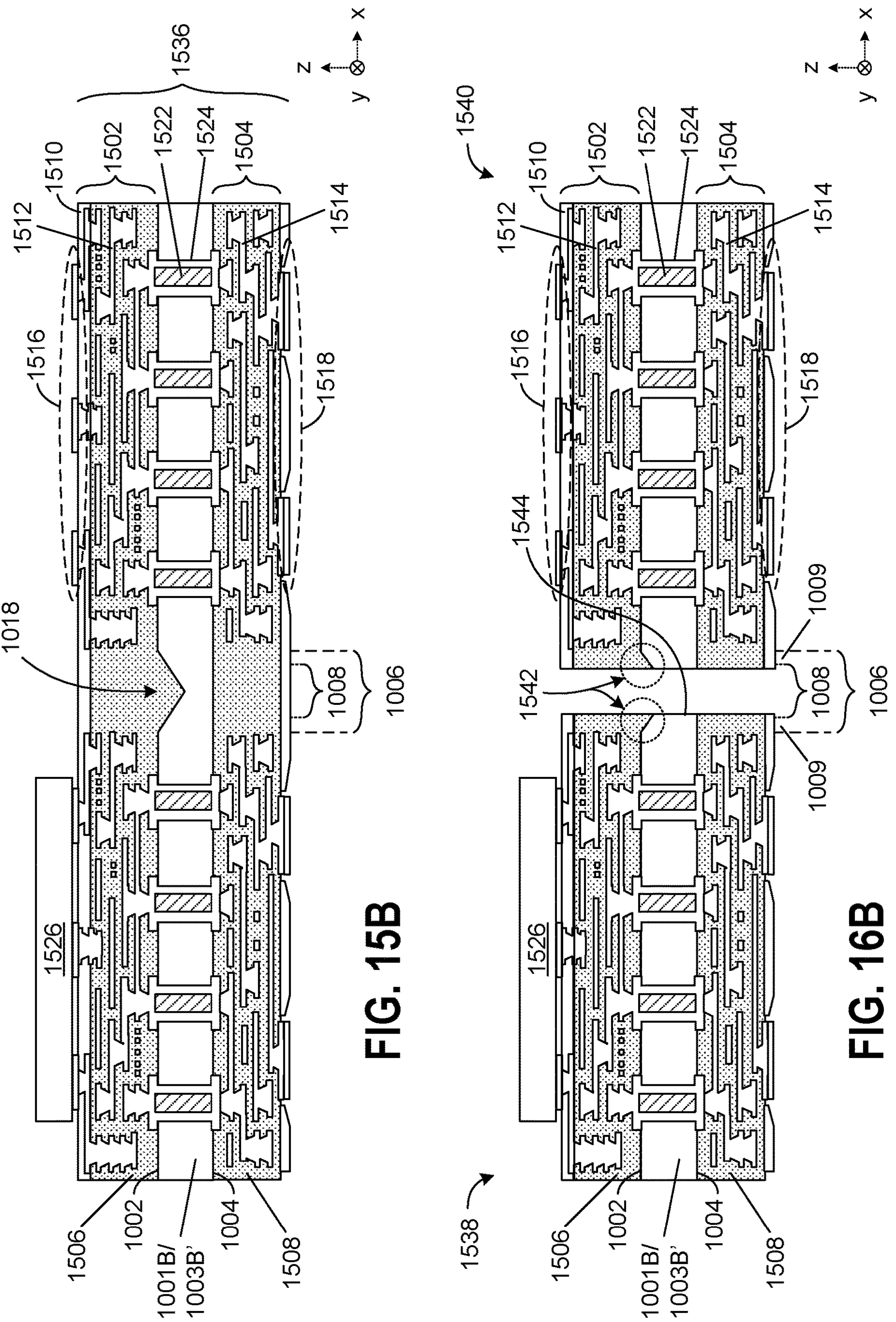
Figures 15C, 16C:
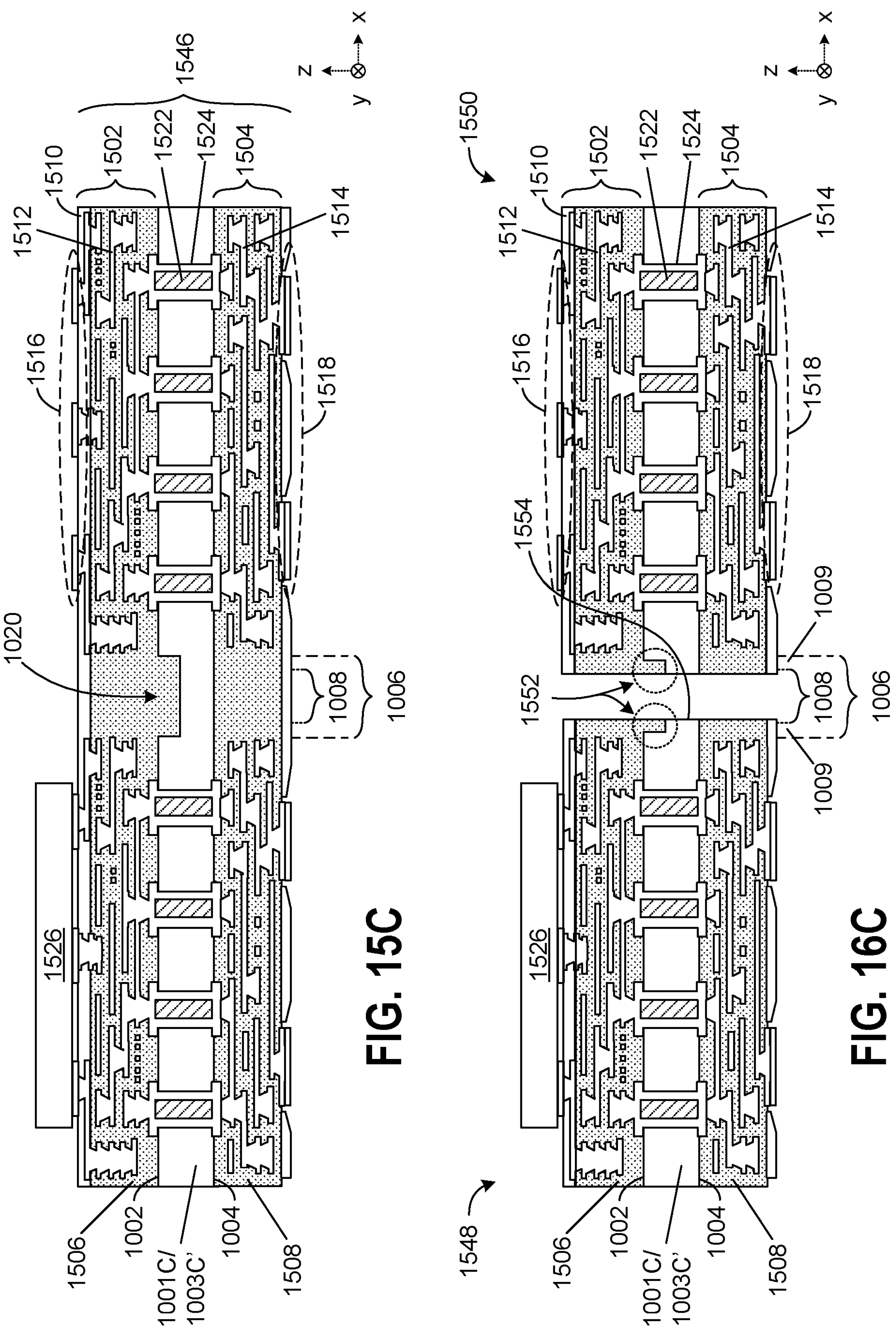

FIGS. 15A, 15B, and 15C are simplified cross-sectional illustrations of respective portions of a glass panels 1001A, 1001B, and 1001C having trenches formed using laser ablation in operation 904 after formation of build-up layers and hardware interfaces in operation 910 according to various embodiments. Because of their similarity, FIGS. 15A, 15B, and 15C may also viewed as simplified cross-sectional illustrations of respective portions of a glass panels 1003A', 1003B', and 1003C' having trenches formed in first laser treatment and wet etch operations 906 and 910 and after formation of build-up layers and hardware interfaces in operation 910 according to various embodiments.

FIG. 15A is a simplified cross-sectional illustration of glass panel 1001A (or 1003A') according to an embodiment. In FIG. 15A, a substrate 1500 comprises glass panel 1001A (or 1003A'). In various embodiments, a first build-up layer 1502 is on first surface 1002 and second build-up layer 1504 is on second surface 1004 of glass panel 1001A (or 1003A'). In an embodiment, first build-up layer 1502 comprises first dielectric material 1506, third dielectric material 1510, and first metallization structures 1512. In an embodiment, second build-up layer 1504 comprises second dielectric material 1508 and second metallization structures 1514. First hardware interfaces 1516 are on a surface of the first build-up layer 1502 and second hardware interfaces 1518 are on a surface of second build-up layer 1504. Through-glass vias 1524 within glass panel 1001A (or 1003A') extend from the first surface 1002 to the second surface 1004 and contain conductors 1522. In an embodiment, an IC die 1526 is mechanically and electrically coupled with first build-up layer 1502 via a first hardware interface 1516. In an embodiment, first trench 1010 and a second trench 1012 are filled with first dielectric material 1506.

FIGS. 16A, 16B, and 16C are simplified cross-sectional illustrations of substrates resulting from singulation of the substrates depicted in FIGS. 15A, 15B, and 15C, respectively, according to various embodiments.

FIG. 16A is a simplified cross-sectional illustration of substrates 1532 and 1534 that result from singulation of substrate 1500 in operation 916. Guarding frames 1009 within singulation street 1006 remain on each side of kerf region 1008 after singulation. The cross-sectional view of FIG. 16 A illustrates that portions of glass panel 1001A (or 1003A') that remain after singulation comprises a beveled edge in a corner region 1528, e.g., a surface that is not perpendicular to either first surface 1002 or a sidewall 1530 of the substrate 1532 or 1534. As another example, the beveled edged comprises a surface that makes a first angle with first surface 1002 that is greater than 90 degrees and makes a second angle with sidewall 1530 that is greater than 90 degrees. A dielectric material may be on the surface of beveled edge, e.g., first dielectric material 1506. The surface of beveled edge may be planar, however, in some embodiments the surface may be arcuate or curved. The beveled edge may be in a corner region 1528 where the first sidewall 1530 meets the first surface 1002 of a portion of glass panel 1001A (or 1003A') that remain after singulation.

FIG. 15B is a simplified cross-sectional illustration of portion of glass panel 1001B (or 1003B') according to an embodiment. In FIG. 15B, a substrate 1536 comprises glass panel 1001B (or 1003B'). In various embodiments, a first build-up layer 1502 is on first surface 1002 and second build-up layer 1504 is on second surface 1004 of glass panel 1001B (or 1003B'). In various embodiments, first build-up layer 1502 and second build-up layer 1504 may be the same as described with reference to FIG. 15A, and may include first hardware interfaces 1516 and second hardware interfaces 1508 on surfaces of first build-up layer 1502 and second build-up layer 1504. In addition, first build-up layer 1502 and second build-up layer 1504 may comprise conductors 1522 within through-glass vias 1524. In an embodiment, an IC die 1526 is mechanically and electrically coupled with first build-up layer 1502 via a first hardware interface 1516. In an embodiment, third trench 1018 is filled with first dielectric material 1506.

FIG. 16B is a simplified cross-sectional illustration of substrates 1538 and 1540 that result from singulation of substrate 1536 in operation 916. Guarding frames 1009 within singulation street 1006 remain on each side of kerf region 1008 after singulation. The cross-sectional view of FIG. 16B illustrates that glass panel 1001B (or 1003B') after singulation comprises a beveled edge in a corner region 1542, e.g., a surface at an edge that is not perpendicular to either first surface 1002 or a sidewall 1544 of the substrate 1538 or 1540. As another example, the beveled edged comprises a surface that makes a first angle with first surface 1002 that is greater than 90 degrees and makes a second angle with sidewall 1544 that is greater than 90 degrees. A dielectric material may be on the surface of beveled edge, e.g., first dielectric material 1506. The surface of beveled edge may be planar, however, in some embodiments the surface may be arcuate or curved. The beveled edge may be in a corner region 1542 where the first sidewall 1544 meets the first surface 1002 of a portion of glass panel 1001B (or 1003B') that remain after singulation.

FIG. 15C is a simplified cross-sectional illustration of portion of glass panel 1001C (or 1003C') according to an embodiment. In FIG. 15C, a substrate 1546 comprises glass panel 1001C (or 1003C'). In various embodiments, a first build-up layer 1502 is on first surface 1002 and second build-up layer 1504 is on second surface 1004 of glass panel 1001C (or 1003C'). In various embodiments, first build-up layer 1502 and second build-up layer 1504 may be the same as described with reference to FIG. 15A, and may include first hardware interfaces 1516 and second hardware interfaces 1508 on surfaces of the build-up layers 1502 and 1504. In addition, first build-up layer 1502 and second build-up layer 1504 may comprise conductors 1522 within through-glass vias 1524. In an embodiment, an IC die 1526 is mechanically and electrically coupled with first build-up layer 1502 via first hardware interface 1516. In an embodiment, fourth trench 1020 is filled with first dielectric material 1506.

FIG. 16C is a simplified cross-sectional illustration of substrates 1548 and 1550 that result from singulation of substrate 1546 in operation 916. Guarding frames 1009 within singulation street 1006 remain on each side of kerf region 1008 after singulation. The cross-sectional view of FIG. 16C illustrates that glass panel 1001C (or 1003C') after singulation comprises a recess in a corner region 1552. In an embodiment, the recess in a corner region 1552 may have a rectangular cross-sectional profile within a guarding frame 1009, with a first sidewall approximately parallel, e.g., within 5 degrees, with a sidewall 1554 of substrate 1548 or 1550, and a second sidewall approximately parallel, e.g., within 5 degrees, with first surface 1002 or second surface 1004. In another embodiment, the recess may have curved or rounded cross-sectional profile. A dielectric material may be on the first or second sidewalls of the recess, e.g., first dielectric material 1506. The recess may be in a corner region 1552 where the first sidewall 1554 meets the first surface 1002 of a portion of glass panel 1001C (or 1003C') that remain after singulation.

Figure 19A:
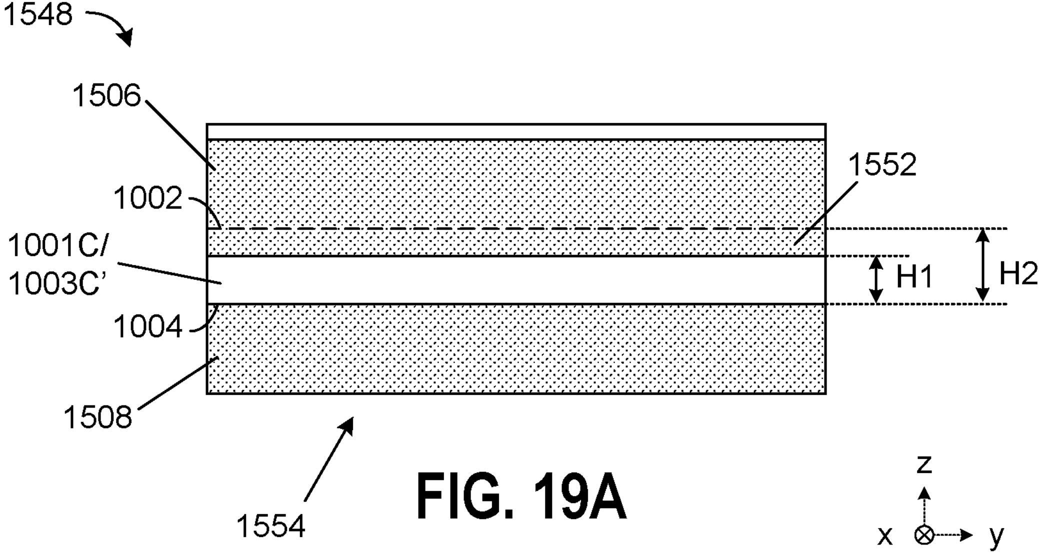
FIGS. 19A and 19B are alternate side views of substrates after singulation according to various embodiments.

FIG. 19A is an alternate side view of substrate 1548 that results from singulation of substrate 1546 in operation 916. FIG. 19A shows a surface of dielectric-filled recess 1552 at sidewall 1554. When viewed in the direction of the x-axis, it may be seen that the surface of glass panel 1001C (or 1003C') at sidewall 1554 exposed by singulation operation 916 has a height "H1." Because recess 1552 is filled with dielectric material 1506, the height H1 of the glass panel 1001C (or 1003C') at the exposed sidewall is less than the thickness of H2 of the glass panel 1001C (or 1003C'). The view of substrate portion 1548 in FIG. 19A may be representative of portions 1532 and 1534 (shown in FIG. 16A), substrate portions 1538 and 1540 (shown in FIG. 16B), and portion 1550 (shown in FIG. 16C). These substrate portions will appear similar to substrate portion 1546 when viewed in the direction of the x-axis.

Figures 17A, 18A:
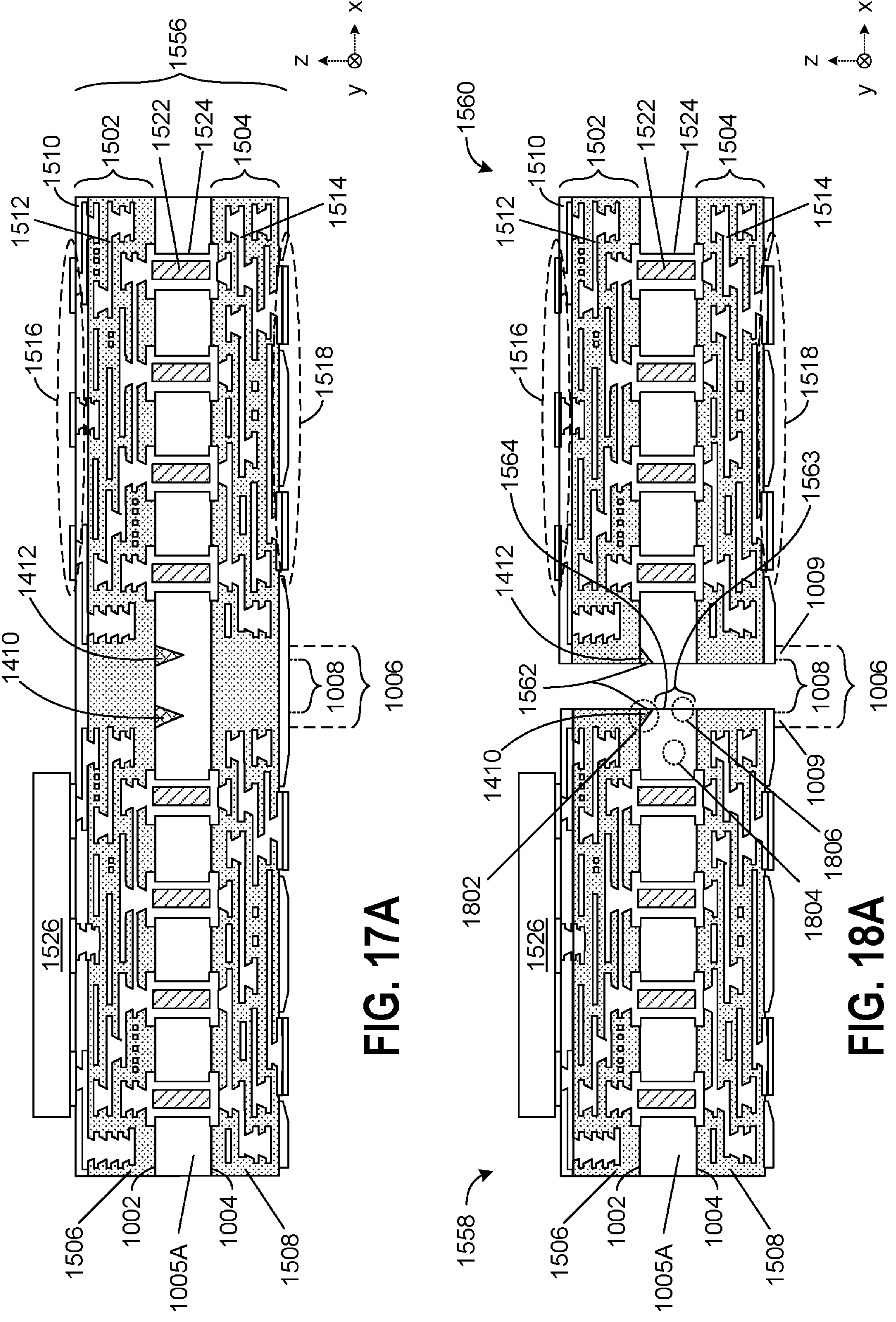
FIGS. 17A, 17B, and 17C are simplified cross-sectional illustrations of respective portions of glass panels of FIGS. 14A, 14B, and 14C after formation of build-up layers and hardware interfaces according to various embodiments.
FIGS. 18A, 18B, and 18C are simplified cross-sectional illustrations of substrates of FIGS. 17A, 17B, and 17C after singulation according to various embodiments.
Figures 17B, 18B:
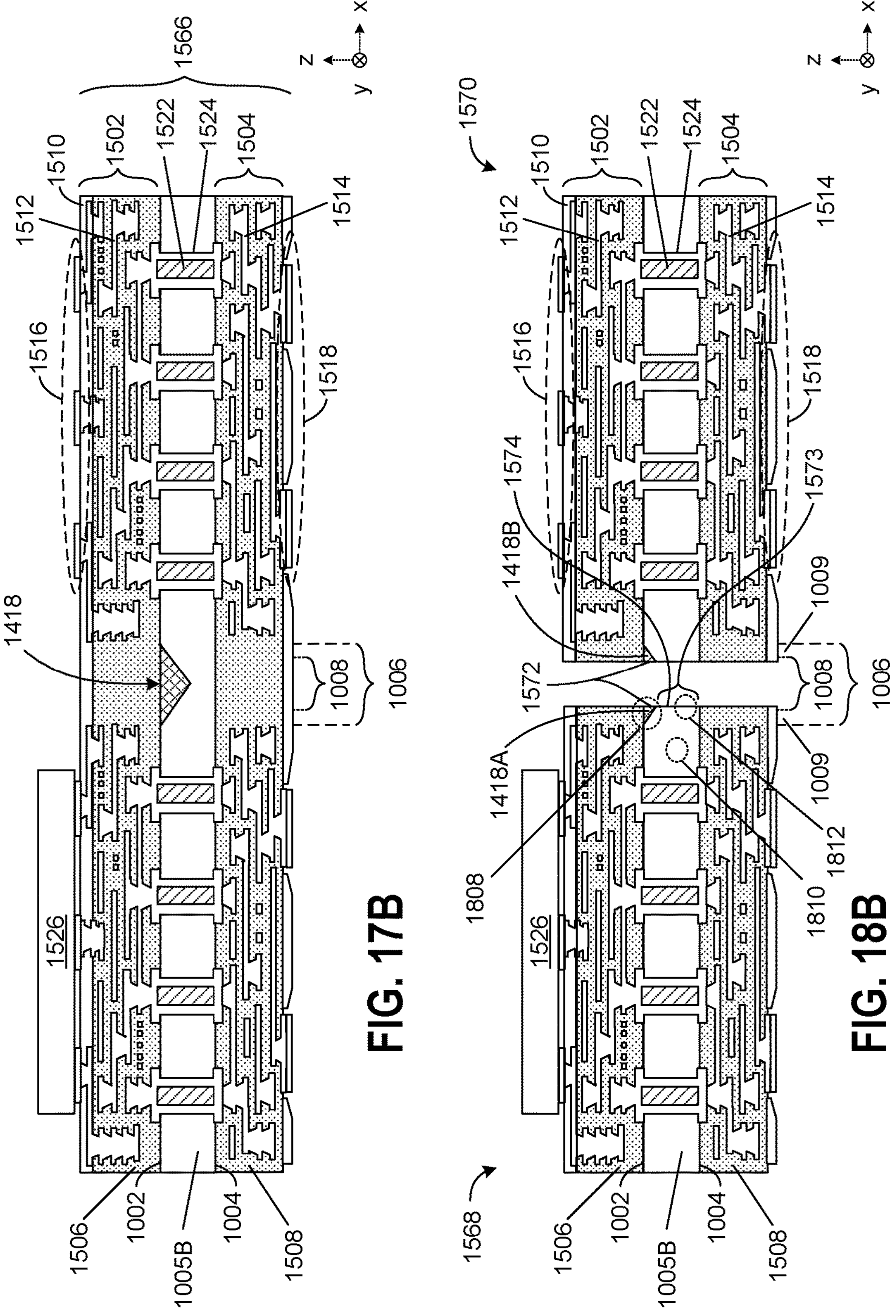
Figures 17C, 18C:
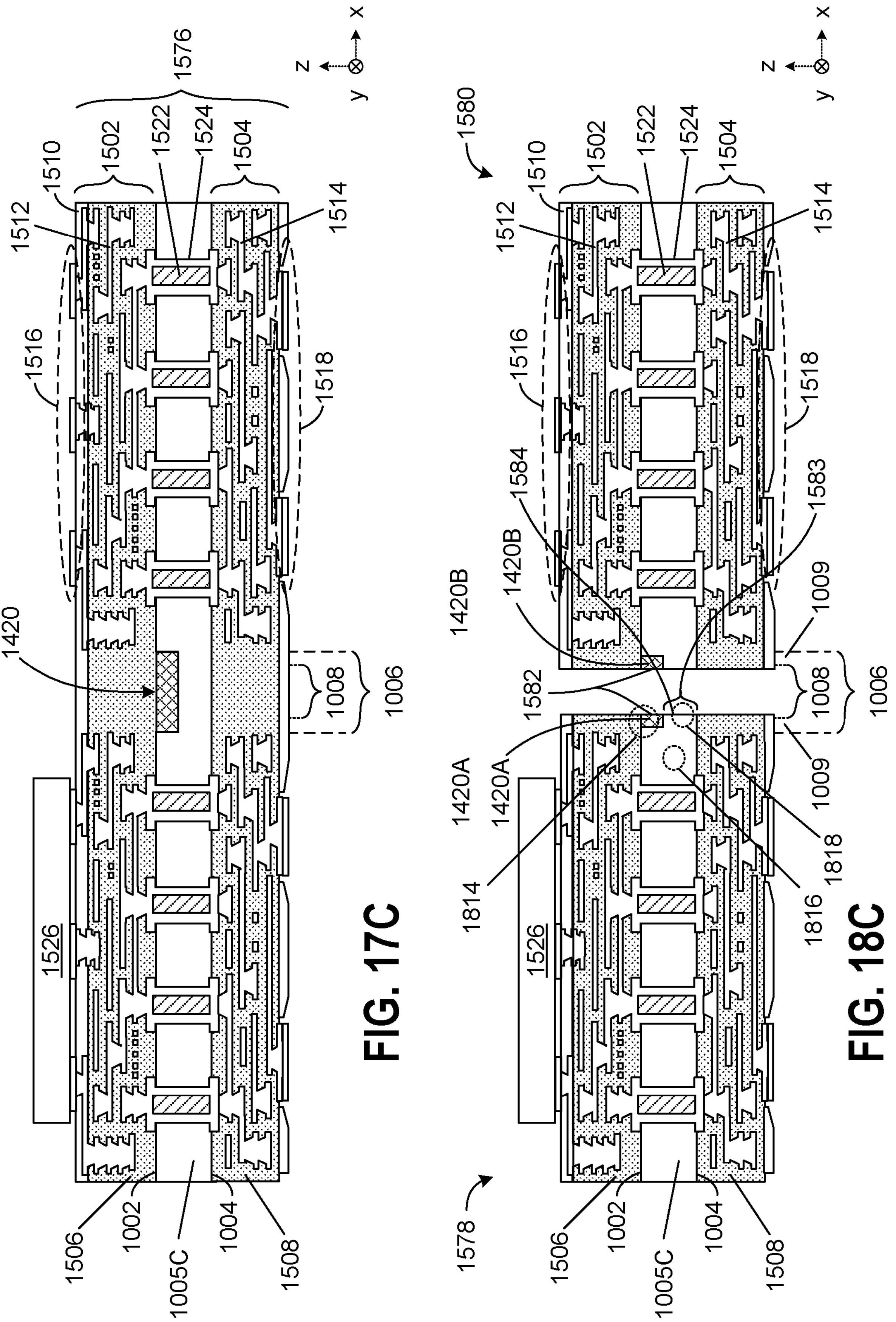

FIGS. 17A, 17B, and 17C are simplified cross-sectional illustrations of respective portions of a glass panels 1005A, 1005B, and 1005C, which comprise second laser treated areas resulting from operation 908, after formation of build-up layers and hardware interfaces in operation 912 according to various embodiments. FIGS. 18A, 18B, and 18C are simplified cross-sectional illustrations of substrates that result from singulation of the glass panels, which comprise build-up layers and hardware interfaces, in operation 916.

FIG. 17A is a simplified cross-sectional illustration of glass panel 1005A according to an embodiment. In FIG. 17A, a substrate 1556 comprises glass panel 1005A. In various embodiments, a first build-up layer 1502 is on first surface 1002 and second build-up layer 1504 is on second surface 1004 of glass panel 1005A. In an embodiment, first build-up layer 1502 comprises first dielectric material 1506, third dielectric material 1510, and first metallization structures 1512. In an embodiment, second build-up layer 154 comprises second dielectric material 1508 and second metallization structures 1514. First hardware interfaces 1516 are on a surface of the first build-up layer 1502 and second hardware interfaces 1518 are on a surface of second build-up layer 1504. Through-glass vias 1524 within glass panel 1005A extend from the first surface 1002 to the second surface 1004 and contain conductors 1522. In an embodiment, an IC die 1526 is mechanically and electrically coupled with first build-up layer 1502 via a first hardware interface 1516. In an embodiment, first dielectric material 1506 is over singulation street 1006 on first surface 1002. In addition, first dielectric material 1506 is over surfaces of fifth laser-treated area 1410 and sixth laser-treated area 1412 within singulation street 1006.

FIG. 18A is a simplified cross-sectional illustration of substrates 1558 and 1560 that result from singulation of substrate 1556 in operation 916. Guarding frames 1009 within singulation street 1006 remain on each side of kerf region 1008 after singulation. The portions of glass panel 1005A that remain after singulation each comprise fifth laser-treated area 1410 and sixth laser-treated area 1412. Laser-treated areas 1410 and 1412 may be within a guarding frame 1009 and within a corner region 1802. After singulation, each of fifth laser-treated area 1410 and sixth laser-treated area 1412 may have a surface 1562 on a sidewall 1564 of the substrate 1558 or 1560. In various embodiments, fifth laser-treated area 1410 and sixth laser-treated area 1412 each comprise a first compressive stress parameter value. The first compressive stress parameter value may be higher than a second compressive stress parameter value of another "second" area of glass panel 1005A. As one example, surface 1563 on sidewall 1564 may be a second area having the second compressive stress parameter value. As additional examples, areas 1804 or 1806 may have the second compressive stress parameter value. Area 1804 may be an internal area away from a surface of glass panel 1005A. In addition, in various embodiments, fifth laser-treated area 1410 and sixth laser-treated area 1412 may each comprise a refractive index value or a photoelasticity parameter value, each of which may be different from a corresponding value an untreated second area of a substrate, e.g., at surface 1563.

In various embodiments, fifth laser-treated area 1410 and sixth laser-treated area 1412 may each comprise interspersed pores, which constitutes a porosity percentage of the laser-treated area. Accordingly, fifth laser-treated area 1410 and sixth laser-treated area 1412 may each comprise a first porosity percentage. The first porosity percentage may be higher than or different from a second porosity percentage of another non-laser-treated area of glass panel 1005A, e.g., second areas 1804 or 1806. The porosity percentages of fifth laser-treated area 1410 and sixth laser-treated area 1412 may be less than 50%. For example, the laser-treated areas 1410, 1412 may have a porosity percentage of between 1% and 30%. In some embodiments, pore size distribution may be centered on the order of nanometers, e.g., 100 nm, 1,000 nm, etc. In some embodiments, pore size distribution may be centered on the order of micrometers, e.g., 1 μm, 10 μm, etc.

FIG. 17B is a simplified cross-sectional illustration of glass panel 1005B according to an embodiment. In FIG. 17B, a substrate 1566 comprises glass panel 1005B. In various embodiments, a first build-up layer 1502 is on first surface 1002 and second build-up layer 1504 is on second surface 1004 of glass panel 1005B. In an embodiment, first build-up layer 1502 comprises first dielectric material 1506, third dielectric material 1510, and first metallization structures 1512. In an embodiment, second build-up layer 154 comprises second dielectric material 1508 and second metallization structures 1514. First hardware interfaces 1516 are on a surface of the first build-up layer 1502 and second hardware interfaces 1518 are on a surface of second build-up layer 1504. Through-glass vias 1524 within glass panel 1005B extend from the first surface 1002 to the second surface 1004 and contain conductors 1522. In an embodiment, an IC die 1526 is mechanically and electrically coupled with first build-up layer 1502 via a first hardware interface 1516. In an embodiment, first dielectric material 1506 is over singulation street 1006 on first surface 1002. In addition, first dielectric material 1506 is over a surface of seventh laser-treated area 1418 within singulation street 1006.

FIG. 18B is a simplified cross-sectional illustration of substrates 1568 and 1570 that result from singulation of substrate 1566 in operation 916. Guarding frames 1009 within singulation street 1006 remain on each side of kerf region 1008 after singulation. The portions of glass panel 1005B that remain after singulation each comprise portions of seventh laser-treated area 1418. Each of remaining portions 1418A and 1418B of laser-treated area 1418 may be within a guarding frame 1009 and within a corner region 1808. After singulation, each portion 1418A, 1418B of seventh laser-treated area 1418 may have a surface 1572 on a sidewall 1574 of the substrate 1568 or 1570. In various embodiments, each portion 1418A, 1418B of seventh laser-treated area 1418 comprises a first compressive stress parameter value. The first compressive stress parameter value may be higher than a another "second" compressive stress parameter value of another area of glass panel 1005B. As one example, surface 1573 on sidewall 1574 may be a second area having the second compressive stress parameter value. As additional examples, areas 1810 or 1812 may have the second compressive stress parameter value. Area 1810 may be an internal area away from a surface of glass panel 1005A. In addition, in various embodiments, each portion of seventh laser-treated area 1418A, 1418B may comprise a refractive index value or a photoelasticity parameter value, each of which may be different from a corresponding value an untreated second area of a substrate, e.g., at surface 1573.

FIG. 17C is a simplified cross-sectional illustration of glass panel 1005C according to an embodiment. In FIG. 17C, a substrate 1566 comprises glass panel 1005C. In various embodiments, a first build-up layer 1502 is on first surface 1002 and second build-up layer 1504 is on second surface 1004 of glass panel 1005C. In an embodiment, first build-up layer 1502 comprises first dielectric material 1506, third dielectric material 1510, and first metallization structures 1512. In an embodiment, second build-up layer 154 comprises second dielectric material 1508 and second metallization structures 1514. First hardware interfaces 1516 are on a surface of the first build-up layer 1502 and second hardware interfaces 1518 are on a surface of second build-up layer 1504. Through-glass vias 1524 within glass panel 1005C extend from the first surface 1002 to the second surface 1004 and contain conductors 1522. In an embodiment, an IC die 1526 is mechanically and electrically coupled with first build-up layer 1502 via a first hardware interface 1516. In an embodiment, first dielectric material 1506 is over singulation street 1006 on first surface 1002. In addition, first dielectric material 1506 is over a surface of seventh laser-treated area 1418 within singulation street 1006.

FIG. 18C is a simplified cross-sectional illustration of substrates 1578 and 1580 that result from singulation of substrate 1576 in operation 916. Guarding frames 1009 within singulation street 1006 remain on each side of kerf region 1008 after singulation. The portions of glass panel 1005C that remain after singulation each comprise portions of eighth laser-treated area 1420. Each of remaining portions 1420A and 1420B of laser-treated area 1420 may be within a guarding frame 1009 and within a corner region 1814. After singulation, each portion 1420A, 1420B of eighth laser-treated area 1420 may have a surface 1582 on a sidewall 1584 of the substrate 1578 or 1580. In various embodiments, each portion 1420A, 1420B of eighth laser-treated area 1420 comprises a first compressive stress parameter value. The first compressive stress parameter value may be higher than a another "second" compressive stress parameter value of another area of glass panel 1005C. As one example, surface 1583 on sidewall 1584 may be a second area having the second compressive stress parameter value. As additional examples, areas 1816 or 1818 may have the second compressive stress parameter value. Area 1816 may be an internal area away from a surface of glass panel 1005A. In addition, in various embodiments, each portion of eighth laser-treated area 1420A, 1420B may comprise a refractive index value or a photoelasticity parameter value, each of which may be different from a corresponding value an untreated second area of a substrate, e.g., at surface 1583.

Figure 19B:
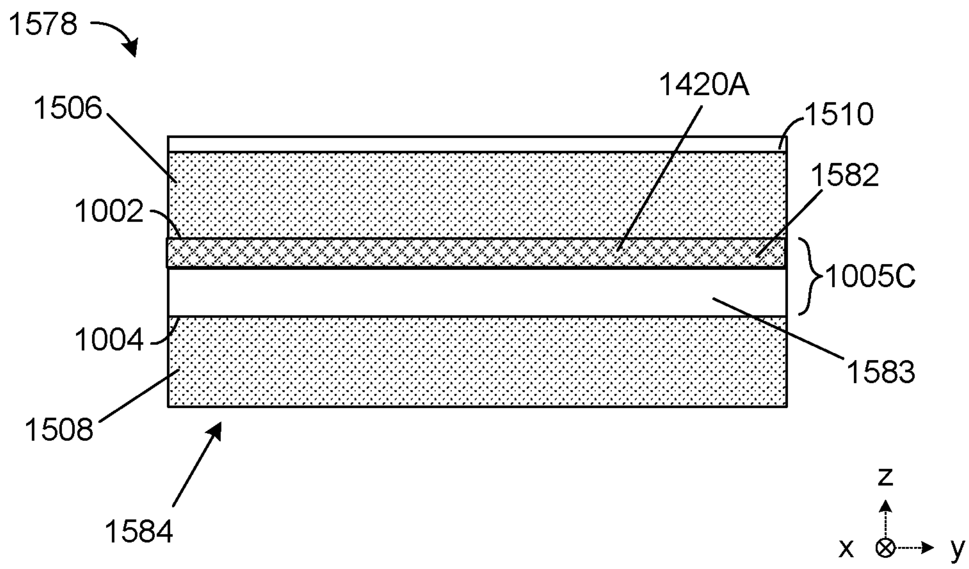

FIG. 19B is an alternate side view of substrate 1578 that results from singulation of substrate 1576 (FIG. 17C) in operation 916. FIG. 19B shows portion 1420A (FIG. 18C) of eighth laser-treated area 1420 at sidewall 1584. When viewed in the direction of the x-axis, it may be seen that laser-treated sidewall portion 1420A is between first dielectric material 1506 and an untreated portion of glass panel 1005C at sidewall 1584. As mentioned, portion 1420A comprises a first compressive stress parameter value (or refractive index value or photoelasticity parameter value) and another second area of glass panel 1005C at sidewall 1584, e.g., area 1583, comprises a second compressive stress parameter value (or refractive index value or photoelasticity parameter value), wherein the first value is greater than the second value. The view of substrate portion 1576 in FIG. 19B is representative of portions 1558 and 1560 (shown in FIG. 18A), substrate portions 1568 and 1570 (shown in FIG. 18B), and portion 1580 (shown in FIG. 18C). These substrate portions will appear similar to substrate portion 1576 when viewed in the direction of the x-axis.

Figure 20:
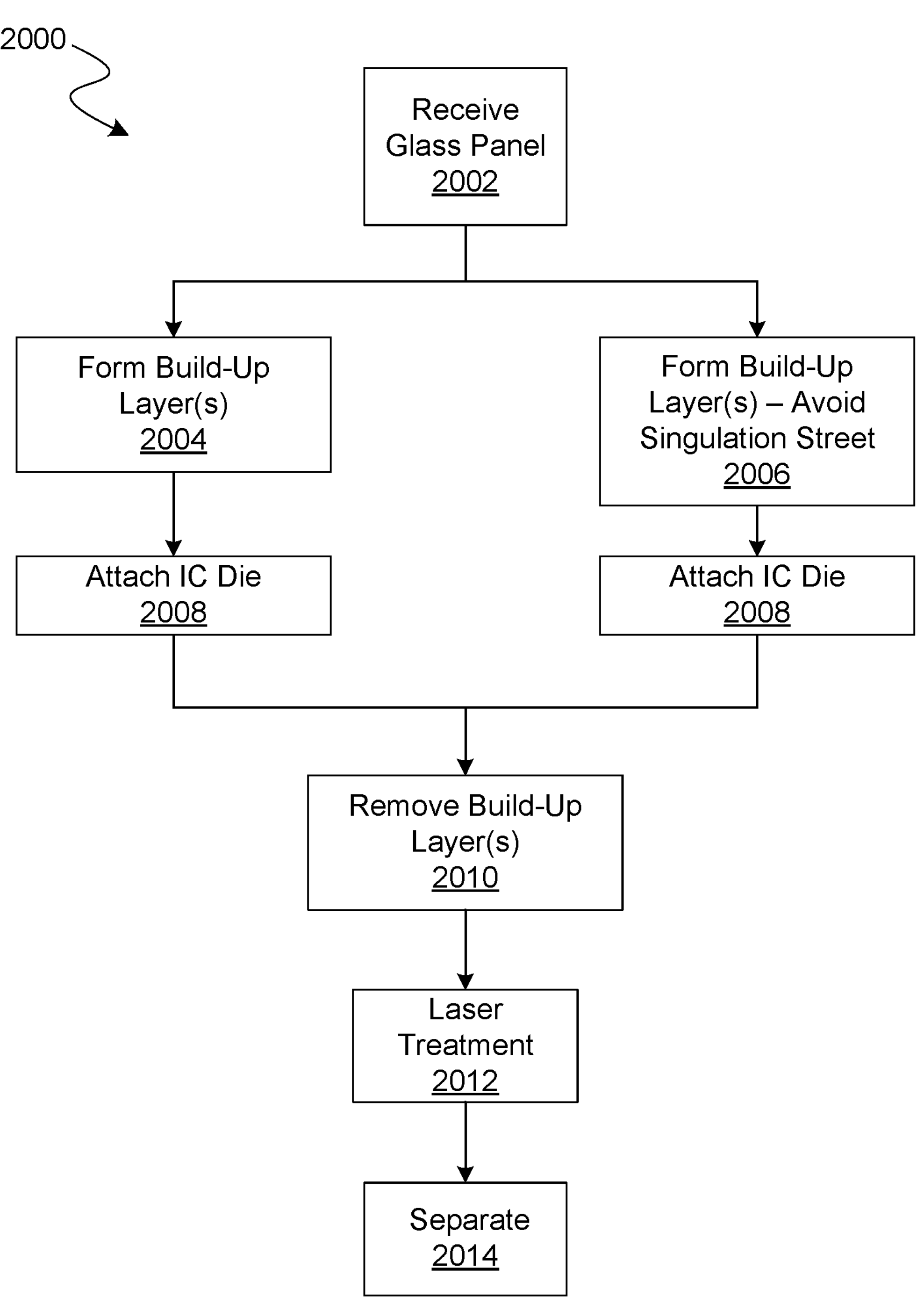
FIG. 20 illustrates a flow diagram of methods for singulating an IC package assembly having a substrate comprising a glass core according to some embodiments.

FIG. 20 illustrates a flow diagram of methods 2000 for singulating an IC panel having a substrate comprising a glass core and a build-up layer according to some embodiments.

Conventional saw-based unit singulation of a substrate comprising a glass core can result in glass chipping and cracking, which can reduce end-of-line yield. Additionally, micro-cracking at the glass core sidewall can create a risk that downstream assembly processing may fail. Embodiments are directed to singulating glass cores out of a glass panel. Various embodiments include laser treating the glass panel to create weak points in the glass along a cleavage line and using a dicing tape-based expansion technique to separate the glass along the cleavage line.

Mechanical cutting of a substrate with a glass core can result in defects in the core, e.g., micro-cracks, chips, and coarse sidewalls that result from sawing. These defects may impair the structural integrity and reliability of a final IC package. Methods 2000 are directed to separating a glass panel into multiple glass cores by laser treating a plurality of areas within a singulation street that coincide with a cleavage line. As a result of the laser treatment, the laser-treated areas are more brittle than the brittleness of other parts of the glass panel. After laser treatment, forces are applied perpendicular to cleavage line to expand the glass panel. The expansion forces cause the glass panel to separate at the weakened, brittle laser-treated areas. An advantage of methods 2000 is that glass chipping and cracking may be reduced in comparison to mechanical-saw based singulation methods. Additional advantages of methods 2000 are that the methods may result in smaller kerf widths and less debris than is encountered with mechanical sawing.

Methods 2000 transform a glass panel into multiple IC die substrates, each substrate comprising a glass core. Each glass core includes a first surface, a second surface, a sidewall between the first and second surfaces, and a first zone. The first zone is at the sidewall, and between the first surface and the second surface. The first zone comprises parts of the plurality of laser-treated areas remaining after the glass panel is separated into multiple IC die substrates. During laser treatment, a focal point of a laser beam may be between the first surface and the second surface, and below the first surface. Accordingly, the plurality of laser-treated areas may be spaced away from the first surface, and between the first surface and the second surface. While artifacts of a laser pulse may be concentrated at the focal point, the artifacts may not be limited to the focal point and areas the laser beam passes through; other adjacent areas may experience heating that modifies the internal state of the glass resulting in artifacts and brittleness. Various artifacts of laser treatment may be visible using scanning electron microscope (SEM) techniques, microscope, or other means, and may include a surface that appears coarse-grained relative to a non-laser-treated area. Other artifacts of a laser treated area may include a refractive index value that differs from a refractive index value of a non-laser-treated area, a photoelasticity parameter value that differs from a photoelasticity parameter value of a non-laser-treated area, or stress parameter value that differs from a stress parameter value for a non-laser-treated area. Another artifact of a laser treated area is that a laser-treated area may have a porosity that differs from non-laser-treated areas.

Further, methods 2000 transform a glass panel into multiple IC die substrates, each substrate comprising a glass core, wherein a portion or zone of the glass core extends laterally beyond the width of a build-up layer on the glass core. This zone of the glass core comprises portions of laser-treated areas that remain after singulation.

Referring to FIG. 20, methods 2000 may begin at 2002, where a glass panel is received. The glass may comprise any of the types of glass materials described herein. The glass panel may be of a size sufficient to form at least two glass cores.

Figure 21:
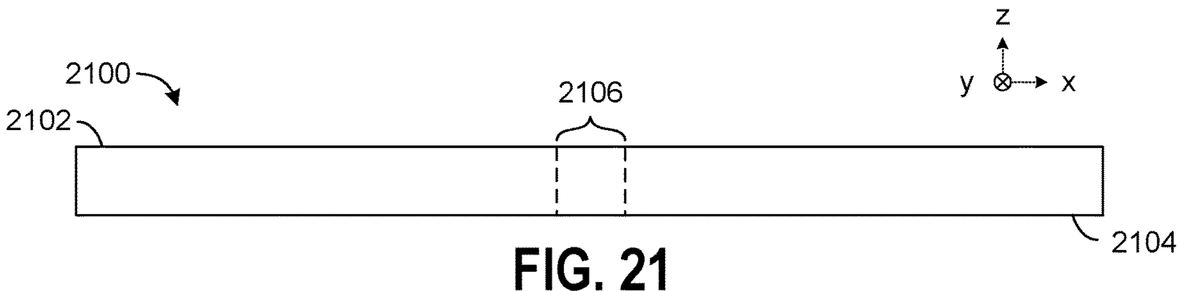
FIG. 21 is a simplified cross-sectional illustration of a portion of a glass panel from which multiple IC packages, each comprising a substrate having a glass core, can be formed according to various embodiments.

FIG. 21 is a simplified cross-sectional illustration of a portion of a glass panel 2100 from which multiple IC packages, each comprising a substrate having a glass core, can be formed according to various embodiments. The glass panel 2100 comprises a first surface 2102 and a second surface 2104 opposite the first surface. In various embodiments, the glass panel 2100 may comprise a glass panel of a size sufficient to form multiple IC package substrates. A plurality of singulation streets 2106 on the glass panel demark a plurality of portions, wherein a particular portion may be used to form a substrate of an individual IC package substrate. The plurality of singulation streets 2106 comprise locations rather than scribes or other markings, although, in some embodiments, scribes or other markings may be placed on the substrate to identify singulation streets.

In various embodiments, a glass panel may have sides (if rectangular) or a diameter (if round) of about 25 cm or more. In various embodiments, glass panel 2100 may have a thickness of about 200 μm up to about 1.0 mm. In some embodiments, singulation streets 2106 may have a width of between about 1 μm up to about 100 μm.

Referring again to FIG. 20, a build-up layer may be formed on a surface glass panel at 2004, or alternatively, at 2006. As described above, the term "build-up" layer refers to one or more dielectric layers, one or more metallization layers, or one or more of both types of layers. In operation 2004, the forming of a build-up layer on a surface glass panel includes forming the build-up layer over a singulation street. In operation 2006, the forming of a build-up layer on a surface of a glass panel avoids forming the build-up layer over a singulation street, i.e., the build-up layer may be formed outside of a singulation street. However, even though the build-up layer avoids generally avoids singulation streets in operation 2006, the operation may include forming a buffer layer over a singulation street.

Operations 2004 and 2006 may include forming a hardware interface on a build-up layer. In an embodiment, a build-up layer is formed on first surface 2102. In another embodiment, a build-up layer is formed on second surface 2104.

At operation 2008, one or more IC dies may be attached to a glass panel from which substrates comprising a glass core may be formed. The IC die may comprise any type of semiconductor device described herein or known in the art. Attaching an IC die (operation 2008) may be performed prior to separating the panel into multiple substrates (operation 2014) or, in some embodiments, subsequent to separating the panel into multiple substrates.

Figure 22:
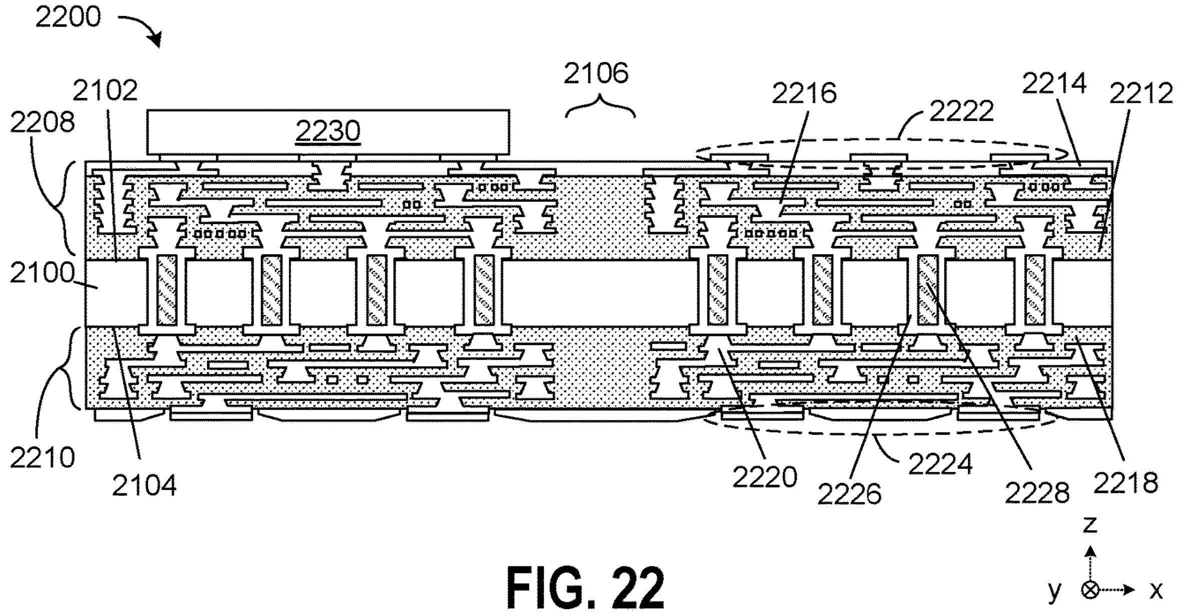
FIGS. 22 and 23 are simplified cross-sectional illustrations of a glass panel after one or more build-up layers have been formed on the panel according to various embodiments.

FIG. 22 is a simplified cross-sectional illustration of glass panel 2100 after one or more build-up layers have been formed on the panel according to various embodiments. For example, FIG. 22 depicts an assembly 2200 comprising glass panel 2100 after operations 2004 and 2008. In various embodiments, a first build-up layer 2208 is on first surface 2202 and second build-up layer 2110 is on second surface 2104 of glass panel 2100. In an embodiment, first build-up layer 2208 comprises first dielectric material 2212, third dielectric material 2214, and first metallization structures 2216. In an embodiment, second build-up layer 2210 comprises second dielectric material 2218 and second metallization structures 2220. First dielectric material 2212 may comprise multiple layers. Second dielectric material 2218 may also comprise multiple layers. First hardware interfaces 2222 are on a surface of the first build-up layer 2202 and second hardware interfaces 2224 are on a surface of second build-up layer 2204. Through-glass vias 2226 within glass panel 2100 extend from the first surface 2102 to the second surface 2104 and contain conductors 2228. In an embodiment, an IC die 2230 is mechanically and electrically coupled with first build-up layer 2208 via a first hardware interface 2222.

In various embodiments, as shown in FIG. 22, first dielectric material 2212 contacts and is over singulation street 2106 on first surface 2102. In an embodiment, second dielectric material 2218 contacts and is over singulation street 2106 on second surface 2104.

Figure 23:
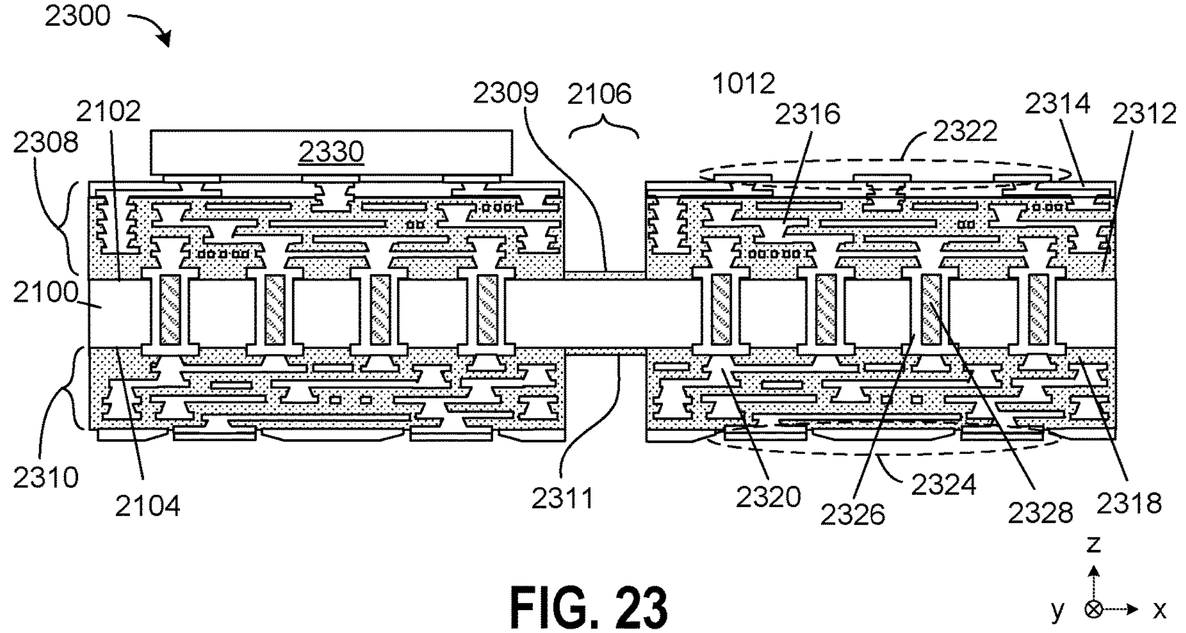

FIG. 23 is a simplified cross-sectional illustration of glass panel 2100 after one or more build-up layers have been formed on the panel according to various embodiments. For example, FIG. 23 depicts an assembly 2300 comprising glass panel 2100 after operations 2006 and 2008. In various embodiments, a first build-up layer 2308 is on first surface 2102 and second build-up layer 2310 is on second surface 2104 of glass panel 2100. In an embodiment, first build-up layer 2308 comprises first dielectric material 2312, third dielectric material 2314, and first metallization structures 2316. In an embodiment, second build-up layer 2310 comprises second dielectric material 2318 and second metallization structures 2320. First dielectric material 2312 may comprise multiple layers. Second dielectric material 2318 may also comprise multiple layers. First hardware interfaces 2322 are on a surface of the first build-up layer 2302 and second hardware interfaces 2324 are on a surface of second build-up layer 2304. Through-glass vias 2326 within glass panel 2100 extend from the first surface 2102 to the second surface 2104 and contain conductors 2328. In an embodiment, an IC die 2330 is mechanically and electrically coupled with first build-up layer 2308 via a first hardware interface 2322.

In various embodiments, as shown in FIG. 23, first build-up layer 2308 avoids singulation street 2106 on first surface 2102. In addition, second build-up layer 2310 avoids singulation street 2106 on second surface 2104. For example, build-up layers 2308 and 2310 are formed outside of singulation street 2106. While build-up layer 2308 and 2310 generally avoid singulation street 2106, a buffer layer 2309 may be over singulation street 2106 on first surface 2102 and another buffer layer 2311 may be over singulation street 2106 on second surface 2104. Buffer layers 2309 and 2311 may comprise a dielectric material.

Figure 24:
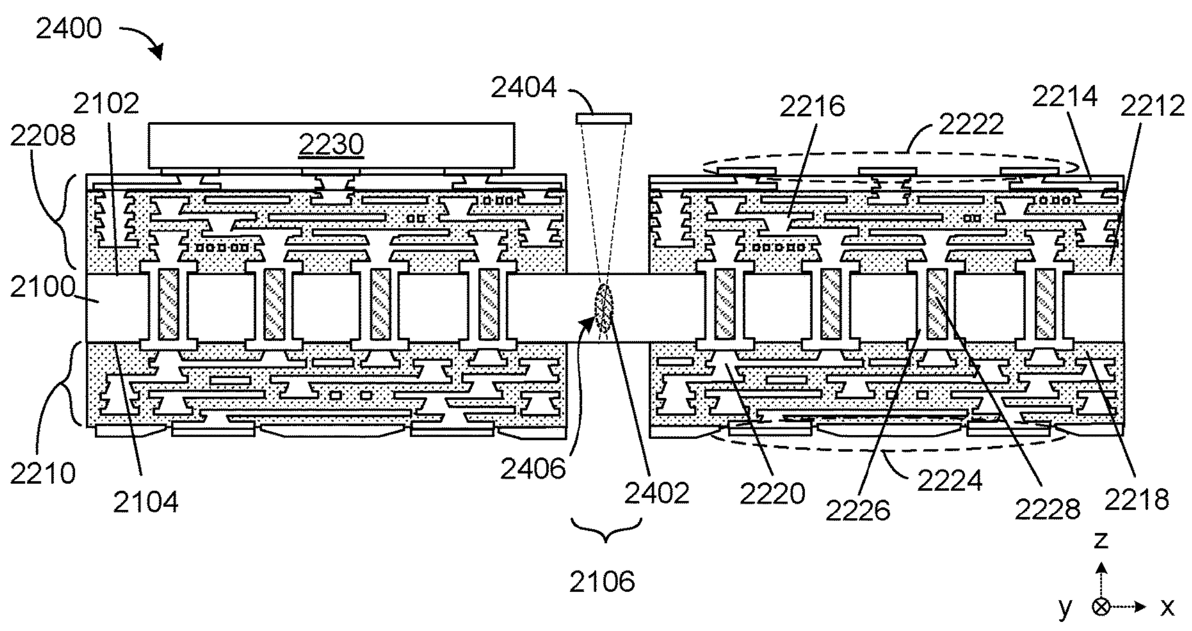
FIGS. 24 and 25 are simplified cross-sectional illustrations of a glass panel after one or more build-up layers have been removed from the panel, and after laser treatment, according to various embodiments.
Figure 25:
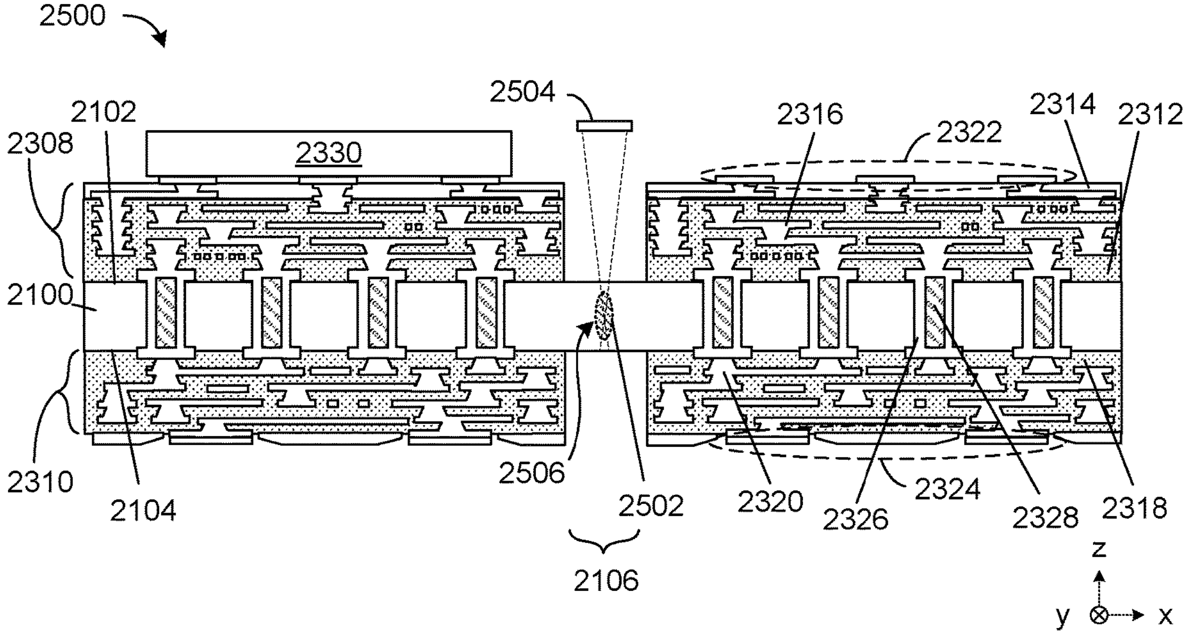

Referring again to FIG. 20, a build-up layer may be removed from a surface glass panel at operation 2010, and a plurality of areas may be treated with a laser at operation 2012. FIG. 24 and FIG. 25 are simplified cross-sectional illustrations of glass panel 2100 after one or more build-up layers have been removed from the panel, and after laser treatment, according to various embodiments.

FIG. 24 depicts an assembly 2400 comprising glass panel 2100 after operations 2010 and 2012 (shown as assembly 2200 in FIG. 22) according to various embodiments. As can be seen in FIG. 24, build-up layer 2208 has been removed from first surface 2102 within singulation street 2106. In addition, build-up layer 2210 has been removed from second surface 2110 within singulation street 2106. Build-up layers 2208 and 2210 may be removed by mechanical sawing, laser ablation, dry etching, or any other suitable method in various embodiments. After operation 2010 exposes first surface 2102 and second surface 2104, laser treatment of operation 2012 may be performed.

In operation 2012, a plurality of areas, e.g., area 2402, within a singulation street and coinciding with a cleavage line are treated with a laser. As can be seen in FIG. 24, laser 2404 is controlled such that a focal point 2406 of the laser is between the first surface and the second surface, and below the first surface. Interactions of the laser with glass panel 2100 may be concentrated at and around the focal point 2406. As a result, laser-treated area 2402 may be between the first surface 2102 and the second surface 2104. In some embodiments, laser-treated area 2402 may be below the first surface or spaced away from the first surface 2102. In some embodiments, laser area 2402 may be above the second surface or spaced away from the second surface 2104. In various embodiments, laser area 2402 may be more brittle than adjacent areas of glass panel 2100 that are not treated by the laser.

FIG. 25 depicts an assembly 2500 glass panel 2100 after operations 2010 and 2012 (shown as assembly 2300 in FIG. 23) according to various embodiments. As can be seen in FIG. 25, build-up layer 2308 has been removed from first surface 2102 within singulation street 2106. In addition, build-up layer 2310 has been removed from second surface 2110 within singulation street 2106. Build-up layers 2308 and 2310 may be removed by mechanical sawing, laser ablation, dry etching, or any other suitable method in various embodiments. After operation 2010 exposes first surface 2102 and second surface 2104, laser treatment of operation 2012 may be performed.

In operation 2012, a plurality of areas, e.g., area 2502, within a singulation street and coinciding with a cleavage line are treated with a laser. As can be seen in FIG. 25, laser 2504 is controlled such that a focal point 2506 of the laser is between the first surface 2102 and the second surface 2104, and below the first surface. Interactions of the laser with glass panel 2100 may be concentrated at and around the focal point 2506. As a result, laser-treated area 2502 may be between the first surface 2102 and the second surface 2104. In some embodiments, laser area 2502 may be below the first surface or spaced away from the first surface 2102. In some embodiments, laser area 2502 may be above the second surface 2104 or spaced away from the second surface 2104. In various embodiments, laser-treated area 2502 may be more brittle than adjacent areas of glass panel 2100 that are not treated by the laser.

Figure 26:
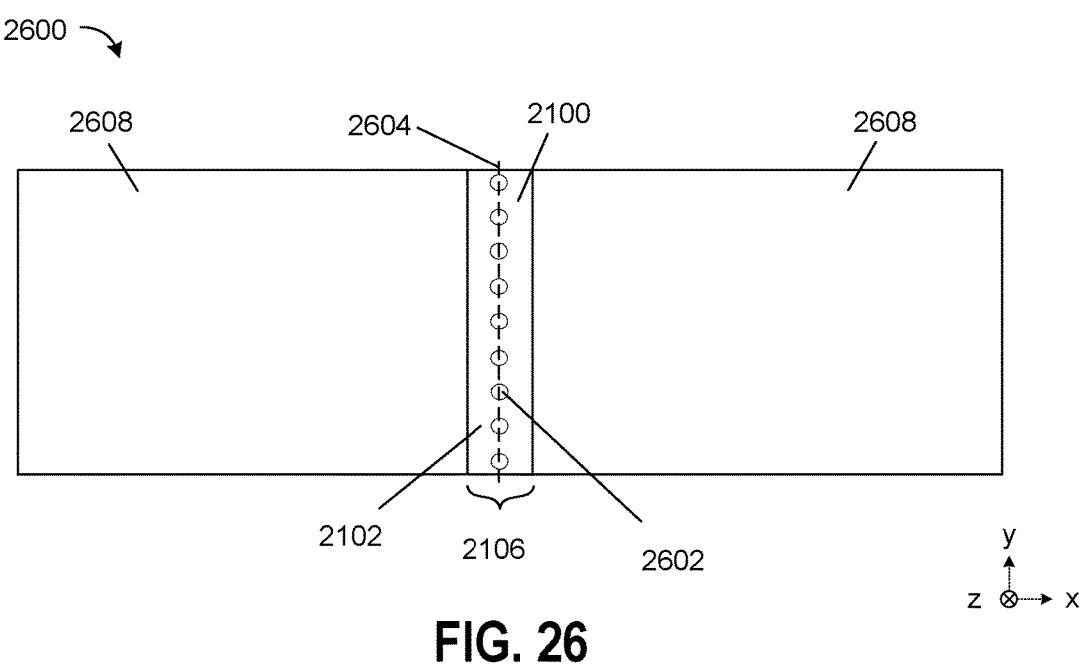
FIG. 26 is a simplified top-down illustration of an assembly showing a singulation street of glass panel according to various embodiments.

FIG. 26 is a simplified top-down illustration of an assembly 2600 showing a singulation street 2106 of glass panel 2100 according to various embodiments. FIG. 26 illustrates build-up layers 2608, that may be, for example, portions of respective build-up layers 2208 and 2308 of respective assemblies 2400 and 2500, after build-up layer removal and laser treatment, as shown in FIG. 24 and FIG. 25, respectively. Build-up layers 2608 are over glass panel 2100 except for singulation street 2106, where first surface 2102 of build-up layer 2100 is exposed as a result of build-up layer removal at 2010. A plurality of areas 2602 on surface 2102 show where a laser beam may impinge on the surface to create laser-treated areas 2502. Each area 2602 corresponds with a laser-treated area 2402 or 2502 respectively shown in FIG. 24 or FIG. 25. The plurality of areas 2602 on surface 2102 may be aligned with cleavage line 2604.

Areas 2602 corresponding with where a laser beam impinges on a surface of a glass panel may be spaced apart as shown in FIG. 26. In the shown embodiment, areas 2602 are circular, and as such, have a particular diameter. It should be appreciated that areas 2602 may be spaced by apart by various distances. For example, the areas 2602 may be spaced apart by ½ to 5 times the particular diameter of area 2602. In some embodiments, areas 2602 may overlap. The distance between adjacent areas 2602 may be the same for all areas 2602. However, this is not required. In some embodiments, distance between adjacent areas 2602 may vary.

In some embodiments, each of the laser-treated areas 2402 and 2502 may be formed by a single short-duration laser pulse. Each pulse produces concentrated energy at a point of focus 2406 and 2506. Either the glass substrate or the focal point of the laser may be moved between pulses in order to create a plurality of laser-treated areas 2402 and 2502 along a cleavage line. The cleavage line may be linear, but this is not required. The shape of the cleavage line depends on how the laser is moved laterally, in the x-y plane. In some embodiments, laser-treated areas 2402 and 2502 may be formed by multiple short-duration laser pulses. The multiple pulses may use a focal point 2406 or 2506 at a constant depth or the different pulses may be at different depths (z-axis).

Laser parameters, such as power, pulse duration, number of pulses, wavelength, spot size, beam shape, scan speed, etc., are set such that the glass is weakened or made more brittle in the particular area of the glass panel subject to laser treatment. In some embodiments, a laser pulse may have an average energy in a range of about 1 watt to more than 100 watts. In an embodiment, laser pulse may have an average energy 10 watts. In some embodiments, laser fluence may be in the range of approximately 1 to 10 J/cm$^2$. A laser pulse with duration in the picosecond or femtosecond range may be used. As one example, a laser pulse duration of around 10 picoseconds may be used. Beam shape of the laser may be Gaussian or Bessel in various embodiments. In some embodiments, multiple pulses focusing on different levels or depths may be employed.

Figure 27:
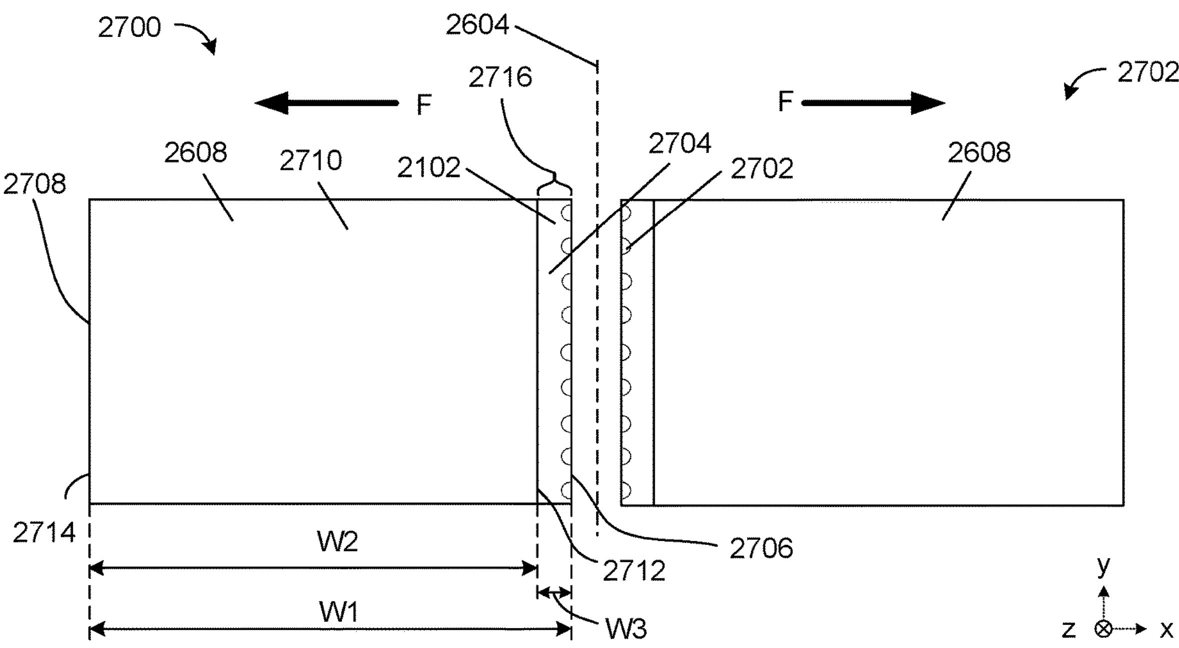
FIG. 27 is a simplified top-down illustration showing IC die substrates after a separation operation according to various embodiments.

Referring FIG. 20 and FIG. 27, a glass panel comprising a build-up layer may be separated into a plurality of IC die substrates at operation 2014. Expansion forces F may be applied perpendicular to a line, e.g., cleavage line 2604, to expand the glass panel. The expansion forces cause the glass panel to separate at the weakened, brittle laser-treated areas 2402 and 2502. Operation 2014 may comprise expansion process in which dicing tape is affixed to the glass panel or to a build-up layer on the panel and the tape is expanded to separate the panel into IC die substrates.

FIG. 27 is a simplified top-down illustration showing IC die substrates 2700 and 2702 after separation operation 2014 according to various embodiments. The IC die substrates 2700 and 2702 may be formed from assembly 2600. Each of the substrates 2700 and 2702 comprise a build-up layer 2608 on first surface 2102 of glass core 2704. Each glass core 2704 is formed from glass panel 2100. Areas 2702 are formed from areas 2602, corresponding with laser beam impingement locations, in the separation operation 2014.

Referring to FIG. 27, glass core 2704 has a first sidewall 2706 and a second sidewall 2708. The first sidewall 2706 and the second sidewall 2708 are between first surface 2102 and second surface 2104. The first sidewall 2706 and second sidewall 2708 may define a first width W1 of glass core 2704.

First build-up layer 2608 has a third surface 2710 and a fourth surface (not shown in FIG. 27) opposite the third surface 2710. The fourth surface may be over and in contact with first surface 2102 of the glass core (except for a singulation street). First build-up layer 2608 also has a third sidewall 2712 and a fourth sidewall 2714. Each of third sidewall 2712 and fourth sidewall 2714 are between third surface 2710 and the fourth surface. The third sidewall 2712 and fourth sidewall 2714 may define a second width W2. The second width W2 may be less than the first width W1. The reason W2 may be less than W1 is because separation of a glass panel into IC die substrates removes little or no material along a cleavage line. Each of IC die substrates 2700 and 2702 comprises a portion or zone 2716 in the former singulation street that extends laterally beyond the width of the build-up layer. Zone 2716 has a third width W3 equal to a difference between first width W1 and second width W2. In some embodiments, third width W3 is equal to approximately ½ the width of a singulation street. In some embodiments, third width W3 the third width is equal to between one-fourth and two-thirds a width of a singulation street. In various embodiments, third width W3 of zone 2716 is in the range of 1 μm to 100 μm. In some embodiments, third width W3 of zone 2716 is may be between about 0.4 μm up to about 50 μm.

Figure 28A:
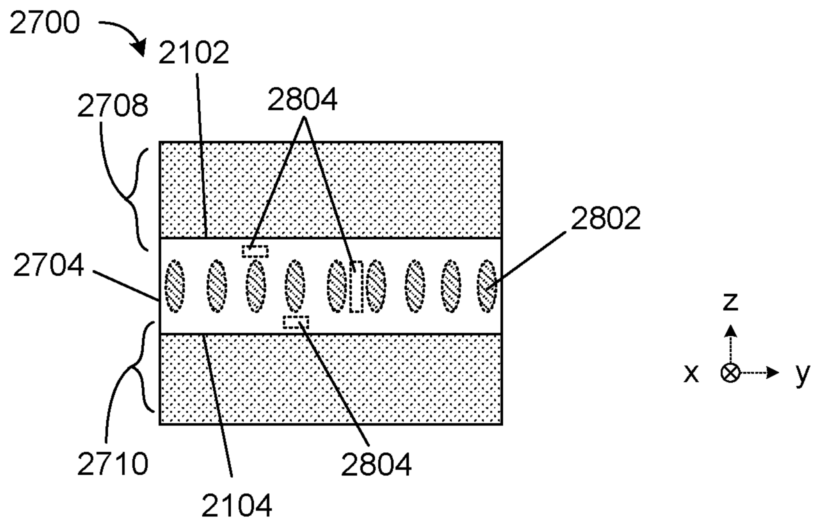
FIG. 28A and FIG. 28B are simplified cross-sectional illustrations of one of the IC die substrates of FIG. 27 according to various embodiments.
Figure 28B:
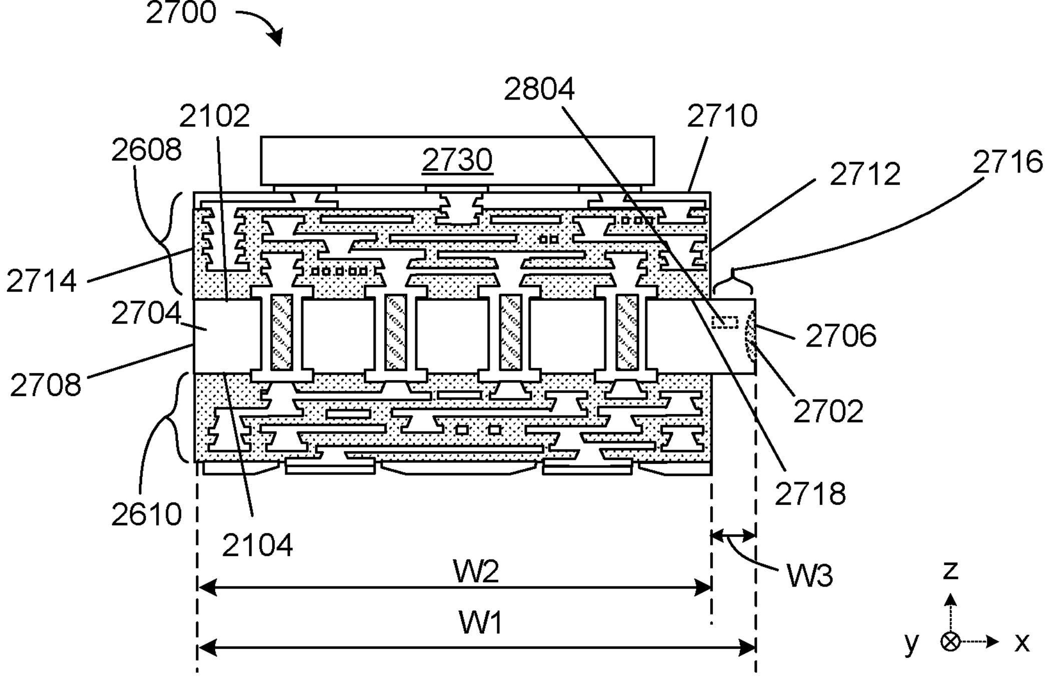

FIG. 28A and FIG. 28B are cross-sectional illustrations of IC die substrate 2700. FIG. 28A is cross-sectional side view of IC die substrate 2700 showing a sidewall of glass core 2704 and sidewalls of first build-up layer 2708 and second build-up layer 2710. A plurality of laser-treated areas 2802 may be seen on sidewall 2704. In addition, a plurality of non-laser-treated areas 2804 may be seen on sidewall 2704. For example, a non-laser-treated area 2804 may be above or below a laser-treated area 2802, e.g., a non-laser-treated area 2804 may be between laser-treated area 2802, and either first surface 2102 or second surface 2104. A non-laser-treated area 2804 may also be between first and second laser-treated areas 2802, as may be seen in FIG. 28A. Laser-treated areas 2802 may be distinguished from a non-laser-treated area 2804 on sidewall 2704 by its appearance. In some embodiments, a laser-treated area 2802 may have a coarse-grained surface while a non-laser-treated area may have a fine-grained appearance. In some embodiments, a laser-treated area 2802 may have a coarse-grained surface while a non-laser-treated area may have a fine-grained appearance. Advantageously, sidewall 2704 may be distinguished from substrates comprising a glass core that are singulated by other means, such as mechanical sawing, by an absence or a relatively small number of cracking and chipping defects.

In some embodiments, a laser-treated area 2802 may comprise a first refractive index value, e.g., a first color, and a non-laser-treated area may have a second refractive index value, e.g., a second color. The first refractive index value may be different from the second refractive index value. In some embodiments, a laser-treated area 2802 may comprise a first photoelasticity parameter value and a non-laser-treated area may have a second photoelasticity parameter value. The first photoelasticity parameter value may be different from the second photoelasticity parameter value. In some embodiments, a laser-treated area 2802 may comprise a first stress parameter value and a non-laser-treated area may have a second stress parameter value. The first stress parameter value may be different from the second stress parameter value.

Within a laser-treated area 2802, pores may be interspersed and may constitute a porosity percentage of a laser-treated area. A porosity percentage equals the area occupied by pores within a region divided by the area of the region. In some embodiments, the pores the are voids, with porosity then translating to void area percentage. In some embodiments, a laser-treated area 2802 may have a porosity percentage of less than 50%. For example, a laser-treated area 2802 may have a porosity percentage of between 1% and 30%. Voiding area is generally a microstructural material characterization parameter that may be measured by cross sectional electron micrographs, for example. In some embodiments, pore size distribution may be centered on the order of nanometers, e.g., 100 nm, 1,000 nm, etc. In some embodiments, pore size distribution may be centered on the order of micrometers, e.g., 1 μm, 10 μm, etc. In various embodiments, an area of glass core 2704 not treated with a laser, e.g., area 2804, comprises a first porosity or nanoporosity and a laser-treated area 2802 comprises a second porosity or nanoporosity. The second nanoporosity of laser-treated area 2802 may be different, e.g., greater than the first nanoporosity a non-laser-treated area.

FIG. 28B is cross-sectional side view of IC die substrate 2700. Glass core 2704 has a first sidewall 2706 and a second sidewall 2708. The first sidewall 2706 and the second sidewall 2708 are between first surface 2102 and second surface 2104. The first sidewall 2706 and second sidewall 2708 may define a first width W1 of glass core 2704. Glass core comprises a laser-treated area 2702 and sub-surface non-laser-treated area 2804, which is between first sidewall 2706 and a second sidewall 2708, and between first surface 2102 and second surface 2104.

Additionally, in FIG. 28B, it may be seen that first build-up layer 2608 has a third surface 2710 and a fourth surface 2718 opposite the third surface 2710. The fourth surface 2718 may be over and in contact with first surface 2102 of the glass core. First build-up layer 2608 also has a third sidewall 2712 and a fourth sidewall 2714. Each of third sidewall 2712 and fourth sidewall 2714 are between third surface 2710 and the fourth surface 2718. The third sidewall 2712 and fourth sidewall 2714 may define a second width W2. The second width W2 may be less than the first width W1. Width W2 may be less than W1 because separation of a glass panel into IC die substrates removes little or no material along a cleavage line and IC die substrate 2700 comprises a portion of the former singulation street of the glass core 2704 that extends laterally beyond the width of the build-up layer. Substrate 2700 comprises a portion or zone 2716 of the former singulation street that extends laterally beyond the width of the build-up layer. Zone 2716 has a third width W3 equal to a difference between first width W1 and second width W2.

Figure 29:
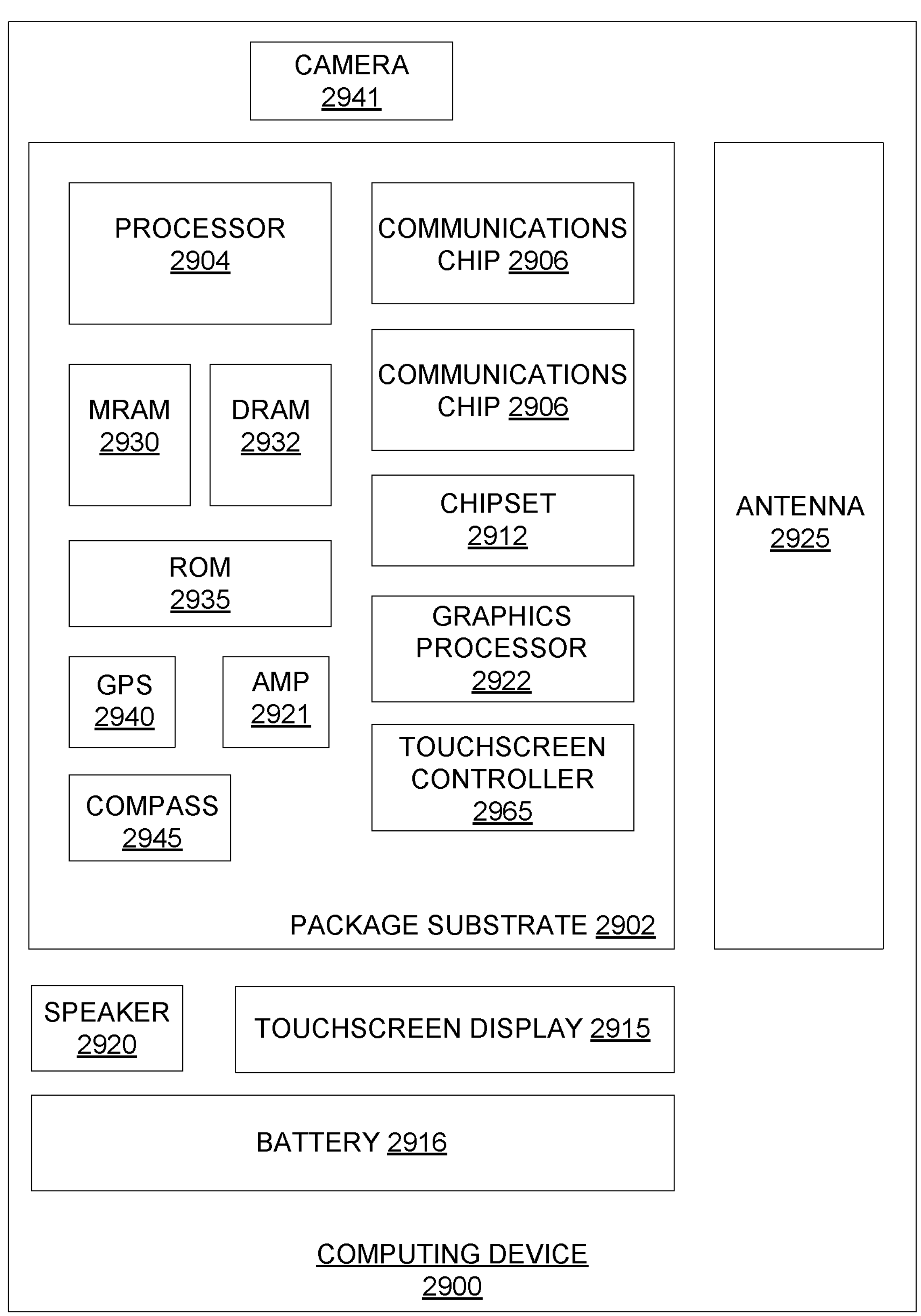
FIG. 29 illustrates a mobile computing platform and a data server machine employing an IC package, in accordance with some embodiments.

FIG. 29 is a functional block diagram of an electronic computing device 2900, in accordance with an embodiment. Device 2900 further includes a package substrate 2902 hosting a number of components, such as, but not limited to, a processor 2904 (e.g., an applications processor). The package substrate 2902 comprises a glass core according to embodiments described herein. Processor 2904 may be physically and/or electrically coupled to package substrate 2902. In some examples, processor 2904 is within a composite or disaggregated IC chip structure or assembly including a smaller die (e.g., a chiplet, or tile die) bonded to a larger host IC chip, for example as described elsewhere herein. Processor 2904 may be implemented with circuitry in either or both of the host IC chip and chiplet. In general, the term "processor" or "microprocessor" may refer to any device or portion of a device that processes electronic data from registers and/or memory to transform that electronic data into other electronic data that may be further stored in registers and/or memory.

In various examples, one or more communication chips 2906 may also be physically and/or electrically coupled to the package substrate 2902. In further implementations, communication chips 2906 may be part of processor 2904. Depending on its applications, computing device 2900 may include other components that may or may not be physically and electrically coupled to package substrate 2902. These other components include, but are not limited to, volatile memory (e.g., DRAM 2932), non-volatile memory (e.g., ROM 2935), flash memory (e.g., NAND or NOR), magnetic memory (MRAM 2930), a graphics processor 2922, a digital signal processor, a crypto processor, a chipset 2912, an antenna 2925, touchscreen display 2915, touchscreen controller 2965, battery 2916, audio codec, video codec, power amplifier (AMP) 2921, global positioning system (GPS) device 2940, compass 2945, accelerometer, gyroscope, speaker 2920, camera 2941, and mass storage device (such as hard disk drive, solid-state drive (SSD), compact disk (CD), digital versatile disk (DVD), and so forth), or the like. In some exemplary embodiments, at two of the functional blocks noted above are within a composite IC chip structure including a chiplet bonded to a host IC chip, for example as described elsewhere herein. For example, processor 2904 be implemented with circuitry in a first of the host IC chip and chiplet, and an electronic memory (e.g., MRAM 2930 or DRAM 2932) may be implemented with circuitry in a second of the host IC chip and chiplet.

Communication chips 2906 may enable wireless communications for the transfer of data to and from the computing device 2900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2906 may implement any of a number of wireless standards or protocols. As discussed, computing device 2900 may include a plurality of communication chips 2906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 30:
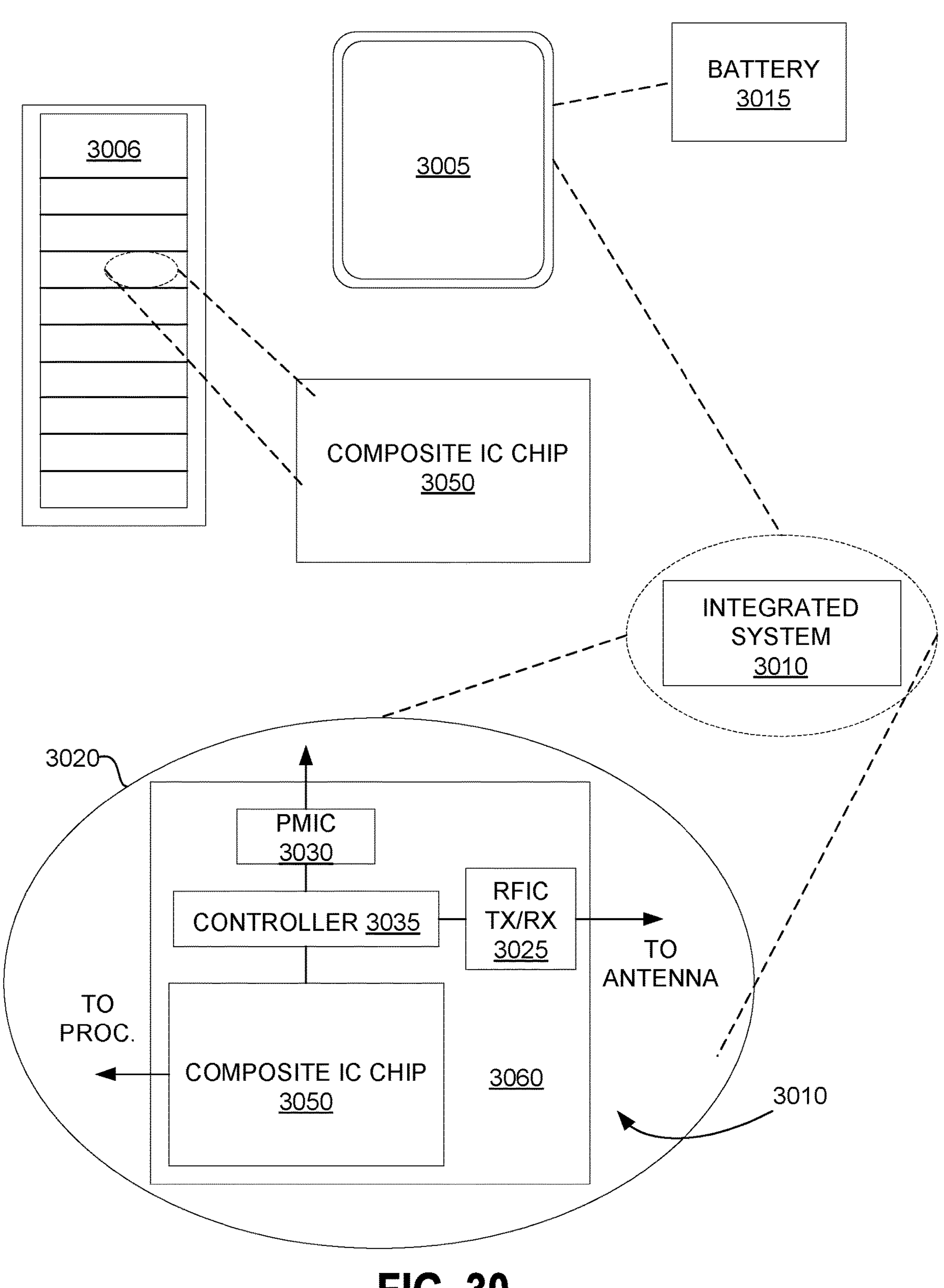
FIG. 30 is a functional block diagram of an electronic computing device, in accordance with some embodiments.

FIG. 30 illustrates a mobile computing platform and a data server machine employing an IC device comprising an IC die and a host component comprising a host substrate 3060 having one or more barrier features on the surface of the host substrate 3060, for example as described elsewhere herein. Computing device 2900 may be found inside platform 3005 or server machine 3006, for example. The server machine 3006 may be any commercial server, for example including any number of high-performance computing platforms disposed within a rack and networked together for electronic data processing, which in the exemplary embodiment includes a composite IC chip 3050 that includes a chiplet bonded to a host IC chip, for example as described elsewhere herein. The mobile computing platform 3005 may be any portable device configured for each of electronic data display, electronic data processing, wireless electronic data transmission, or the like. For example, the mobile computing platform 3005 may be any of a tablet, a smart phone, laptop computer, etc., and may include a display screen (e.g., a capacitive, inductive, resistive, or optical touchscreen), a chip-level or package-level integrated system 3010, and a battery 3015.

Whether disposed within the integrated system 3010 illustrated in the expanded view 3020, or as a stand-alone package within the server machine 1706, composite IC chip 3050 may include a chiplet bonded to a host IC chip, for example as described elsewhere herein. Composite IC chip 3050 may be further coupled to a host substrate 3060, along with, one or more of a power management integrated circuit (PMIC) 3030, RF (wireless) integrated circuit (RFIC) 3025 including a wideband RF (wireless) transmitter and/or receiver (TX/RX) (e.g., including a digital baseband and an analog front end module further comprises a power amplifier on a transmit path and a low noise amplifier on a receive path), and a controller 3035. PMIC 3030 may perform battery power regulation, DC-to-DC conversion, etc., and so has an input coupled to battery 3015 and with an output providing a current supply to other functional modules. As further illustrated, in the exemplary embodiment, RFIC 3025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Following examples are provided to illustrate the various embodiments. These examples can depend from one another in any suitable manner.

Example 1: An integrated circuit (IC) device comprising: a substrate comprising a glass core, the glass core comprising: a first surface; a second surface opposite the first surface; a first sidewall between the first surface and the second surface; a corner region where the first sidewall meets the first surface; and a first build-up layer on at least the first surface.

Example 2: The IC device of example 1, wherein the corner region comprises a recess and a dielectric material within the recess.

Example 3: The IC device of any of claims 1 or 2, wherein the recess comprises a third surface that is other than perpendicular to either the first surface or the first sidewall.

Example 4: The IC device of any of claims 1 through 3, wherein the third surface is planar or curved.

Example 5: The IC device of any of claims 1 or 2, wherein the recess comprises a third sidewall approximately parallel with the first sidewall, and a fourth sidewall approximately parallel with the first surface.

Example 6: The IC device of claim 1, wherein the glass core comprises a second region; and the corner region comprises a first compressive stress, the second region comprises a second compressive stress, and the first compressive stress is greater than the second compressive stress.

Example 7: The IC device of any of claims 1 or 6, wherein the corner region comprises a first refractive index, the second region comprises a second refractive index, and the first refractive index is different from the second refractive index.

Example 8: The IC device of any of claims 1, or 5 through 6, wherein the corner region comprises a first photoelasticity parameter value, the second region comprises a second photoelasticity parameter value, and the first photoelasticity parameter value is different from the second photoelasticity parameter value.

Example 9: The IC device of any of claims 1 through 8, wherein the first sidewall further comprises an artifact of a mechanical sawing process.

Example 10; The IC device of any of claims 1 through 9, wherein the first build-up layer comprises a metallization layer and a dielectric material layer.

Example 11: The IC device of any of claims 1 through 10, wherein the corner region spans a distance from the first sidewall in a direction parallel to the first surface, and the distance is between about 25 and 75 microns.

Example 12: The IC device of any of claims 1 through 10, wherein the glass core comprises a thickness of between 200 and 1600 microns, the corner region spans a distance from the first surface in a direction parallel to the first sidewall, and the distance is between about 15 and 25 percent of the thickness of the glass core.

Example 13: The IC device of any of claims 1 through 12, further comprising a second build-up layer on the second surface, the second build-up layer comprising a metallization layer and a dielectric material layer.

Example 14: An integrated circuit (IC) device comprising: a substrate comprising glass core, the glass core comprising: a first surface; a second surface opposite the first surface; a first sidewall between the first surface and the second surface; a corner region where the first sidewall meets the first surface; a first build-up layer on at least the first surface; an IC die on coupled with the first build-up layer.

Example 15: The IC device of example 14, wherein the corner region comprises recess having a third surface that is other than perpendicular to either the first surface or the first sidewall.

Example 16: The IC device of any of examples 14 or 15, wherein the glass core comprises a second region; and the corner region comprises a first porosity percentage, the second region comprises a second porosity percentage, and the first porosity percentage is greater than the second porosity percentage.

Example 17: A method comprising: receiving a glass panel comprising a first surface and a second surface opposite the first surface; laser treating an area within a singulation street on the first surface, wherein a plurality of portions of the glass panel are demarked by a plurality of singulation streets; and forming a first build-up layer on the first surface and over the laser-treated area.

Example 18: The method of example 17, wherein the laser treating ablates the area to form a trench.

Example 19: The method of example 17, further comprising forming a trench in the area by performing a wet etch process.

Example 20: The method of example 17, wherein the laser treating creates a compressive stress in the area.

Example 21: The method of any of examples 17 through 20, further comprising: separating the glass substrate into the plurality of portions by performing a mechanical sawing operation along a line coinciding with the area.

Example 22: The method of any of examples 17 through 21, wherein the area comprises a first width and the mechanical sawing operation creates a kerf comprising a second width, wherein the second less than the first width.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit (IC) device comprising:

a substrate comprising a glass core, the glass core comprising:

a first surface;

a second surface opposite the first surface;

a first sidewall between the first surface and the second surface;

a corner region where the first sidewall meets the first surface, wherein the corner region comprises a portion of the first sidewall; and a second region on the first sidewall, wherein the second region is spaced away from the first and second surfaces;

a first build-up layer on at least the first surface;

wherein the corner region comprises a first compressive stress, the second region comprises a second compressive stress, and the first compressive stress is greater than the second compressive stress.

2. The IC device of claim 1, wherein the corner region comprises a recess and a dielectric material within the recess.

3. The IC device of claim 2, wherein the recess comprises a third surface that is other than perpendicular to either the first surface or the first sidewall.

4. The IC device of claim 3, wherein the third surface is planar or curved.

5. The IC device of claim 1, wherein the corner region comprises a recess open to the first sidewall and a dielectric material within the recess, and the recess comprises a third sidewall approximately parallel with the first sidewall, and a fourth sidewall approximately parallel with the first surface.

6. The IC device of claim 1, wherein the corner region comprises a first porosity percentage, the second region comprises a second porosity percentage, and the first porosity percentage is greater than the second porosity percentage.

7. The IC device of claim 1, wherein the corner region comprises a first refractive index, the second region comprises a second refractive index, and the first refractive index is different from the second refractive index.

8. The IC device of claim 1, wherein the corner region comprises a first photoelasticity parameter value, the second region comprises a second photoelasticity parameter value, and the first photoelasticity parameter value is different from the second photoelasticity parameter value.

9. The IC device of claim 1, wherein the first sidewall further comprises an artifact of a mechanical sawing process.

10. The IC device of claim 1, wherein the first build-up layer comprises a metallization layer and a dielectric material layer.

11. The IC device of claim 1, wherein the corner region spans a distance from the first sidewall in a direction parallel to the first surface, and the distance is between about 25 and 75 microns.

12. The IC device of claim 1, wherein the glass core comprises a thickness of between 200 and 1600 microns, the corner region spans a distance from the first surface in a direction parallel to the first sidewall, and the distance is between about 15 and 25 percent of the thickness of the glass core.

13. The IC device of claim 1, further comprising a second build-up layer on the second surface, the second build-up layer comprising a metallization layer and a dielectric material layer.

14. An integrated circuit (IC) device comprising:

a substrate comprising glass core, the glass core comprising:

a first surface;

a second surface opposite the first surface;

a first sidewall between the first surface and the second surface;

a corner region where the first sidewall meets the first surface; and a second region;

a first build-up layer on at least the first surface; and an IC die coupled with the first build-up layer;

wherein the corner region comprises a first porosity percentage, the second region comprises a second porosity percentage, and the first porosity percentage is greater than the second porosity percentage.

15. The IC device of claim 14, wherein the corner region comprises recess having a third surface that is other than perpendicular to either the first surface or the first sidewall.

16. The IC device of claim 14, wherein the corner region comprises a first compressive stress, the second region comprises a second compressive stress, and the first compressive stress is greater than the second compressive stress.

* * * * *